(12) United States Patent
Oh et al.

(10) Patent No.: US 12,368,456 B2
(45) Date of Patent: Jul. 22, 2025

(54) METHOD AND DEVICE FOR TRANSMITTING AND RECEIVING SIGNALS OF TERMINAL AND BASE STATION IN WIRELESS COMMUNICATION SYSTEM

(71) Applicant: LG ELECTRONICS INC., Seoul (KR)

(72) Inventors: Jaeky Oh, Seoul (KR); Sungjin Kim, Seoul (KR); Jae Yong Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/552,091

(22) PCT Filed: Apr. 21, 2021

(86) PCT No.: PCT/KR2021/005034
§ 371 (c)(1),
(2) Date: Sep. 22, 2023

(87) PCT Pub. No.: WO2022/225080
PCT Pub. Date: Oct. 27, 2022

(65) Prior Publication Data
US 2024/0178862 A1 May 30, 2024

(51) Int. Cl.
*H03M 13/13* (2006.01)
*H04B 7/0456* (2017.01)
(Continued)

(52) U.S. Cl.
CPC .......... *H03M 13/13* (2013.01); *H04B 7/0456* (2013.01); *H04L 1/00* (2013.01); *H04L 5/00* (2013.01); *H04L 5/0094* (2013.01)

(58) Field of Classification Search
CPC ........ H03M 13/13; H04B 7/0456; H04L 1/00; H04L 5/00; H04L 5/0094; H04L 1/0056; H04W 64/00
See application file for complete search history.

(56) References Cited

U.S. PATENT DOCUMENTS

| 12,003,254 B2* | 6/2024 | Kim | ......................... H04L 1/00 |
| 2015/0381208 A1* | 12/2015 | Li | ...................... H03M 13/616 |
| | | | 714/755 |
| 2016/0285479 A1* | 9/2016 | El-Khamy | ............ H04L 1/0057 |

FOREIGN PATENT DOCUMENTS

| KR | 10-2015-0122757 | 11/2015 |
| KR | 10-2016-0115803 | 10/2016 |

(Continued)

OTHER PUBLICATIONS

J. Gao and K. Niu, "A Reinforcement Learning Based Decoding Method of Short Polar Codes," 2021 IEEE Wireless Communications and Networking Conference Workshops (WCNCW), Nanjing, China, 2021, pp. 1-6 (Year: 2021).*

(Continued)

*Primary Examiner* — Cynthia Britt
(74) *Attorney, Agent, or Firm* — LEE, HONG, DEGERMAN, KANG & WAIMEY

(57) ABSTRACT

The present disclosure may provide a method for operating a terminal in a wireless communication system. Herein, the method for operating the terminal may include determining a first polar code through an artificial intelligence (AI), transmitting data encoded in the first polar code and an information subchannel index set for the first polar code to a base station, receiving reward information based on decoding of the data from the base station, determining a second polar code by performing learning through the AI based on the reward information, and transmitting data encoded in the (Continued)

determined second polar code and an information subchannel index set for the second polar code to the base station.

17 Claims, 40 Drawing Sheets

(51) Int. Cl.
  *H04L 1/00* (2006.01)
  *H04L 5/00* (2006.01)

(56) References Cited

FOREIGN PATENT DOCUMENTS

WO     2017-023079     2/2017
WO     2017-196114     11/2017

OTHER PUBLICATIONS

PCT International Application No. PCT/KR2021/005034, International Search Report dated Jan. 7, 2022, 4 pages.
Eurecom et al., "Low-PAPR Sequence-Based Approaches for PUCCH Coverage Enhancement," R1-2009451, 3GPP TSG-RAN WG1 Meeting #103, e-Meeting, Nov. 2020, 15 pages.

* cited by examiner (control plane)

(user plane)

i: Index of information subchannel set,
F_i: Fixed subchannel set with index of i, N: Block size,
K: Number of information subchannels, L: Number of lists of SCL decoder

METHOD AND DEVICE FOR TRANSMITTING AND RECEIVING SIGNALS OF TERMINAL AND BASE STATION IN WIRELESS COMMUNICATION SYSTEM

CROSS-REFERENCE TO RELATED APPLICATION(S)

This application is the National Stage filing under 35 U.S.C. 371 of International Application No. PCT/KR2021/005034, filed on Apr. 21, 2021, the contents of which is hereby incorporated by reference herein in its entirety.

TECHNICAL FIELD

The present disclosure relates to a wireless communication system, and more particularly, to a method and apparatus for transmitting and receiving a signal by a terminal and a base station in a wireless communication system.

Specifically, the present disclosure relates to a method for transmitting and receiving a signal by a terminal and a base station based on an artificial intelligence system that generates a polar code optimized for a communication channel environment in real time.

BACKGROUND

Radio access systems have come into widespread in order to provide various types of communication services such as voice or data. In general, a radio access system is a multiple access system capable of supporting communication with multiple users by sharing available system resources (bandwidth, transmit power, etc.). Examples of the multiple access system include a code division multiple access (CDMA) system, a frequency division multiple access (FDMA) system, a time division multiple access (TDMA) system, a single carrier-frequency division multiple access (SC-FDMA) system, etc.

In particular, as many communication apparatuses require a large communication capacity, an enhanced mobile broadband (eMBB) communication technology has been proposed compared to radio access technology (RAT). In addition, not only massive machine type communications (MTC) for providing various services anytime anywhere by connecting a plurality of apparatuses and things but also communication systems considering services/user equipments (UEs) sensitive to reliability and latency have been proposed. To this end, various technical configurations have been proposed.

SUMMARY

The present disclosure may provide a method and apparatus for transmitting and receiving a signal by a terminal and a base station in a wireless communication system.

The present disclosure may provide a method and apparatus for transmitting and receiving a signal based on a real-time channel environment-adaptive polar code in a wireless communication system.

The present disclosure may provide an artificial intelligence apparatus that operates by generating a real-time channel environment-adaptive polar code in a wireless communication system.

The technical objects to be achieved in the present disclosure are not limited to the above-mentioned technical objects, and other technical objects that are not mentioned may be considered by those skilled in the art through the embodiments described below.

As an example of the present disclosure, a method for operating a terminal in a wireless communication system may be provided. Herein, the method for operating a terminal may include determining by the terminal a first polar code through an artificial intelligence, transmitting data encoded in the first polar code and an information subchannel index set for the first polar code to a base station, receiving reward information based on decoding of the data from the base station, determining a second polar code by performing learning through the artificial intelligence based on the reward information, and transmitting data encoded in the determined second polar code and an information subchannel index set for the second polar code to the base station. Herein, in case that the second polar code is determined through the learning, the information subchannel index set for the second polar code may be determined among information subchannel set candidates based on the reward information.

In addition, as an example of the present disclosure, a method for operating a base station may be provided. The method for operating a base station may include receiving data encoded in a first polar code and an information subchannel index set for the first polar code from a terminal, decoding the encoded data, transmitting reward information based on the decoding of the data to the terminal, and receiving data encoded in a second polar code and an information subchannel index set for the second polar code from the terminal. Herein, the second polar code may be determined through artificial intelligence learning in the terminal based on the reward information, and the information subchannel index set for the second polar code may be determined as any one of information subchannel set candidates based on the reward information.

In addition, as an example of the present disclosure, a terminal operating in a wireless communication system may include at least one transmitter, at least one receiver, at least one processor, and at least one memory coupled operably with the at least one processor and storing instructions enabling, when executed, the at least one processor to perform a specific operation, and the specific operation is configured to: determine a first polar code through an artificial intelligence, transmit data encoded in the first polar code and an information subchannel index set for the first polar code to a base station, receive reward information based on decoding of the data from the base station, determine a second polar code by performing learning through the artificial intelligence based on the reward information, and transmit data encoded in the determined second polar code and an information subchannel index set for the second polar code to the base station, and in case that the second polar code is determined through the learning, the information subchannel index set for the second polar code may be determined among information subchannel set candidates based on the reward information.

In addition, as an example of the present disclosure, a base station operating in a wireless communication system may include at least one transmitter, at least one receiver, at least one processor, and at least one memory coupled operably with the at least one processor and storing instructions enabling, when executed, the at least one processor to perform a specific operation, and the specific operation is configured to: receive data encoded in a first polar code and an information subchannel index set for the first polar code from a terminal, decode the encoded data, transmit reward information based on the decoding of the data to the terminal, and receive data encoded in a second polar code and an information subchannel index set for the second polar code from the terminal, and the second polar code may be determined through artificial intelligence learning in the terminal based on the reward information, and the information subchannel index set for the second polar code may be determined as any one of information subchannel set candidates based on the reward information.

In addition, as an example of the present disclosure, a device including at least one memory and at least one processor coupled functionally with the at least one memory may be configured to: determine a first polar code through an artificial intelligence, transmit data encoded in the first polar code and an information subchannel index set for the first polar code, receive reward information based on data decoding, determine a second polar code by performing learning through the artificial intelligence based on the reward information, and transmit data encoded in the determined second polar code and an information subchannel index set for the second polar code, and in case that the second polar code is determined through the learning, the information subchannel index set for the second polar code may be determined among information subchannel set candidates based on the reward information.

In addition, as an example of the present disclosure, a non-transitory computer-readable medium storing at least one instruction includes the at least one instruction executable by a processor, and the at least one instruction may control a device to: determine a first polar code through an artificial intelligence, transmit data encoded in the first polar code and an information subchannel index set for the first polar code, receive reward information based on data decoding, determine a second polar code by performing learning through the artificial intelligence based on the reward information, and transmit data encoded in the determined second polar code and an information subchannel index set for the second polar code. Herein, in case that the second polar code is determined through the learning, the information subchannel index set for the second polar code may be determined among information subchannel set candidates based on the reward information.

In addition, the following description may be commonly applied to a method for operating a terminal. a method for operating a base station, a terminal, a base station, a device, and a computer-readable medium.

As an example of the present disclosure, receiving, by the terminal, an initial polar code value from the base station may be further included, and the first polar code may be determined based on the initial polar code value.

In addition, as an example of the present disclosure, the terminal may transmit a reference signal and location information of the terminal to the base station, and the base station may generate the initial polar code value based on the reference signal and the location information of the terminal, which are received, and transmit the generated initial polar code value to the terminal.

In addition, as an example of the present disclosure, the initial polar code value may be generated through an artificial intelligence based on channel environment information.

In addition, as an example, the information subchannel set candidates may be set based on a codebook, and the initial polar code value may be generated by a codebook index for the information subchannel set candidates.

In addition, as an example of the present disclosure, the reward information may be determined based on any one of decoding error information, latency information, power information, and decoding complexity information of the base station.

In addition, as an example of the present disclosure, in case that the terminal encodes data based on the determined second polar code, each bit of the data may be allocated to a subchannel corresponding to the information subchannel index set among subchannel sets corresponding to the second polar code, and 0 bit may be allocated to a fixed subchannel index set among the subchannel sets corresponding to the second polar code.

In addition, as an example of the present disclosure, the information subchannel index set may be determined based on a basic information subchannel and a variable information subchannel, the basic information subchannel may be a fixed subchannel, and the variable information subchannel may be a subchannel that varies flexibly based on the reward information.

The above-described aspects of the present disclosure are merely some of the preferred embodiments of the present disclosure, and various embodiments reflecting the technical features of the present disclosure may be derived and understood by those of ordinary skill in the art based on the following detailed description of the disclosure.

As is apparent from the above description, the embodiments of the present disclosure have the following effects.

According to the present disclosure, a transmitter in a wireless communication system may generate an optimal block code through an encoder based on a generator matrix without dedicated hardware for a plurality of linear block codes.

According to the present disclosure, a transmitter may generate a polar code optimized for various communication channel environments.

According to the present disclosure, a transmitter may flexibly generate a polar code that adapts to a channel environment varying in real time.

According to the present disclosure, a receiver may decode data encoded in a polar code and generate and forward reward information for polar code learning to a transmitter.

It will be appreciated by persons skilled in the art that that the effects that can be achieved through the embodiments of the present disclosure are not limited to those described above and other advantageous effects of the present disclosure will be more clearly understood from the following detailed description. That is, unintended effects according to implementation of the present disclosure may be derived by those skilled in the art from the embodiments of the present disclosure.

BRIEF DESCRIPTION OF THE DRAWINGS

The accompanying drawings are provided to help understanding of the present disclosure, and may provide embodiments of the present disclosure together with a detailed description. However, the technical features of the present disclosure are not limited to specific drawings, and the features disclosed in each drawing may be combined with each other to constitute a new embodiment. Reference numerals in each drawing may refer to structural elements.

DETAILED DESCRIPTION

Figure 1:
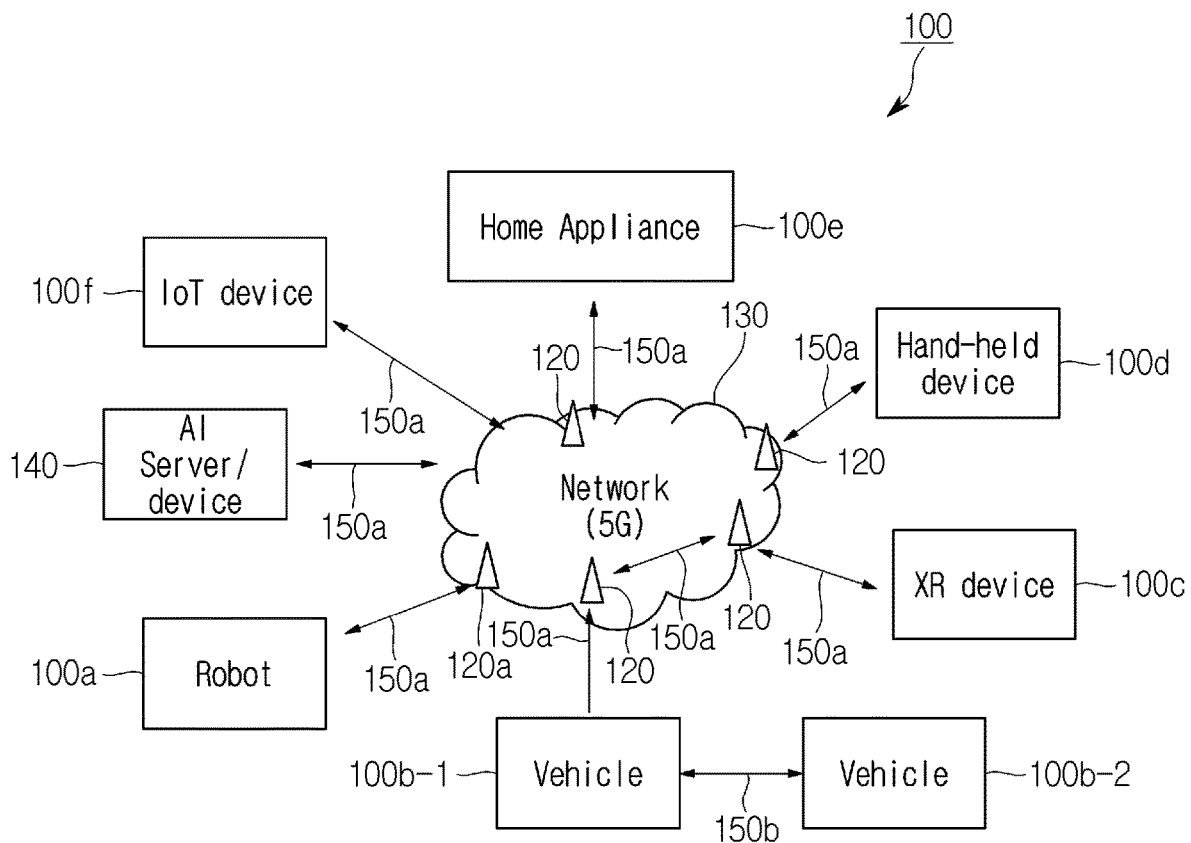
FIG. 1 is a view showing an example of a communication system applicable to the present disclosure.

The embodiments of the present disclosure described below are combinations of elements and features of the present disclosure in specific forms. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions or elements of any one embodiment may be included in another embodiment and may be replaced with corresponding constructions or features of another embodiment.

In the description of the drawings, procedures or steps which render the scope of the present disclosure unnecessarily ambiguous will be omitted and procedures or steps which can be understood by those skilled in the art will be omitted.

Throughout the specification, when a certain portion "includes" or "comprises" a certain component, this indicates that other components are not excluded and may be further included unless otherwise noted. The terms "unit", "-or/er" and "module" described in the specification indicate a unit for processing at least one function or operation, which may be implemented by hardware, software or a combination thereof. In addition, the terms "a or an", "one", "the" etc. may include a singular representation and a plural representation in the context of the present disclosure (more particularly, in the context of the following claims) unless indicated otherwise in the specification or unless context clearly indicates otherwise.

In the embodiments of the present disclosure, a description is mainly made of a data transmission and reception relationship between a base station (BS) and a mobile station. A BS refers to a terminal node of a network, which directly communicates with a mobile station. A specific operation described as being performed by the BS may be performed by an upper node of the BS.

Namely, it is apparent that, in a network comprised of a plurality of network nodes including a BS, various operations performed for communication with a mobile station may be performed by the BS, or network nodes other than the BS. The term "BS" may be replaced with a fixed station, a Node B, an evolved Node B (eNode B or eNB), an advanced base station (ABS), an access point, etc.

In the embodiments of the present disclosure, the term terminal may be replaced with a UE, a mobile station (MS), a subscriber station (SS), a mobile subscriber station (MSS), a mobile terminal, an advanced mobile station (AMS), etc.

A transmitter is a fixed and/or mobile node that provides a data service or a voice service and a receiver is a fixed and/or mobile node that receives a data service or a voice service. Therefore, a mobile station may serve as a transmitter and a BS may serve as a receiver, on an uplink (UL). Likewise, the mobile station may serve as a receiver and the BS may serve as a transmitter, on a downlink (DL).

The embodiments of the present disclosure may be supported by standard specifications disclosed for at least one of wireless access systems including an Institute of Electrical and Electronics Engineers (IEEE) 802.xx system, a 3rd Generation Partnership Project (3GPP) system, a 3GPP Long Term Evolution (LTE) system, 3GPP 5th generation (5G) new radio (NR) system, and a 3GPP2 system. In particular, the embodiments of the present disclosure may be supported by the standard specifications, 3GPP TS 36.211, 3GPP TS 36.212, 3GPP TS 36.213, 3GPP TS 36.321 and 3GPP TS 36.331.

In addition, the embodiments of the present disclosure are applicable to other radio access systems and are not limited to the above-described system. For example, the embodiments of the present disclosure are applicable to systems applied after a 3GPP 5G NR system and are not limited to a specific system.

That is, steps or parts that are not described to clarify the technical features of the present disclosure may be supported by those documents. Further, all terms as set forth herein may be explained by the standard documents.

Reference will now be made in detail to the embodiments of the present disclosure with reference to the accompanying drawings. The detailed description, which will be given below with reference to the accompanying drawings, is intended to explain exemplary embodiments of the present disclosure, rather than to show the only embodiments that can be implemented according to the disclosure.

The following detailed description includes specific terms in order to provide a thorough understanding of the present disclosure. However, it will be apparent to those skilled in the art that the specific terms may be replaced with other terms without departing the technical spirit and scope of the present disclosure.

The embodiments of the present disclosure can be applied to various radio access systems such as code division multiple access (CDMA), frequency division multiple access (FDMA), time division multiple access (TDMA), orthogonal frequency division multiple access (OFDMA), single carrier frequency division multiple access (SC-FDMA), etc.

Hereinafter, in order to clarify the following description, a description is made based on a 3GPP communication system (e.g., LTE, NR, etc.), but the technical spirit of the present disclosure is not limited thereto. LTE may refer to technology after 3GPP TS 36.xxx Release 8. In detail, LTE technology after 3GPP TS 36.xxx Release 10 may be referred to as LTE-A, and LTE technology after 3GPP TS 36.xxx Release 13 may be referred to as LTE-A pro. 3GPP NR may refer to technology after TS 38.xxx Release 15. 3GPP 6G may refer to technology TS Release 17 and/or Release 18. "xxx" may refer to a detailed number of a standard document. LTE/NR/6G may be collectively referred to as a 3GPP system.

For background arts, terms, abbreviations, etc. used in the present disclosure, refer to matters described in the standard documents published prior to the present disclosure. For example, reference may be made to the standard documents 36.xxx and 38.xxx.

Communication System Applicable to the Present Disclosure

Without being limited thereto, various descriptions, functions, procedures, proposals, methods and/or operational flowcharts of the present disclosure disclosed herein are applicable to various fields requiring wireless communication/connection (e.g., 5G).

Hereinafter, a more detailed description will be given with reference to the drawings. In the following drawings/description, the same reference numerals may exemplify the same or corresponding hardware blocks, software blocks or functional blocks unless indicated otherwise.

FIG. 1 is a view showing an example of a communication system applicable to the present disclosure.

Referring to FIG. 1, the communication system 100 applicable to the present disclosure includes a wireless device, a base station and a network. The wireless device refers to a device for performing communication using radio access technology (e.g., 5G NR or LTE) and may be referred to as a communication/wireless/5G device. Without being limited thereto, the wireless device may include a robot 100*a*, vehicles 100*b*-1 and 100*b*-2, an extended reality (XR) device 100*c*, a hand-held device 100*d*, a home appliance 100*e*, an Internet of Thing (IoT) device 100*f*, and an artificial intelligence (AI) device/server 100*g*. For example, the vehicles may include a vehicle having a wireless communication function, an autonomous vehicle, a vehicle capable of performing vehicle-to-vehicle communication, etc. The vehicles 100*b*-1 and 100*b*-2 may include an unmanned aerial vehicle (UAV) (e.g., a drone). The XR device 100*c* includes an augmented reality (AR)/virtual reality (VR)/mixed reality (MR) device and may be implemented in the form of a head-mounted device (HMD), a head-up display (HUD) provided in a vehicle, a television, a smartphone, a computer, a wearable device, a home appliance, a digital signage, a vehicle or a robot. The hand-held device 100*d* may include a smartphone, a smart pad, a wearable device (e.g., a smart watch or smart glasses), a computer (e.g., a laptop), etc. The home appliance 100*e* may include a TV, a refrigerator, a washing machine, etc. The IoT device 100*f* may include a sensor, a smart meter, etc. For example, the base station 120 and the network 130 may be implemented by a wireless device, and a specific wireless device 120a may operate as a base station/network node for another wireless device.

The wireless devices 100a to 100f may be connected to the network 130 through the base station 120. AI technology is applicable to the wireless devices 100a to 100f, and the wireless devices 100a to 100f may be connected to the AI server 100g through the network 130. The network 130 may be configured using a 3G network, a 4G (e.g., LTE) network or a 5G (e.g., NR) network, etc. The wireless devices 100a to 100f may communicate with each other through the base station 120/the network 130 or perform direct communication (e.g., sidelink communication) without through the base station 120/the network 130. For example, the vehicles 100b-1 and 100b-2 may perform direct communication (e.g., vehicle to vehicle (V2V)/vehicle to everything (V2X) communication). In addition, the IoT device 100f (e.g., a sensor) may perform direct communication with another IoT device (e.g., a sensor) or the other wireless devices 100a to 100f.

Wireless communications/connections 150a, 150b and 150c may be established between the wireless devices 100a to 100f/the base station 120 and the base station 120/the base station 120. Here, wireless communication/connection may be established through various radio access technologies (e.g., 5G NR) such as uplink/downlink communication 150a, sidelink communication 150b (or D2D communication) or communication 150c between base stations (e.g., relay, integrated access backhaul (IAB). The wireless device and the base station/wireless device or the base station and the base station may transmit/receive radio signals to/from each other through wireless communication/connection 150a, 150b and 150c. For example, wireless communication/connection 150a, 150b and 150c may enable signal transmission/reception through various physical channels. To this end, based on the various proposals of the present disclosure, at least some of various configuration information setting processes for transmission/reception of radio signals, various signal processing procedures (e.g., channel encoding/decoding, modulation/demodulation, resource mapping/demapping, etc.), resource allocation processes, etc. may be performed.

Communication System Applicable to the Present Disclosure

Figure 2:
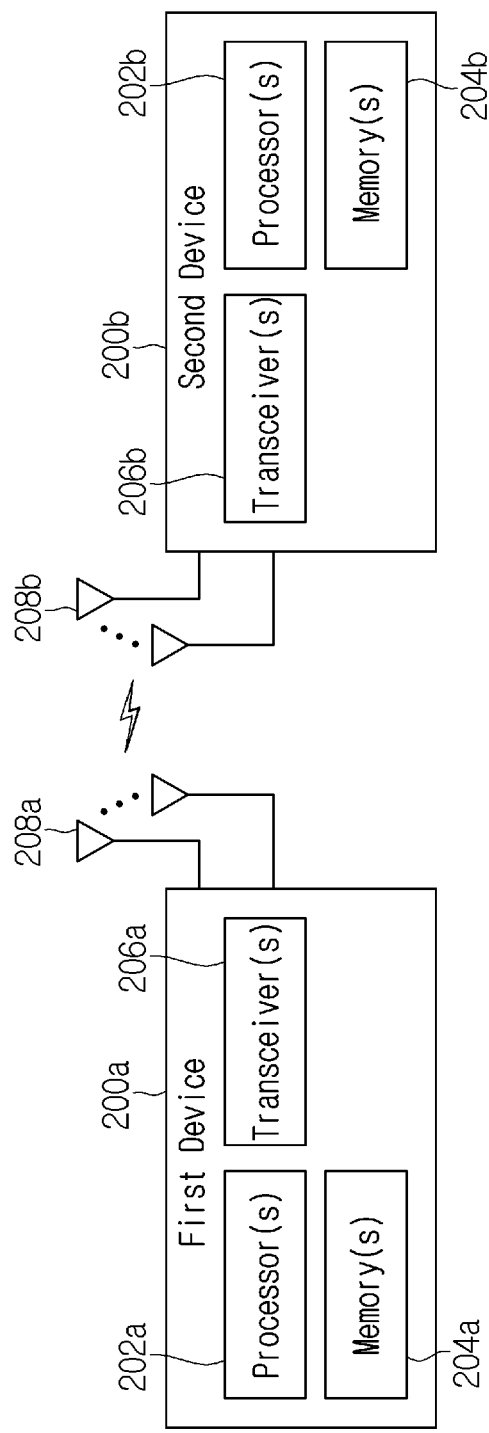
FIG. 2 is a view showing an example of a wireless apparatus applicable to the present disclosure.

FIG. 2 is a view showing an example of a wireless device applicable to the present disclosure.

Referring to FIG. 2, a first wireless device 200a and a second wireless device 200b may transmit and receive radio signals through various radio access technologies (e.g., LTE or NR). Here, {the first wireless device 200a, the second wireless device 200b} may correspond to {the wireless device 100x, the base station 120} and/or {the wireless device 100x, the wireless device 100x} of FIG. 1.

The first wireless device 200a may include one or more processors 202a and one or more memories 204a and may further include one or more transceivers 206a and/or one or more antennas 208a. The processor 202a may be configured to control the memory 204a and/or the transceiver 206a and to implement descriptions, functions, procedures, proposals, methods and/or operational flowcharts disclosed herein. For example, the processor 202a may process information in the memory 204a to generate first information/signal and then transmit a radio signal including the first information/signal through the transceiver 206a. In addition, the processor 202a may receive a radio signal including second information/signal through the transceiver 206a and then store information obtained from signal processing of the second information/signal in the memory 204a. The memory 204a may be coupled with the processor 202a, and store a variety of information related to operation of the processor 202a. For example, the memory 204a may store software code including instructions for performing all or some of the processes controlled by the processor 202a or performing the descriptions, functions, procedures, proposals, methods and/or operational flowcharts disclosed herein. Here, the processor 202a and the memory 204a may be part of a communication modem/circuit/chip designed to implement wireless communication technology (e.g., LTE or NR). The transceiver 206a may be coupled with the processor 202a to transmit and/or receive radio signals through one or more antennas 208a. The transceiver 206a may include a transmitter and/or a receiver. The transceiver 206a may be used interchangeably with a radio frequency (RF) unit. In the present disclosure, the wireless device may refer to a communication modem/circuit/chip.

The second wireless device 200b may include one or more processors 202b and one or more memories 204b and may further include one or more transceivers 206b and/or one or more antennas 208b. The processor 202b may be configured to control the memory 204b and/or the transceiver 206b and to implement the descriptions, functions, procedures, proposals, methods and/or operational flowcharts disclosed herein. For example, the processor 202b may process information in the memory 204b to generate third information/signal and then transmit the third information/signal through the transceiver 206b. In addition, the processor 202b may receive a radio signal including fourth information/signal through the transceiver 206b and then store information obtained from signal processing of the fourth information/signal in the memory 204b. The memory 204b may be coupled with the processor 202b to store a variety of information related to operation of the processor 202b. For example, the memory 204b may store software code including instructions for performing all or some of the processes controlled by the processor 202b or performing the descriptions, functions, procedures, proposals, methods and/or operational flowcharts disclosed herein. Herein, the processor 202b and the memory 204b may be part of a communication modem/circuit/chip designed to implement wireless communication technology (e.g., LTE or NR). The transceiver 206b may be coupled with the processor 202b to transmit and/or receive radio signals through one or more antennas 208b. The transceiver 206b may include a transmitter and/or a receiver. The transceiver 206b may be used interchangeably with a radio frequency (RF) unit. In the present disclosure, the wireless device may refer to a communication modem/circuit/chip.

Hereinafter, the wireless communication technology implemented in the wireless devices 200a and 200b of the present disclosure may include not only LTE, NR and 6G but also narrowband Internet of Things (NB-IoT) for low-power communication. At this time, for example, NB-IoT technology may be an example of low-power wide area network (LPWAN) technology and may be implemented in standards such as LTE Cat NB1 and/or LTE Cat NB2, without being limited to the above-described names. Additionally or alternatively, the wireless communication technology implemented in the wireless devices 200a and 200b of the present disclosure may perform communication based on LTE-M technology. At this time, for example, the LTE-M technology may be an example of LPWAN technology and may be called various names such as enhanced machine type communication (eMTC). For example, the LTE-M technology may be implemented in at least one of various standards such as 1) LTE CAT 0, 2) LTE Cat M1, 3) LTE Cat M2, 4) LTE non-BL(non-Bandwidth Limited), 5) LTE-MTC, 6) LTE Machine Type Communication and/or 7) LTE M, without being limited to the above-described names. Additionally or alternatively, the wireless communication technology implemented in the wireless devices 200a and 200b of the present disclosure may include at least one of ZigBee, Bluetooth or low-power wide area network considering low-power communication, without being limited to the above-described names. For example, ZigBee technology may generate personal area networks (PANs) related to small/low-power digital communication based on various standards such as IEEE 802.15.4 and may be called various names.

Hereinafter, hardware elements of the wireless devices 200a and 200b will be described in greater detail. Without being limited thereto, one or more protocol layers may be implemented by one or more processors 202a and 202b. For example, one or more processors 202a and 202b may implement one or more layers (e.g., functional layers such as PHY (physical), MAC (media access control), RLC (radio link control), PDCP (packet data convergence protocol), RRC (radio resource control), SDAP (service data adaptation protocol)). One or more processors 202a and 202b may generate one or more protocol data units (PDUs) and/or one or more service data unit (SDU) according to the descriptions, functions, procedures, proposals, methods and/or operational flowcharts disclosed herein. One or more processors 202a and 202b may generate messages, control information, data or information according to the descriptions, functions, procedures, proposals, methods and/or operational flowcharts disclosed herein. One or more processors 202a and 202b may generate PDUs, SDUs, messages, control information, data or information according to the functions, procedures, proposals and/or methods disclosed herein and provide the PDUs, SDUs, messages, control information, data or information to one or more transceivers 206a and 206b. One or more processors 202a and 202b may receive signals (e.g., baseband signals) from one or more transceivers 206a and 206b and acquire PDUs, SDUs, messages, control information, data or information according to the descriptions, functions, procedures, proposals, methods and/or operational flowcharts disclosed herein.

One or more processors 202a and 202b may be referred to as controllers, microcontrollers, microprocessors or microcomputers. One or more processors 202a and 202b may be implemented by hardware, firmware, software or a combination thereof. For example, one or more application specific integrated circuits (ASICs), one or more digital signal processors (DSPs), one or more digital signal processing devices (DSPDs), programmable logic devices (PLDs) or one or more field programmable gate arrays (FPGAs) may be included in one or more processors 202a and 202b. The descriptions, functions, procedures, proposals, methods and/or operational flowcharts disclosed herein may be implemented using firmware or software, and firmware or software may be implemented to include modules, procedures, functions, etc. Firmware or software configured to perform the descriptions, functions, procedures, proposals, methods and/or operational flowcharts disclosed herein may be included in one or more processors 202a and 202b or stored in one or more memories 204a and 204b to be driven by one or more processors 202a and 202b. The descriptions, functions, procedures, proposals, methods and/ or operational flowcharts disclosed herein implemented using firmware or software in the form of code, a command and/or a set of commands.

One or more memories 204a and 204b may be coupled with one or more processors 202a and 202b to store various types of data, signals, messages, information, programs, code, instructions and/or commands. One or more memories 204a and 204b may be composed of read only memories (ROMs), random access memories (RAMs), erasable programmable read only memories (EPROMs), flash memories, hard drives, registers, cache memories, computer-readable storage mediums and/or combinations thereof. One or more memories 204a and 204b may be located inside and/or outside one or more processors 202a and 202b. In addition, one or more memories 204a and 204b may be coupled with one or more processors 202a and 202b through various technologies such as wired or wireless connection.

One or more transceivers 206a and 206b may transmit user data, control information, radio signals/channels, etc. described in the methods and/or operational flowcharts of the present disclosure to one or more other apparatuses. One or more transceivers 206a and 206b may receive user data, control information, radio signals/channels, etc. described in the methods and/or operational flowcharts of the present disclosure from one or more other apparatuses. For example, one or more transceivers 206a and 206b may be coupled with one or more processors 202a and 202b to transmit/ receive radio signals. For example, one or more processors 202a and 202b may perform control such that one or more transceivers 206a and 206b transmit user data, control information or radio signals to one or more other apparatuses. In addition, one or more processors 202a and 202b may perform control such that one or more transceivers 206a and 206b receive user data, control information or radio signals from one or more other apparatuses. In addition, one or more transceivers 206a and 206b may be coupled with one or more antennas 208a and 208b, and one or more transceivers 206a and 206b may be configured to transmit/receive user data, control information, radio signals/channels, etc. described in the descriptions, functions, procedures, proposals, methods and/or operational flowcharts disclosed herein through one or more antennas 208a and 208b. In the present disclosure, one or more antennas may be a plurality of physical antennas or a plurality of logical antennas (e.g., antenna ports). One or more transceivers 206a and 206b may convert the received radio signals/channels, etc. from RF band signals to baseband signals, in order to process the received user data, control information, radio signals/channels, etc. using one or more processors 202a and 202b. One or more transceivers 206a and 206b may convert the user data, control information, radio signals/channels processed using one or more processors 202a and 202b from baseband signals into RF band signals. To this end, one or more transceivers 206a and 206b may include (analog) oscillator and/or filters.

Structure of Wireless Device Applicable to the Present Disclosure

Figure 3:
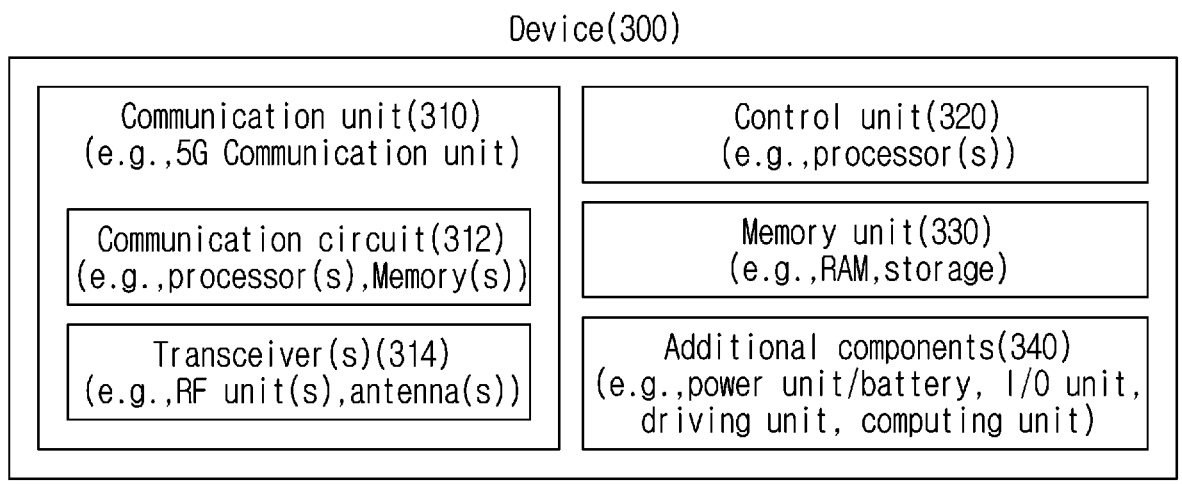
FIG. 3 is a view showing another example of a wireless device applicable to the present disclosure.

FIG. 3 is a view showing another example of a wireless device applicable to the present disclosure.

Referring to FIG. 3, a wireless device 300 may correspond to the wireless devices 200a and 200b of FIG. 2 and include various elements, components, units/portions and/or modules. For example, the wireless device 300 may include a communication unit 310, a control unit (controller) 320, a memory unit (memory) 330 and additional components 340.

The communication unit may include a communication circuit 312 and a transceiver(s) 314. For example, the communication circuit 312 may include one or more processors 202a and 202b and/or one or more memories 204a and 204b of FIG. 2. For example, the transceiver(s) 314 may include one or more transceivers 206a and 206b and/or one or more antennas 208a and 208b of FIG. 2. The control unit 320 may be electrically coupled with the communication unit 310, the memory unit 330 and the additional components 340 to control overall operation of the wireless device. For example, the control unit 320 may control electrical/mechanical operation of the wireless device based on a program/code/instruction/information stored in the memory unit 330. In addition, the control unit 320 may transmit the information stored in the memory unit 330 to the outside (e.g., another communication device) through the wireless/wired interface using the communication unit 310 over a wireless/wired interface or store information received from the outside (e.g., another communication device) through the wireless/wired interface using the communication unit 310 in the memory unit 330.

The additional components 340 may be variously configured according to the types of the wireless devices. For example, the additional components 340 may include at least one of a power unit/battery, an input/output unit, a driving unit or a computing unit. Without being limited thereto, the wireless device 300 may be implemented in the form of the robot (FIG. 1, 100a), the vehicles (FIGS. 1, 100b-1 and 100b-2), the XR device (FIG. 1, 100c), the hand-held device (FIG. 1, 100d), the home appliance (FIG. 1, 100e), the IoT device (FIG. 1, 100f), a digital broadcast terminal, a hologram apparatus, a public safety apparatus, an MTC apparatus, a medical apparatus, a Fintech device (financial device), a security device, a climate/environment device, an AI server/device (FIG. 1, 140), the base station (FIG. 1, 120), a network node, etc. The wireless device may be movable or may be used at a fixed place according to use example/service.

In FIG. 3, various elements, components, units/portions and/or modules in the wireless device 300 may be coupled with each other through wired interfaces or at least some thereof may be wirelessly coupled through the communication unit 310. For example, in the wireless device 300, the control unit 320 and the communication unit 310 may be coupled by wire, and the control unit 320 and the first unit (e.g., 130 or 140) may be wirelessly coupled through the communication unit 310. In addition, each element, component, unit/portion and/or module of the wireless device 300 may further include one or more elements. For example, the control unit 320 may be composed of a set of one or more processors. For example, the control unit 320 may be composed of a set of a communication control processor, an application processor, an electronic control unit (ECU), a graphic processing processor, a memory control processor, etc. In another example, the memory unit 330 may be composed of a random access memory (RAM), a dynamic RAM (DRAM), a read only memory (ROM), a flash memory, a volatile memory, a non-volatile memory and/or a combination thereof.

Hand-Held Device Applicable to the Present Disclosure

Figure 4:
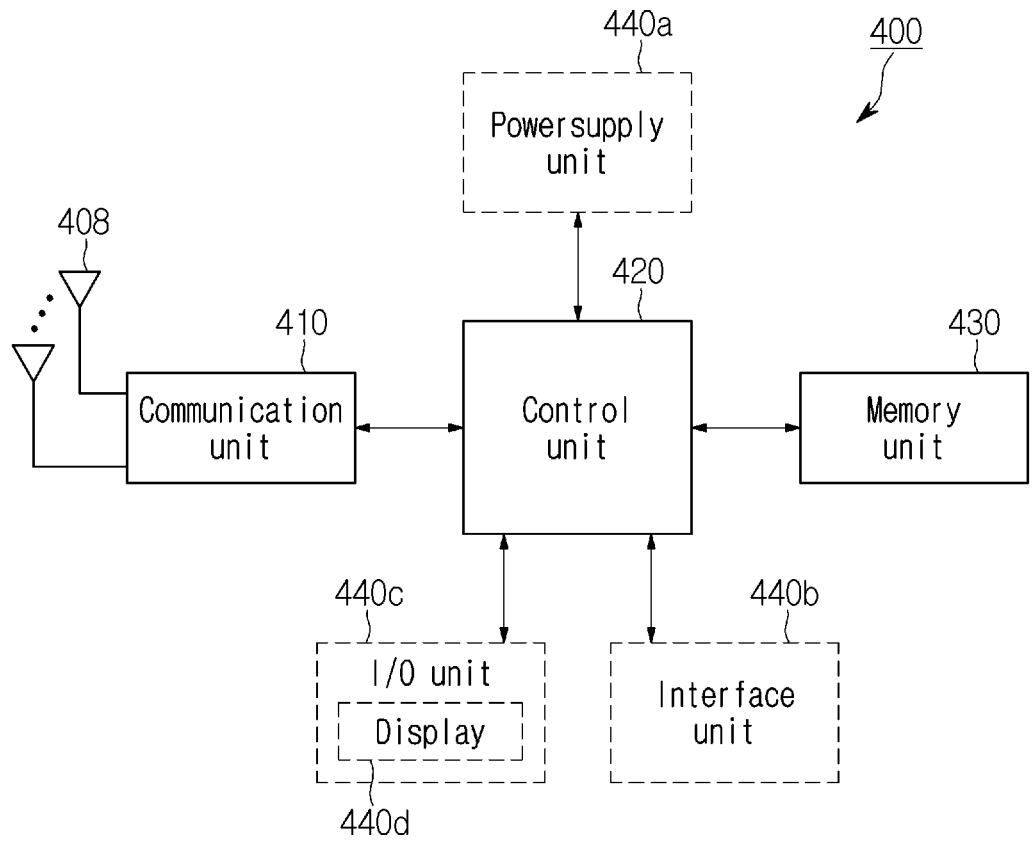
FIG. 4 is a view showing an example of a hand-held device applicable to the present disclosure.

FIG. 4 is a view showing an example of a hand-held device applicable to the present disclosure.

FIG. 4 shows a hand-held device applicable to the present disclosure. The hand-held device may include a smartphone, a smart pad, a wearable device (e.g., a smart watch or smart glasses), and a hand-held computer (e.g., a laptop, etc.). The hand-held device may be referred to as a mobile station (MS), a user terminal (UT), a mobile subscriber station (MSS), a subscriber station (SS), an advanced mobile station (AMS) or a wireless terminal (WT).

Referring to FIG. 4, the hand-held device 400 may include an antenna unit (antenna) 408, a communication unit (transceiver) 410, a control unit (controller) 420, a memory unit (memory) 430, a power supply unit (power supply) 440a, an interface unit (interface) 440b, and an input/output unit 440c. An antenna unit (antenna) 408 may be part of the communication unit 410. The blocks 410 to 430/440a to 440c may correspond to the blocks 310 to 330/340 of FIG. 3, respectively.

The communication unit 410 may transmit and receive signals (e.g., data, control signals, etc.) to and from other wireless devices or base stations. The control unit 420 may control the components of the hand-held device 400 to perform various operations. The control unit 420 may include an application processor (AP). The memory unit 430 may store data/parameters/program/code/instructions necessary to drive the hand-held device 400. In addition, the memory unit 430 may store input/output data/information, etc. The power supply unit 440a may supply power to the hand-held device 400 and include a wired/wireless charging circuit, a battery, etc. The interface unit 440b may support connection between the hand-held device 400 and another external device. The interface unit 440b may include various ports (e.g., an audio input/output port and a video input/output port) for connection with the external device. The input/output unit 440c may receive or output video information/signals, audio information/signals, data and/or user input information. The input/output unit 440c may include a camera, a microphone, a user input unit, a display 440d, a speaker and/or a haptic module.

For example, in case of data communication, the input/output unit 440c may acquire user input information/signal (e.g., touch, text, voice, image or video) from the user and store the user input information/signal in the memory unit 430. The communication unit 410 may convert the information/signal stored in the memory into a radio signal and transmit the converted radio signal to another wireless device directly or transmit the converted radio signal to a base station. In addition, the communication unit 410 may receive a radio signal from another wireless device or the base station and then restore the received radio signal into original information/signal. The restored information/signal may be stored in the memory unit 430 and then output through the input/output unit 440c in various forms (e.g., text, voice, image, video and haptic).

Type of Wireless Device Applicable to the Present Disclosure

Figure 5:
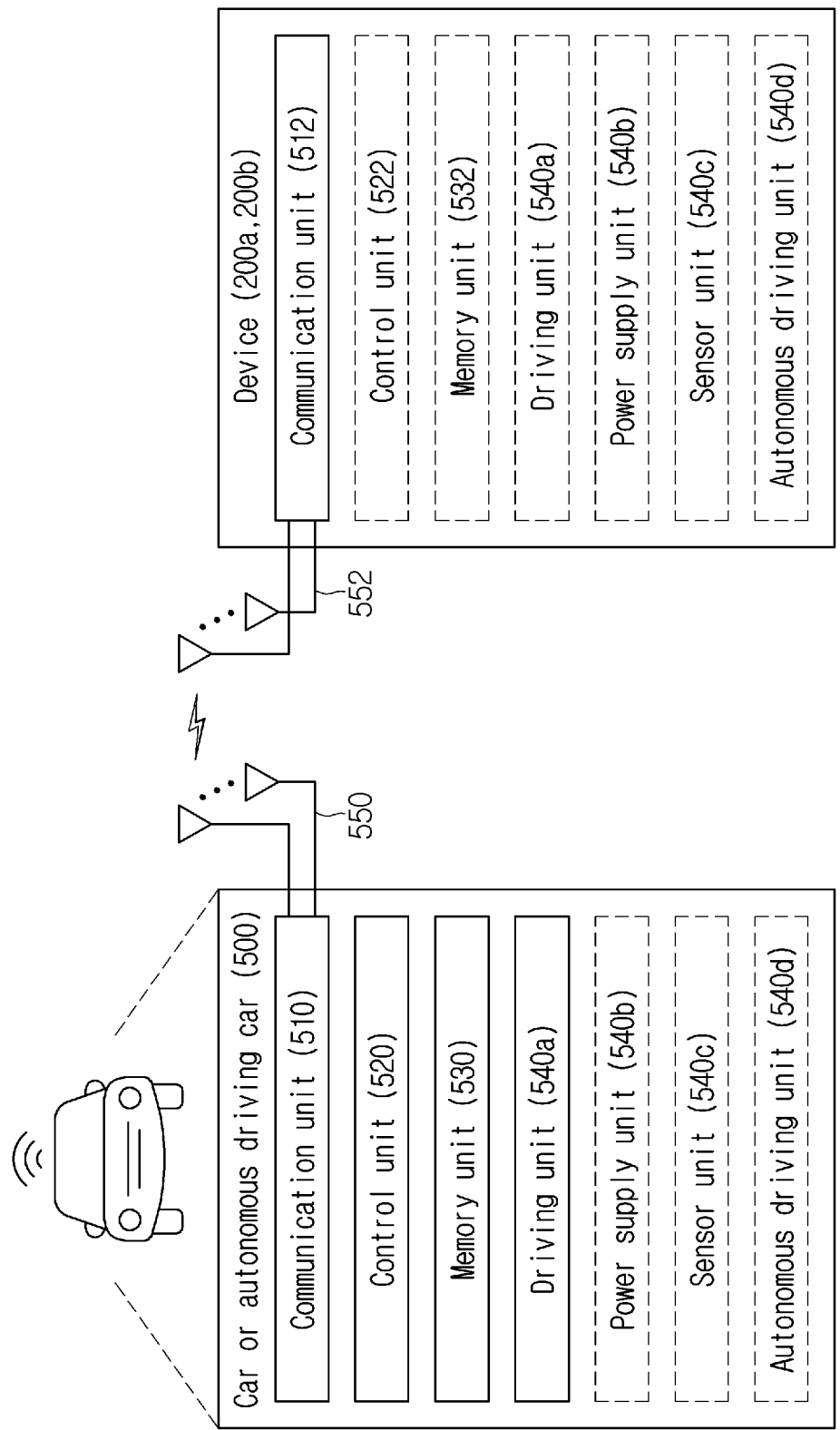
FIG. 5 is a view showing an example of a car or an autonomous driving car applicable to the present disclosure.

FIG. 5 is a view showing an example of a car or an autonomous driving car applicable to the present disclosure.

FIG. 5 shows a car or an autonomous driving vehicle applicable to the present disclosure. The car or the autonomous driving car may be implemented as a mobile robot, a vehicle, a train, a manned/unmanned aerial vehicle (AV), a ship, etc. and the type of the car is not limited.

Referring to FIG. 5, the car or autonomous driving car 500 may include an antenna unit (antenna) 508, a communication unit (transceiver) 510, a control unit (controller) 520, a driving unit 540a, a power supply unit (power supply) 540b, a sensor unit 540c, and an autonomous driving unit 540d.

The antenna unit 550 may be configured as part of the communication unit 510. The blocks 510/530/540a to 540d correspond to the blocks 410/430/440 of FIG. 4.

The communication unit 510 may transmit and receive signals (e.g., data, control signals, etc.) to and from external devices such as another vehicle, a base station (e.g., a base station, a road side unit, etc.), and a server. The control unit 520 may control the elements of the car or autonomous driving car 500 to perform various operations. The control unit 520 may include an electronic control unit (ECU). The driving unit 540a may drive the car or autonomous driving car 500 on the ground. The driving unit 540a may include an engine, a motor, a power train, wheels, a brake, a steering device, etc. The power supply unit 540b may supply power to the car or autonomous driving car 500, and include a wired/wireless charging circuit, a battery, etc. The sensor unit 540c may obtain a vehicle state, surrounding environment information, user information, etc. The sensor unit 540c may include an inertial navigation unit (IMU) sensor, a collision sensor, a wheel sensor, a speed sensor, an inclination sensor, a weight sensor, a heading sensor, a position module, a vehicle forward/reverse sensor, a battery sensor, a fuel sensor, a tire sensor, a steering sensor, a temperature sensor, a humidity sensor, an ultrasonic sensor, an illumination sensor, a brake pedal position sensor, and so on. The autonomous driving sensor 540d may implement technology for maintaining a driving lane, technology for automatically controlling a speed such as adaptive cruise control, technology for automatically driving the car along a predetermined route, technology for automatically setting a route when a destination is set and driving the car, etc.

For example, the communication unit 510 may receive map data, traffic information data, etc. from an external server. The autonomous driving unit 540d may generate an autonomous driving route and a driving plan based on the acquired data. The control unit 520 may control the driving unit 540a (e.g., speed/direction control) such that the car or autonomous driving car 500 moves along the autonomous driving route according to the driving plane. During autonomous driving, the communication unit 510 may aperiodically/periodically acquire latest traffic information data from an external server and acquire surrounding traffic information data from neighboring cars. In addition, during autonomous driving, the sensor unit 540c may acquire a vehicle state and surrounding environment information. The autonomous driving unit 540d may update the autonomous driving route and the driving plan based on newly acquired data/information. The communication unit 510 may transmit information such as a vehicle location, an autonomous driving route, a driving plan, etc. to the external server. The external server may predict traffic information data using AI technology or the like based on the information collected from the cars or autonomous driving cars and provide the predicted traffic information data to the cars or autonomous driving cars.

Figure 6:
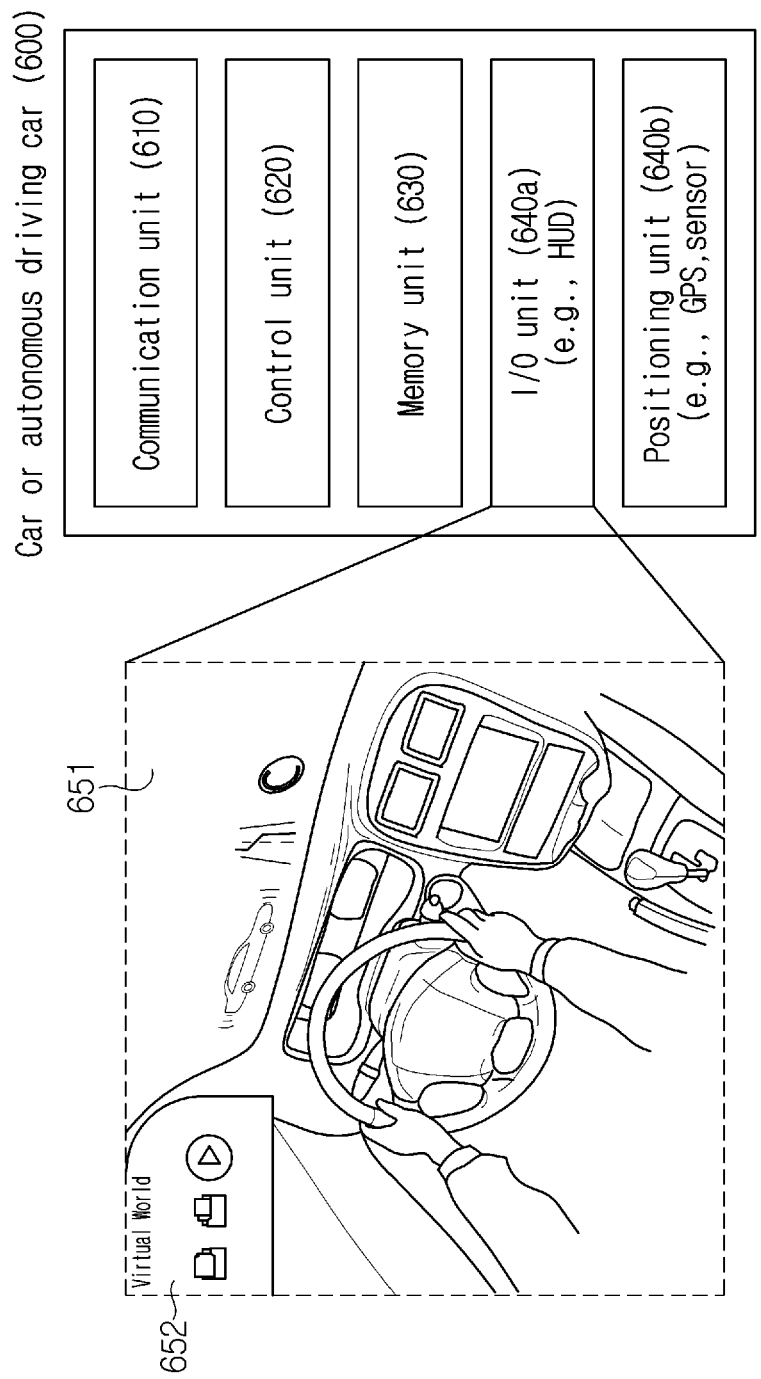
FIG. 6 is a view showing an example of a mobility applicable to the present disclosure.

FIG. 6 is a view showing an example of a mobility applicable to the present disclosure.

Referring to FIG. 6, the mobility applied to the present disclosure may be implemented as at least one of a transportation means, a train, an aerial vehicle or a ship. In addition, the mobility applied to the present disclosure may be implemented in the other forms and is not limited to the above-described embodiments.

At this time, referring to FIG. 6, the mobility 600 may include a communication unit (transceiver) 610, a control unit (controller) 620, a memory unit (memory) 630, an input/output unit 640a and a positioning unit 640b. Here, the blocks 610 to 630/640a to 640b may corresponding to the blocks 310 to 330/340 of FIG. 3.

The communication unit 610 may transmit and receive signals (e.g., data, control signals, etc.) to and from external devices such as another mobility or a base station. The control unit 620 may control the components of the mobility 600 to perform various operations. The memory unit 630 may store data/parameters/programs/code/instructions supporting the various functions of the mobility 600. The input/output unit 640a may output AR/VR objects based on information in the memory unit 630. The input/output unit 640a may include a HUD. The positioning unit 640b may acquire the position information of the mobility 600. The position information may include absolute position information of the mobility 600, position information in a driving line, acceleration information, position information of neighboring vehicles, etc. The positioning unit 640b may include a global positioning system (GPS) and various sensors.

For example, the communication unit 610 of the mobility 600 may receive map information, traffic information, etc. from an external server and store the map information, the traffic information, etc. in the memory unit 630. The positioning unit 640b may acquire mobility position information through the GPS and the various sensors and store the mobility position information in the memory unit 630. The control unit 620 may generate a virtual object based on the map information, the traffic information, the mobility position information, etc., and the input/output unit 640a may display the generated virtual object in a glass window (651 and 652). In addition, the control unit 620 may determine whether the mobility 600 is normally driven in the driving line based on the mobility position information. When the mobility 600 abnormally deviates from the driving line, the control unit 620 may display a warning on the glass window of the mobility through the input/output unit 640a. In addition, the control unit 620 may broadcast a warning message for driving abnormality to neighboring mobilities through the communication unit 610. Depending on situations, the control unit 620 may transmit the position information of the mobility and information on driving/mobility abnormality to a related institution through the communication unit 610.

Figure 7:
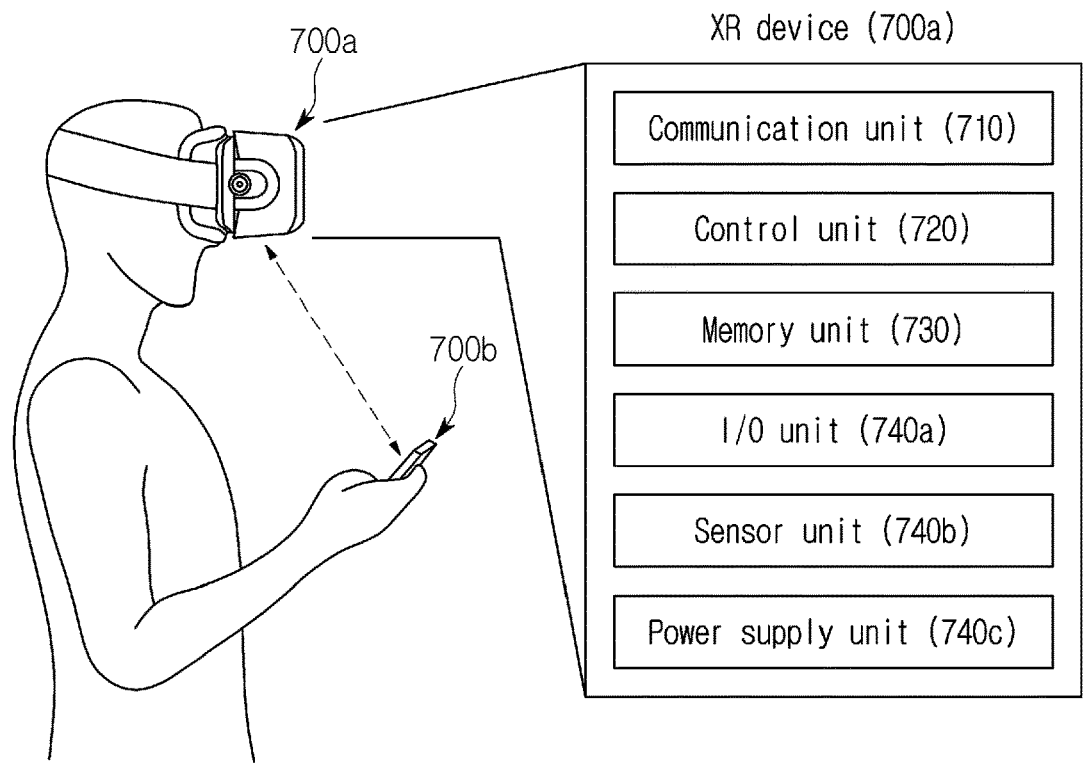
FIG. 7 is a view showing an example of an extended reality (XR) device applicable to the present disclosure.

FIG. 7 is a view showing an example of an XR device applicable to the present disclosure. The XR device may be implemented as a HMD, a head-up display (HUD) provided in a vehicle, a television, a smartphone, a computer, a wearable device, a home appliance, a digital signage, a vehicle, a robot, etc.

Referring to FIG. 7, the XR device 700a may include a communication unit (transceiver) 710, a control unit (controller) 720, a memory unit (memory) 730, an input/output unit 740a, a sensor unit 740b and a power supply unit (power supply) 740c. Here, the blocks 710 to 730/740a to 740c may correspond to the blocks 310 to 330/340 of FIG. 3, respectively.

The communication unit 710 may transmit and receive signals (e.g., media data, control signals, etc.) to and from external devices such as another wireless device, a handheld device or a media server. The media data may include video, image, sound, etc. The control unit 720 may control the components of the XR device 700a to perform various operations. For example, the control unit 720 may be configured to control and/or perform procedures such as video/image acquisition, (video/image) encoding, metadata generation and processing. The memory unit 730 may store data/parameters/programs/code/instructions necessary to drive the XR device 700a or generate an XR object.

The input/output unit 740a may acquire control information, data, etc. from the outside and output the generated XR object. The input/output unit 740a may include a camera, a microphone, a user input unit, a display, a speaker and/or a haptic module. The sensor unit 740b may obtain an XR device state, surrounding environment information, user information, etc. The sensor unit 740b may include a proximity sensor, an illumination sensor, an acceleration sensor, a magnetic sensor, a gyro sensor, an inertia sensor, a red green blue (RGB) sensor, an infrared (IR) sensor, a finger scan sensor, an ultrasonic sensor, an optical sensor, a microphone and/or a radar. The power supply unit 740c may supply power to the XR device 700a and include a wired/wireless charging circuit, a battery, etc.

For example, the memory unit 730 of the XR device 700a may include information (e.g., data, etc.) necessary to generate an XR object (e.g., AR/VR/MR object). The input/output unit 740a may acquire an instruction for manipulating the XR device 700a from a user, and the control unit 720 may drive the XR device 700a according to the driving instruction of the user. For example, when the user wants to watch a movie, news, etc. through the XR device 700a, the control unit 720 may transmit content request information to another device (e.g., a hand-held device 700b) or a media server through the communication unit 730. The communication unit 730 may download/stream content such as a movie or news from another device (e.g., the hand-held device 700b) or the media server to the memory unit 730. The control unit 720 may control and/or perform procedures such as video/image acquisition, (video/image) encoding, metadata generation/processing, etc. with respect to content, and generate/output an XR object based on information on a surrounding space or a real object acquired through the input/output unit 740a or the sensor unit 740b.

In addition, the XR device 700a may be wirelessly connected with the hand-held device 700b through the communication unit 710, and operation of the XR device 700a may be controlled by the hand-held device 700b. For example, the hand-held device 700b may operate as a controller for the XR device 700a. To this end, the XR device 700a may acquire three-dimensional position information of the hand-held device 700b and then generate and output an XR object corresponding to the hand-held device 700b.

Figure 8:
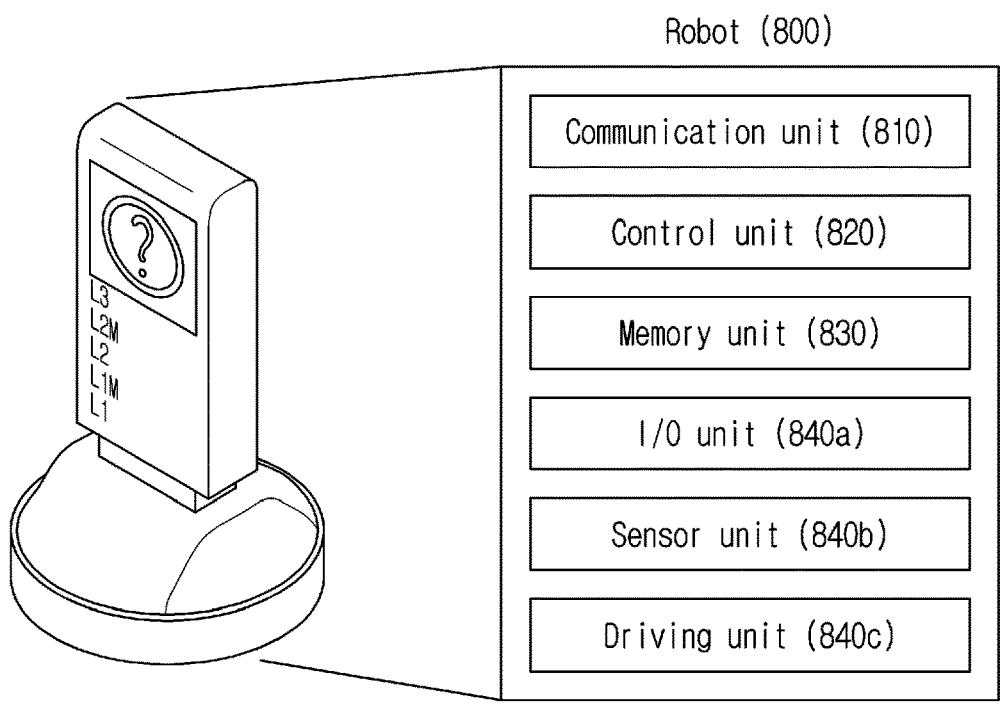
FIG. 8 is a view showing an example of a robot applicable to the present disclosure.

FIG. 8 is a view showing an example of a robot applicable to the present disclosure. For example, the robot may be classified into industrial, medical, household, military, etc. according to the purpose or field of use. At this time, referring to FIG. 8, the robot 800 may include a communication unit (transceiver) 810, a control unit (controller) 820, a memory unit (memory) 830, an input/output unit 840a, sensor unit 840b and a driving unit 840c. Here, blocks 810 to 830/840a to 840c may correspond to the blocks 310 to 330/340 of FIG. 3, respectively.

The communication unit 810 may transmit and receive signals (e.g., driving information, control signals, etc.) to and from external devices such as another wireless device, another robot or a control server. The control unit 820 may control the components of the robot 800 to perform various operations. The memory unit 830 may store data/parameters/programs/code/instructions supporting various functions of the robot 800. The input/output unit 840a may acquire information from the outside of the robot 800 and output information to the outside of the robot 800. The input/output unit 840a may include a camera, a microphone, a user input unit, a display, a speaker and/or a haptic module.

The sensor unit 840b may obtain internal information, surrounding environment information, user information, etc. of the robot 800. The sensor unit 840b may include a proximity sensor, an illumination sensor, an acceleration sensor, a magnetic sensor, a gyro sensor, an inertia sensor, an infrared (IR) sensor, a finger scan sensor, an ultrasonic sensor, an optical sensor, a microphone and/or a radar.

The driving unit 840c may perform various physical operations such as movement of robot joints. In addition, the driving unit 840c may cause the robot 800 to run on the ground or fly in the air. The driving unit 840c may include an actuator, a motor, wheels, a brake, a propeller, etc.

Figure 9:
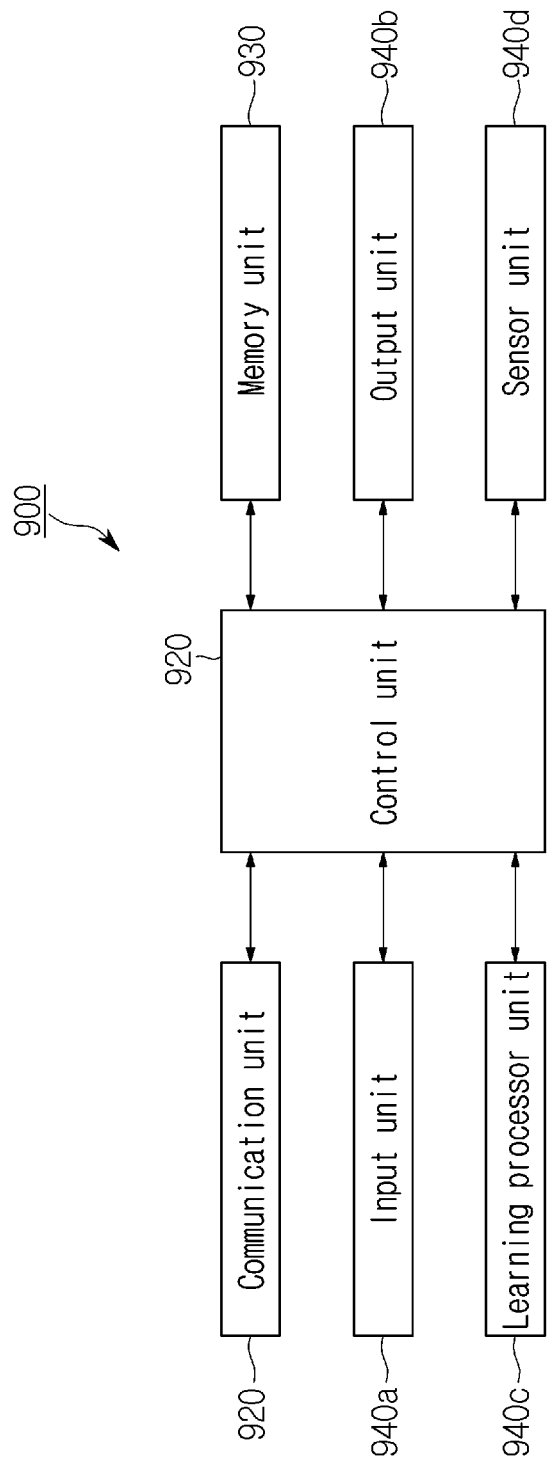
FIG. 9 is a view showing an example of artificial intelligence (AI) device applicable to the present disclosure.

FIG. 9 is a view showing an example of artificial intelligence (AI) device applicable to the present disclosure. For example, the AI device may be implemented as fixed or movable devices such as a TV, a projector, a smartphone, a PC, a laptop, a digital broadcast terminal, a tablet PC, a wearable device, a set-top box (STB), a radio, a washing machine, a refrigerator, a digital signage, a robot, a vehicle, or the like.

Referring to FIG. 9, the AI device 900 may include a communication unit (transceiver) 910, a control unit (controller) 920, a memory unit (memory) 930, an input/output unit 940a/940b, a leaning processor unit (learning processor) 940c and a sensor unit 940d. The blocks 910 to 930/940a to 940d may correspond to the blocks 310 to 330/340 of FIG. 3, respectively.

The communication unit 910 may transmit and receive wired/wireless signals (e.g., sensor information, user input, learning models, control signals, etc.) to and from external devices such as another AI device (e.g., FIG. 1, 100x, 120 or 140) or the AI server (FIG. 1, 140) using wired/wireless communication technology. To this end, the communication unit 910 may transmit information in the memory unit 930 to an external device or transfer a signal received from the external device to the memory unit 930.

The control unit 920 may determine at least one executable operation of the AI device 900 based on information determined or generated using a data analysis algorithm or a machine learning algorithm. In addition, the control unit 920 may control the components of the AI device 900 to perform the determined operation. For example, the control unit 920 may request, search for, receive or utilize the data of the learning processor unit 940c or the memory unit 930, and control the components of the AI device 900 to perform predicted operation or operation, which is determined to be desirable, of at least one executable operation. In addition, the control unit 920 may collect history information including operation of the AI device 900 or user's feedback on the operation and store the history information in the memory unit 930 or the learning processor unit 940c or transmit the history information to the AI server (FIG. 1, 140). The collected history information may be used to update a learning model.

The memory unit 930 may store data supporting various functions of the AI device 900. For example, the memory unit 930 may store data obtained from the input unit 940a, data obtained from the communication unit 910, output data of the learning processor unit 940c, and data obtained from the sensing unit 940. In addition, the memory unit 930 may store control information and/or software code necessary to operate/execute the control unit 920.

The input unit 940a may acquire various types of data from the outside of the AI device 900. For example, the input unit 940a may acquire learning data for model learning, input data, to which the learning model will be applied, etc. The input unit 940a may include a camera, a microphone and/or a user input unit. The output unit 940b may generate video, audio or tactile output. The output unit 940b may include a display, a speaker and/or a haptic module. The sensing unit 940 may obtain at least one of internal information of the AI device 900, the surrounding environment information of the AI device 900 and user information using various sensors. The sensing unit 940 may include a proximity sensor, an illumination sensor, an acceleration sensor, a magnetic sensor, a gyro sensor, an inertia sensor, a red green blue (RGB) sensor, an infrared (IR) sensor, a finger scan sensor, an ultrasonic sensor, an optical sensor, a microphone and/or a radar.

The learning processor unit 940c may train a model composed of an artificial neural network using training data. The learning processor unit 940c may perform AI processing along with the learning processor unit of the AI server (FIG. 1, 140). The learning processor unit 940c may process information received from an external device through the communication unit 910 and/or information stored in the memory unit 930. In addition, the output value of the learning processor unit 940c may be transmitted to the external device through the communication unit 910 and/or stored in the memory unit 930.

Physical Channels and General Signal Transmission

In a radio access system, a UE receives information from a base station on a DL and transmits information to the base station on a UL. The information transmitted and received between the UE and the base station includes general data information and a variety of control information. There are many physical channels according to the types/usages of information transmitted and received between the base station and the UE.

Figure 10:
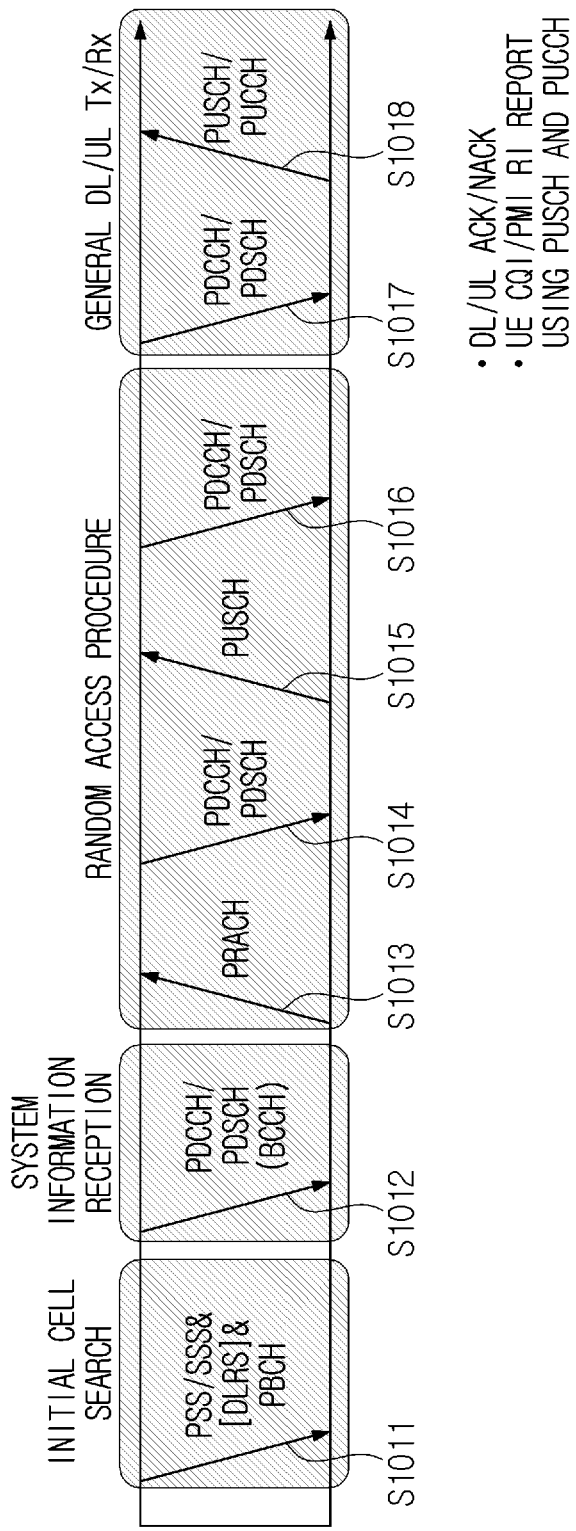
FIG. 10 is a view showing physical channels applicable to the present disclosure and a signal transmission method using the same.

FIG. 10 is a view showing physical channels applicable to the present disclosure and a signal transmission method using the same.

The UE which is turned on again in a state of being turned off or has newly entered a cell performs initial cell search operation in step S1011 such as acquisition of synchronization with a base station. Specifically, the UE performs synchronization with the base station, by receiving a Primary Synchronization Channel (P-SCH) and a Secondary Synchronization Channel (S-SCH) from the base station, and acquires information such as a cell Identifier (ID).

Thereafter, the UE may receive a physical broadcast channel (PBCH) signal from the base station and acquire intra-cell broadcast information. Meanwhile, the UE may receive a downlink reference signal (DL RS) in an initial cell search step and check a downlink channel state. The UE which has completed initial cell search may receive a physical downlink control channel (PDCCH) and a physical downlink control channel (PDSCH) according to physical downlink control channel information in step S1012, thereby acquiring more detailed system information.

Thereafter, the UE may perform a random access procedure such as steps S1013 to S1016 in order to complete access to the base station. To this end, the UE may transmit a preamble through a physical random access channel (PRACH) (S1013) and receive a random access response (RAR) to the preamble through a physical downlink control channel and a physical downlink shared channel corresponding thereto (S1014). The UE may transmit a physical uplink shared channel (PUSCH) using scheduling information in the RAR (S1015) and perform a contention resolution procedure such as reception of a physical downlink control channel signal and a physical downlink shared channel signal corresponding thereto (S1016).

The UE, which has performed the above-described procedures, may perform reception of a physical downlink control channel signal and/or a physical downlink shared channel signal (S1017) and transmission of a physical uplink shared channel (PUSCH) signal and/or a physical uplink control channel (PUCCH) signal (S1018) as general uplink/downlink signal transmission procedures.

The control information transmitted from the UE to the base station is collectively referred to as uplink control information (UCI). The UCI includes hybrid automatic repeat and request acknowledgement/negative-ACK (HARQ-ACK/NACK), scheduling request (SR), channel quality indication (CQI), precoding matrix indication (PMI), rank indication (RI), beam indication (BI) information, etc. At this time, the UCI is generally periodically transmitted through a PUCCH, but may be transmitted through a PUSCH in some embodiments (e.g., when control information and traffic data are simultaneously transmitted). In addition, the UE may aperiodically transmit UCI through a PUSCH according to a request/instruction of a network.

Figure 11:
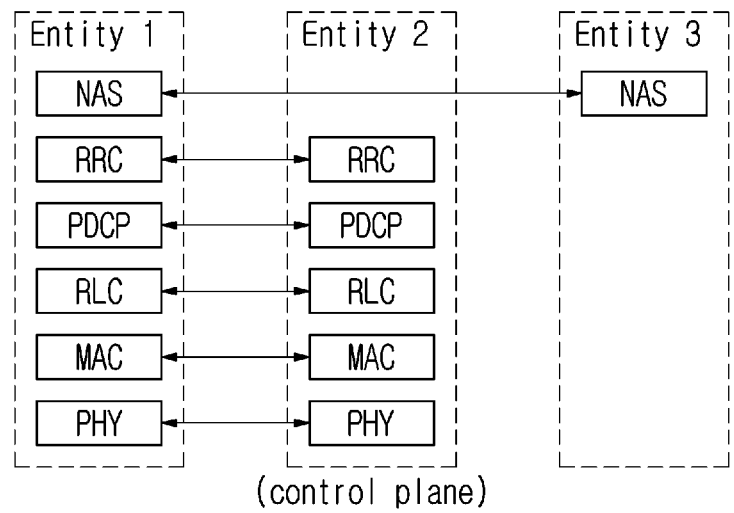
FIG. 11 is a view showing the structure of a control plane and a user plane of a radio interface protocol applicable to the present disclosure.
Figure 11:
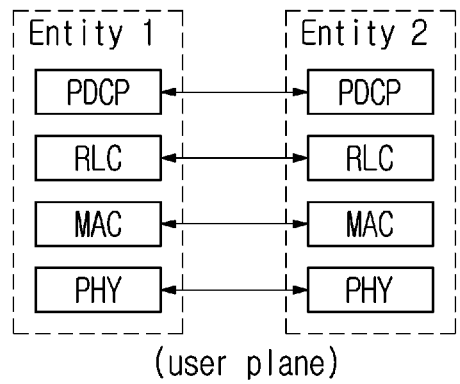

FIG. 11 is a view showing the structure of a control plane and a user plane of a radio interface protocol applicable to the present disclosure.

Referring to FIG. 11, Entity 1 may be a user equipment (UE). At this time, the UE may be at least one of a wireless device, a hand-held device, a vehicle, a mobility, an XR device, a robot or an AI device, to which the present disclosure is applicable in FIGS. 1 to 9. In addition, the UE refers to a device, to which the present disclosure is applicable, and is not limited to a specific apparatus or device.

Entity 2 may be a base station. At this time, the base station may be at least one of an eNB, a gNB or an ng-eNB. In addition, the base station may refer to a device for transmitting a downlink signal to a UE and is not limited to a specific apparatus or device. That is, the base station may be implemented in various forms or types and is not limited to a specific form.

Entity 3 may be a device for performing a network apparatus or a network function. At this time, the network apparatus may be a core network node (e.g., mobility management entity (MME) for managing mobility, an access and mobility management function (AMF), etc. In addition, the network function may mean a function implemented in order to perform a network function. Entity 3 may be a device, to which a function is applied. That is, Entity 3 may refer to a function or device for performing a network function and is not limited to a specific device.

A control plane refers to a path used for transmission of control messages, which are used by the UE and the network to manage a call. A user plane refers to a path in which data generated in an application layer, e.g. voice data or Internet packet data, is transmitted. At this time, a physical layer which is a first layer provides an information transfer service to a higher layer using a physical channel. The physical layer is connected to a media access control (MAC) layer of a higher layer via a transmission channel. At this time, data is transmitted between the MAC layer and the physical layer via the transmission channel. Data is also transmitted between a physical layer of a transmitter and a physical layer of a receiver via a physical channel. The physical channel uses time and frequency as radio resources.

The MAC layer which is a second layer provides a service to a radio link control (RLC) layer of a higher layer via a logical channel. The RLC layer of the second layer supports reliable data transmission. The function of the RLC layer may be implemented by a functional block within the MAC layer. A packet data convergence protocol (PDCP) layer which is the second layer performs a header compression function to reduce unnecessary control information for efficient transmission of an Internet protocol (IP) packet such as an IPV4 or IPv6 packet in a radio interface having relatively narrow bandwidth. A radio resource control (RRC) layer located at the bottommost portion of a third layer is defined only in the control plane. The RRC layer serves to control logical channels, transmission channels, and physical channels in relation to configuration, re-configuration, and release of radio bearers. A radio bearer (RB) refers to a service provided by the second layer to transmit data between the UE and the network. To this end, the RRC layer of the UE and the RRC layer of the network exchange RRC messages. A non-access stratum (NAS) layer located at a higher level of the RRC layer performs functions such as session management and mobility management. One cell configuring a base station may be set to one of various bandwidths to provide a downlink or uplink transmission service to several UEs. Different cells may be set to provide different bandwidths. Downlink transmission channels for transmitting data from a network to a UE may include a broadcast channel (BCH) for transmitting system information, a paging channel (PCH) for transmitting paging messages, and a DL shared channel (SCH) for transmitting user traffic or control messages. Traffic or control messages of a DL multicast or broadcast service may be transmitted through the DL SCH or may be transmitted through an additional DL multicast channel (MCH). Meanwhile, UL transmission channels for data transmission from the UE to the network include a random access channel (RACH) for transmitting initial control messages and a UL SCH for transmitting user traffic or control messages. Logical channels, which are located at a higher level of the transmission channels and are mapped to the transmission channels, include a broadcast control channel (BCCH), a paging control channel (PCCH), a common control channel (CCCH), a multicast control channel (MCCH), and a multicast traffic channel (MTCH).

Figure 12:
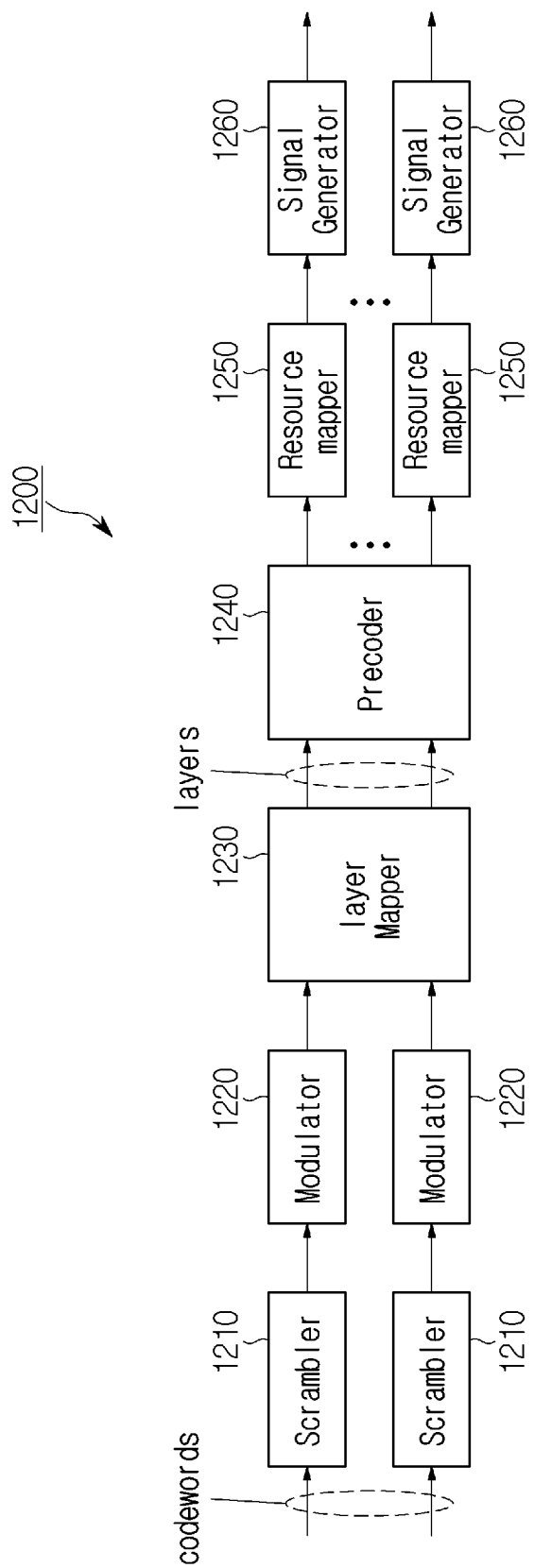
FIG. 12 is a view showing a method of processing a transmitted signal applicable to the present disclosure.

FIG. 12 is a view showing a method of processing a transmitted signal applicable to the present disclosure. For example, the transmitted signal may be processed by a signal processing circuit. At this time, a signal processing circuit 1200 may include a scrambler 1210, a modulator 1220, a layer mapper 1230, a precoder 1240, a resource mapper 1250, and a signal generator 1260. At this time, for example, the operation/function of FIG. 12 may be performed by the processors 202*a* and 202*b* and/or the transceiver 206*a* and 206*b* of FIG. 2. In addition, for example, the hardware element of FIG. 12 may be implemented in the processors 202*a* and 202*b* of FIG. 2 and/or the transceivers 206*a* and 206*b* of FIG. 2. For example, blocks 1010 to 1060 may be implemented in the processors 202*a* and 202*b* of FIG. 2. In addition, blocks 1210 to 1250 may be implemented in the processors 202*a* and 202*b* of FIG. 2 and a block 1260 may be implemented in the transceivers 206*a* and 206*b* of FIG. 2, without being limited to the above-described embodiments.

A codeword may be converted into a radio signal through the signal processing circuit 1200 of FIG. 12. Here, the codeword is a coded bit sequence of an information block. The information block may include a transport block (e.g., a UL-SCH transport block or a DL-SCH transport block). The radio signal may be transmitted through various physical channels (e.g., a PUSCH and a PDSCH) of FIG. 10.

Specifically, the codeword may be converted into a bit sequence scrambled by the scrambler 1210. The scramble sequence used for scramble is generated based in an initial value and the initial value may include ID information of a wireless device, etc. The scrambled bit sequence may be modulated into a modulated symbol sequence by the modulator 1220. The modulation method may include pi/2-binary phase shift keying (pi/2-BPSK), m-phase shift keying (m-PSK), m-quadrature amplitude modulation (m-QAM), etc.

A complex modulation symbol sequence may be mapped to one or more transport layer by the layer mapper 1230. Modulation symbols of each transport layer may be mapped to corresponding antenna port(s) by the precoder 1240 (precoding). The output z of the precoder 1240 may be obtained by multiplying the output y of the layer mapper 1230 by an N*M precoding matrix W. Here, N may be the number of antenna ports and M may be the number of transport layers. Here, the precoder 1240 may perform precoding after transform precoding (e.g., discrete Fourier transform (DFT)) for complex modulation symbols. In addition, the precoder 1240 may perform precoding without performing transform precoding.

The resource mapper 1250 may map modulation symbols of each antenna port to time-frequency resources. The time-frequency resources may include a plurality of symbols (e.g., a CP-OFDMA symbol and a DFT-s-OFDMA symbol) in the time domain and include a plurality of subcarriers in the frequency domain. The signal generator 1260 may generate a radio signal from the mapped modulation symbols, and the generated radio signal may be transmitted to another device through each antenna. To this end, the signal generator 1260 may include an inverse fast Fourier transform (IFFT) module, a cyclic prefix (CP) insertor, a digital-to-analog converter (DAC), a frequency uplink converter, etc.

A signal processing procedure for a received signal in the wireless device may be configured as the inverse of the signal processing procedures 1210 to 1260 of FIG. 12. For example, the wireless device (e.g., 200*a* or 200*b* of FIG. 2) may receive a radio signal from the outside through an antenna port/transceiver. The received radio signal may be converted into a baseband signal through a signal restorer. To this end, the signal restorer may include a frequency downlink converter, an analog-to-digital converter (ADC), a CP remover, and a fast Fourier transform (FFT) module. Thereafter, the baseband signal may be restored to a codeword through a resource de-mapper process, a postcoding process, a demodulation process and a de-scrambling process. The codeword may be restored to an original information block through decoding. Accordingly, a signal processing circuit (not shown) for a received signal may include a signal restorer, a resource de-mapper, a postcoder, a demodulator, a de-scrambler and a decoder.

Figure 13:
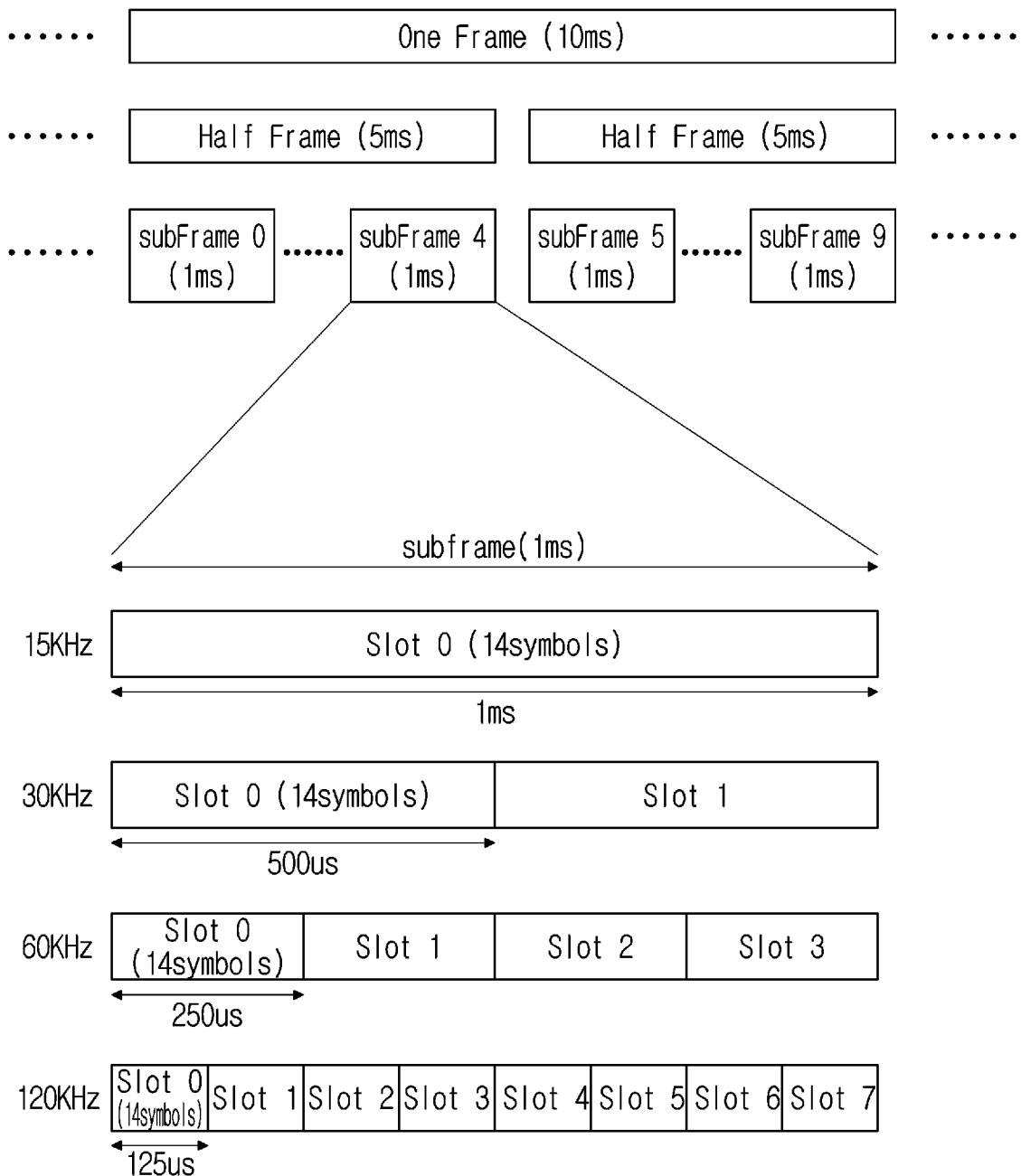
FIG. 13 is a view showing the structure of a radio frame applicable to the present disclosure.

FIG. 13 is a view showing the structure of a radio frame applicable to the present disclosure.

UL and DL transmission based on an NR system may be based on the frame shown in FIG. 13. At this time, one radio frame has a length of 10 ms and may be defined as two 5-ms half-frames (HFs). One half-frame may be defined as five 1-ms subframes (SFs). One subframe may be divided into one or more slots and the number of slots in the subframe may depend on subscriber spacing (SCS). At this time, each slot may include 12 or 14 OFDM(A) symbols according to cyclic prefix (CP). If normal CP is used, each slot may include 14 symbols. If an extended CP is used, each slot may include 12 symbols. Here, the symbol may include an OFDM symbol (or a CP-OFDM symbol) and an SC-FDMA symbol (or a DFT-s-OFDM symbol).

Table 1 shows the number of symbols per slot according to SCS, the number of slots per frame and the number of slots per subframe when normal CP is used, and Table 2 shows the number of symbols per slot according to SCS, the number of slots per frame and the number of slots per subframe when extended CP is used.

TABLE 1

| μ | $N_{symb}^{slot}$ | $N_{slot}^{frame, \mu}$ | $N_{slot}^{subframe, \mu}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |
| 5 | 14 | 320 | 32 |

TABLE 2

| μ | $N_{symb}^{slot}$ | $N_{slot}^{frame, \mu}$ | $N_{slot}^{subframe, \mu}$ |
|---|---|---|---|
| 2 | 12 | 40 | 4 |

In Tables 1 and 2 above, $N^{slot}_{symb}$ may indicate the number of symbols in a slot, $N^{frame,\mu}_{slot}$ may indicate the number of slots in a frame, and $N^{subframe,\mu}_{slot}$ may indicate the number of slots in a subframe. In addition, in a system, to which the present disclosure is applicable, OFDM(A) numerology (e.g., SCS, CP length, etc.) may be differently set among a plurality of cells merged to one UE. Accordingly, an (absolute time) period of a time resource (e.g., an SF, a slot or a TTI) (for convenience, collectively referred to as a time unit (TU)) composed of the same number of symbols may be differently set between merged cells.

NR may support a plurality of numerologies (or subscriber spacings (SCSs)) supporting various 5G services. For example, a wide area in traditional cellular bands is supported when the SCS is 15 kHz, dense-urban, lower latency and wider carrier bandwidth are supported when the SCS is 30 kHz/60 kHz, and bandwidth greater than 24.25 GHz may be supported to overcome phase noise when the SCS is 60 kHz or higher.

An NR frequency band is defined as two types (FR1 and FR2) of frequency ranges. FR1 and FR2 may be configured as shown in the following table. In addition, FR2 may mean millimeter wave (mmW).

TABLE 3

| Frequency Range designation | Corresponding frequency range | Subcarrier Spacing |
|---|---|---|
| FR1 | 410 MHz-7125 MHz | 15, 30, 60 kHz |
| FR2 | 24250 MHz-52600 MHz | 60, 120, 240 kHz |

In addition, for example, in a communication system, to which the present disclosure is applicable, the above-described numerology may be differently set. For example, a terahertz wave (THz) band may be used as a frequency band higher than FR2. In the THz band, the SCS may be set greater than that of the NR system, and the number of slots may be differently set, without being limited to the above-described embodiments. The THz band will be described below.

Figure 14:
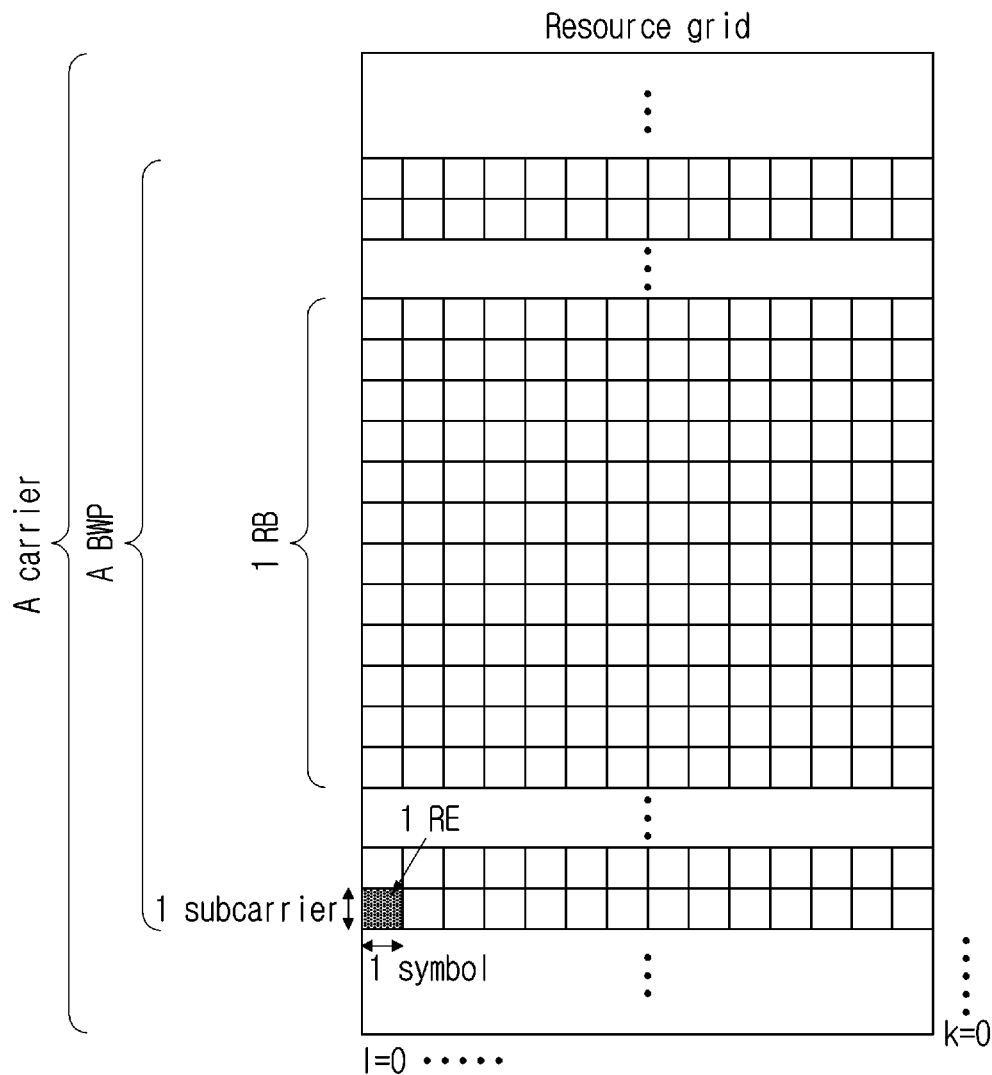
FIG. 14 is a view showing a slot structure applicable to the present disclosure.

FIG. 14 is a view showing a slot structure applicable to the present disclosure.

One slot includes a plurality of symbols in the time domain. For example, one slot includes seven symbols in case of normal CP and one slot includes six symbols in case of extended CP. A carrier includes a plurality of subcarriers in the frequency domain. A resource block (RB) may be defined as a plurality (e.g., 12) of consecutive subcarriers in the frequency domain.

In addition, a bandwidth part (BWP) is defined as a plurality of consecutive (P)RBs in the frequency domain and may correspond to one numerology (e.g., SCS, CP length, etc.).

The carrier may include a maximum of N (e.g., five) BWPs. Data communication is performed through an activated BWP and only one BWP may be activated for one UE. In resource grid, each element is referred to as a resource element (RE) and one complex symbol may be mapped.

6G Communication System

A 6G (wireless communication) system has purposes such as (i) very high data rate per device, (ii) a very large number of connected devices, (iii) global connectivity, (iv) very low latency, (v) decrease in energy consumption of battery-free IoT devices, (vi) ultra-reliable connectivity, and (vii) connected intelligence with machine learning capacity. The vision of the 6G system may include four aspects such as "intelligent connectivity", "deep connectivity", "holographic connectivity" and "ubiquitous connectivity", and the 6G system may satisfy the requirements shown in Table 4 below. That is, Table 4 shows the requirements of the 6G system.

TABLE 4

| Per device peak data rate | 1 Tbps |
| E2E latency | 1 ms |
| Maximum spectral efficiency | 100 bps/Hz |
| Mobility support | Up to 1000 km/hr |
| Satellite integration | Fully |
| AI | Fully |
| Autonomous vehicle | Fully |
| XR | Fully |
| Haptic Communication | Fully |

Figure 15:
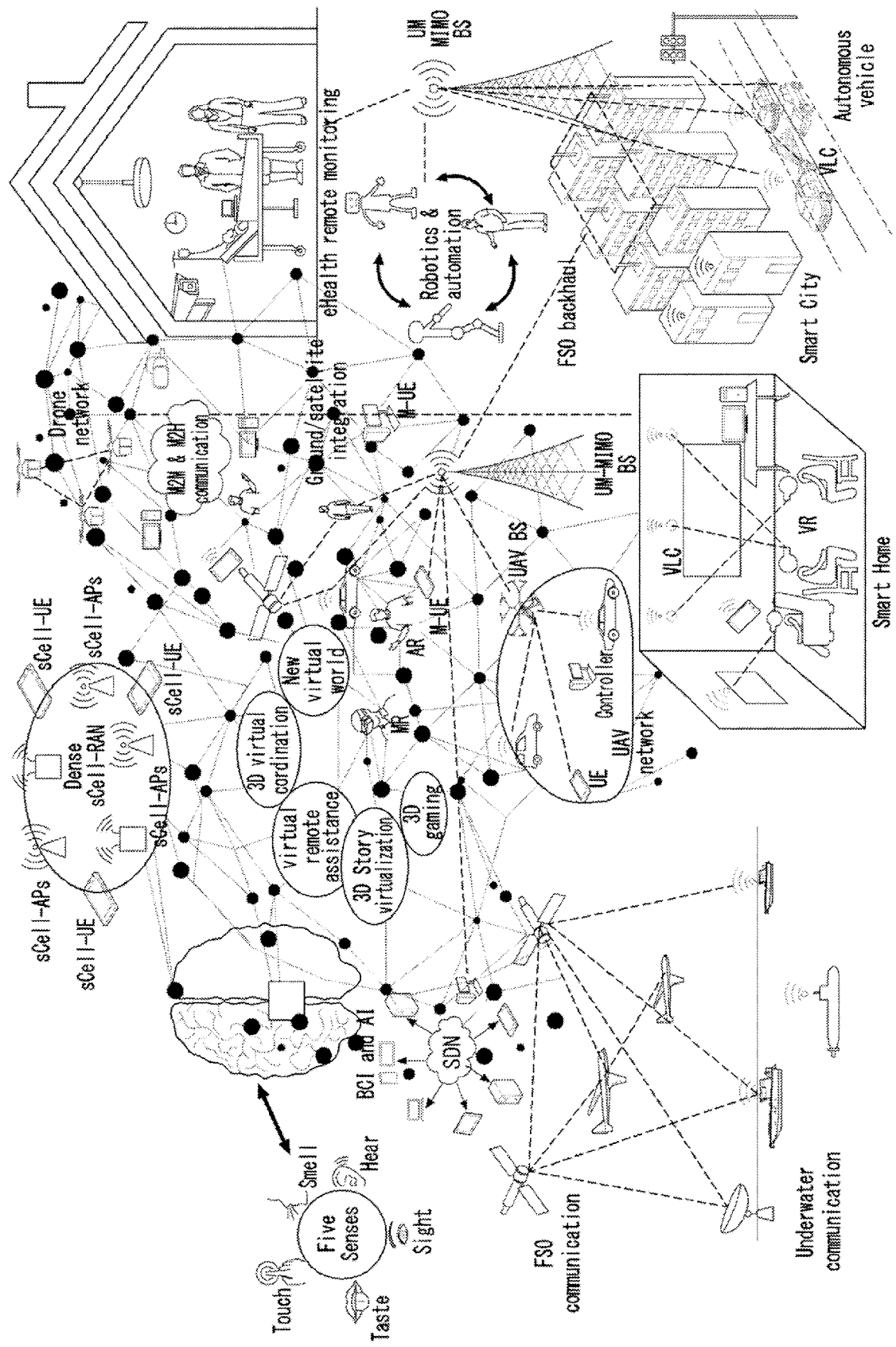
FIG. 15 is a view showing an example of a communication structure providable in a 6th generation (6G) system applicable to the present disclosure.

At this time, the 6G system may have key factors such as enhanced mobile broadband (eMBB), ultra-reliable low latency communications (URLLC), massive machine type communications (mMTC), AI integrated communication, tactile Internet, high throughput, high network capacity, high energy efficiency, low backhaul and access network congestion and enhanced data security. FIG. 15 is a view showing an example of a communication structure providable in a 6G system applicable to the present disclosure.

Referring to FIG. 15, the 6G system will have 50 times higher simultaneous wireless communication connectivity than a 5G wireless communication system. URLLC, which is the key feature of 5G, will become more important technology by providing end-to-end latency less than 1 ms in 6G communication. At this time, the 6G system may have much better volumetric spectrum efficiency unlike frequently used domain spectrum efficiency. The 6G system may provide advanced battery technology for energy harvesting and very long battery life and thus mobile devices may not need to be separately charged in the 6G system. In addition, in 6G, new network characteristics may be as follows.

Satellites integrated network: To provide a global mobile group, 6G will be integrated with satellite. Integrating terrestrial waves, satellites and public networks as one wireless communication system may be very important for 6G.

Connected intelligence: Unlike the wireless communication systems of previous generations, 6G is innovative and wireless evolution may be updated from "connected things" to "connected intelligence". AI may be applied in each step (or each signal processing procedure which will be described below) of a communication procedure.

Seamless integration of wireless information and energy transfer: A 6G wireless network may transfer power in order to charge the batteries of devices such as smartphones and sensors. Therefore, wireless information and energy transfer (WIET) will be integrated.

Ubiquitous super 3-dimension connectivity: Access to networks and core network functions of drones and very low earth orbit satellites will establish super 3D connection in 6G ubiquitous.

In the new network characteristics of 6G, several general requirements may be as follows.

Small cell networks: The idea of a small cell network was introduced in order to improve received signal quality as a result of throughput, energy efficiency and spectrum efficiency improvement in a cellular system. As a result, the small cell network is an essential feature for 5G and beyond 5G (5GB) communication systems. Accordingly, the 6G communication system also employs the characteristics of the small cell network.

Ultra-dense heterogeneous network: Ultra-dense heterogeneous networks will be another important characteristic of the 6G communication system. A multi-tier network composed of heterogeneous networks improves overall QoS and reduces costs.

High-capacity backhaul: Backhaul connection is characterized by a high-capacity backhaul network in order to support high-capacity traffic. A high-speed optical fiber and free space optical (FSO) system may be a possible solution for this problem.

Radar technology integrated with mobile technology: High-precision localization (or location-based service) through communication is one of the functions of the 6G wireless communication system. Accordingly, the radar system will be integrated with the 6G network.

Softwarization and virtualization: Softwarization and virtualization are two important functions which are the bases of a design process in a 5GB network in order to ensure flexibility, reconfigurability and programmability.

Core Implementation Technology of 6G System

Artificial Intelligence (AI)

Technology which is most important in the 6G system and will be newly introduced is AI. AI was not involved in the 4G system. A 5G system will support partial or very limited AI. However, the 6G system will support AI for full automation. Advance in machine learning will create a more intelligent network for real-time communication in 6G. When AI is introduced to communication, real-time data transmission may be simplified and improved. AI may determine a method of performing complicated target tasks using countless analysis. That is, AI may increase efficiency and reduce processing delay.

Time-consuming tasks such as handover, network selection or resource scheduling may be immediately performed by using AI. AI may play an important role even in M2M, machine-to-human and human-to-machine communication. In addition, AI may be rapid communication in a brain computer interface (BCI). An AI based communication system may be supported by meta materials, intelligent structures, intelligent networks, intelligent devices, intelligent recognition radios, self-maintaining wireless networks and machine learning.

Recently, attempts have been made to integrate AI with a wireless communication system in the application layer or the network layer, but deep learning have been focused on the wireless resource management and allocation field. However, such studies are gradually developed to the MAC layer and the physical layer, and, particularly, attempts to combine deep learning in the physical layer with wireless transmission are emerging. AI-based physical layer transmission means applying a signal processing and communication mechanism based on an AI driver rather than a traditional communication framework in a fundamental signal processing and communication mechanism. For example, channel coding and decoding based on deep learning, signal estimation and detection based on deep learning, multiple input multiple output (MIMO) mechanisms based on deep learning, resource scheduling and allocation based on AI, etc. may be included.

Machine learning may be used for channel estimation and channel tracking and may be used for power allocation, interference cancellation, etc. in the physical layer of DL. In addition, machine learning may be used for antenna selection, power control, symbol detection, etc. in the MIMO system.

However, application of a deep neutral network (DNN) for transmission in the physical layer may have the following problems.

Deep learning-based AI algorithms require a lot of training data in order to optimize training parameters. However, due to limitations in acquiring data in a specific channel environment as training data, a lot of training data is used offline. Static training for training data in a specific channel environment may cause a contradiction between the diversity and dynamic characteristics of a radio channel.

In addition, currently, deep learning mainly targets real signals. However, the signals of the physical layer of wireless communication are complex signals. For matching of the characteristics of a wireless communication signal, studies on a neural network for detecting a complex domain signal are further required.

Hereinafter, machine learning will be described in greater detail.

Machine learning refers to a series of operations to train a machine in order to build a machine which can perform tasks which cannot be performed or are difficult to be performed by people. Machine learning requires data and learning models. In machine learning, data learning methods may be roughly divided into three methods, that is, supervised learning, unsupervised learning and reinforcement learning.

Neural network learning is to minimize output error. Neural network learning refers to a process of repeatedly inputting training data to a neural network, calculating the error of the output and target of the neural network for the training data, backpropagating the error of the neural network from the output layer of the neural network to an input layer in order to reduce the error and updating the weight of each node of the neural network.

Supervised learning may use training data labeled with a correct answer and the unsupervised learning may use training data which is not labeled with a correct answer. That is, for example, in case of supervised learning for data classification, training data may be labeled with a category. The labeled training data may be input to the neural network, and the output (category) of the neural network may be compared with the label of the training data, thereby calculating the error. The calculated error is backpropagated from the neural network backward (that is, from the output layer to the input layer), and the connection weight of each node of each layer of the neural network may be updated according to backpropagation. Change in updated connection weight of each node may be determined according to the learning rate. Calculation of the neural network for input data and backpropagation of the error may configure a learning cycle (epoch). The learning data is differently applicable according to the number of repetitions of the learning cycle of the neural network. For example, in the early phase of learning of the neural network, a high learning rate may be used to increase efficiency such that the neural network rapidly ensures a certain level of performance and, in the late phase of learning, a low learning rate may be used to increase accuracy.

The learning method may vary according to the feature of data. For example, for the purpose of accurately predicting data transmitted from a transmitter in a receiver in a communication system, learning may be performed using supervised learning rather than unsupervised learning or reinforcement learning.

The learning model corresponds to the human brain and may be regarded as the most basic linear model. However, a paradigm of machine learning using a neural network structure having high complexity, such as artificial neural networks, as a learning model is referred to as deep learning.

Neural network cores used as a learning method may roughly include a deep neural network (DNN) method, a convolutional deep neural network (CNN) method and a recurrent Boltzmman machine (RNN) method. Such a learning model is applicable.

Terahertz (THz) Communication

THz communication is applicable to the 6G system. For example, a data rate may increase by increasing bandwidth. This may be performed by using sub-THz communication with wide bandwidth and applying advanced massive MIMO technology.

Figure 16:
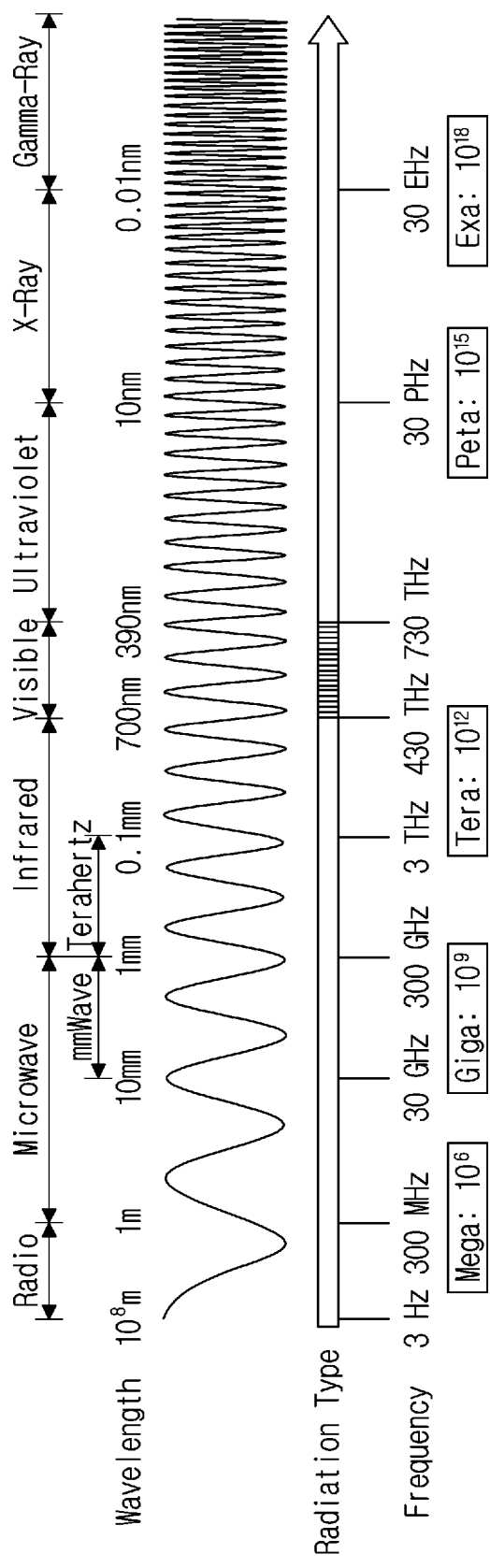
FIG. 16 is a view showing an electromagnetic spectrum applicable to the present disclosure.

FIG. 16 is a view showing an electromagnetic spectrum applicable to the present disclosure. For example, referring to FIG. 16, THz waves which are known as sub-millimeter radiation, generally indicates a frequency band between 0.1 THz and 10 THz with a corresponding wavelength in a range of 0.03 mm to 3 mm. A band range of 100 GHz to 300 GHz (sub THz band) is regarded as a main part of the THz band for cellular communication. When the sub-THz band is added to the mmWave band, the 6G cellular communication capacity increases. 300 GHz to 3 THz of the defined THz band is in a far infrared (IR) frequency band. A band of 300 GHz to 3 THz is a part of an optical band but is at the border of the optical band and is just behind an RF band. Accordingly, the band of 300 GHz to 3 THz has similarity with RF.

The main characteristics of THz communication include (i) bandwidth widely available to support a very high data rate and (ii) high path loss occurring at a high frequency (a high directional antenna is indispensable). A narrow beam width generated by the high directional antenna reduces interference. The small wavelength of a THz signal allows a larger number of antenna elements to be integrated with a device and BS operating in this band. Therefore, an advanced adaptive arrangement technology capable of overcoming a range limitation may be used.

Optical Wireless Technology

Optical wireless communication (OWC) technology is planned for 6G communication in addition to RF based communication for all possible device-to-access networks. This network is connected to a network-to-backhaul/fronthaul network connection. OWC technology has already been used since 4G communication systems but will be more widely used to satisfy the requirements of the 6G communication system. OWC technologies such as light fidelity/visible light communication, optical camera communication and free space optical (FSO) communication based on wide band are well-known technologies. Communication based on optical wireless technology may provide a very high data rate, low latency and safe communication. Light detection and ranging (LiDAR) may also be used for ultra high resolution 3D mapping in 6G communication based on wide band.

FSO Backhaul Network

The characteristics of the transmitter and receiver of the FSO system are similar to those of an optical fiber network. Accordingly, data transmission of the FSO system similar to that of the optical fiber system. Accordingly, FSO may be a good technology for providing backhaul connection in the 6G system along with the optical fiber network. When FSO is used, very long-distance communication is possible even at a distance of 10,000 km or more. FSO supports mass backhaul connections for remote and non-remote areas such as sea, space, underwater and isolated islands. FSO also supports cellular base station connections.

Massive MIMO Technology

One of core technologies for improving spectrum efficiency is MIMO technology. When MIMO technology is improved, spectrum efficiency is also improved. Accordingly, massive MIMO technology will be important in the 6G system. Since MIMO technology uses multiple paths, multiplexing technology and beam generation and management technology suitable for the THz band should be significantly considered such that data signals are transmitted through one or more paths.

Blockchain

A blockchain will be important technology for managing large amounts of data in future communication systems. The blockchain is a form of distributed ledger technology, and distributed ledger is a database distributed across numerous nodes or computing devices. Each node duplicates and stores the same copy of the ledger. The blockchain is managed through a peer-to-peer (P2P) network. This may exist without being managed by a centralized institution or server. Blockchain data is collected together and organized into blocks. The blocks are connected to each other and protected using encryption. The blockchain completely complements large-scale IoT through improved interoperability, security, privacy, stability and scalability. Accordingly, the blockchain technology provides several functions such as interoperability between devices, high-capacity data traceability, autonomous interaction of different IoT systems, and large-scale connection stability of 6G communication systems.

3D Networking

The 6G system integrates terrestrial and public networks to support vertical expansion of user communication. A 3D BS will be provided through low-orbit satellites and UAVs. Adding new dimensions in terms of altitude and related degrees of freedom makes 3D connections significantly different from existing 2D networks.

Quantum Communication

In the context of the 6G network, unsupervised reinforcement learning of the network is promising. The supervised learning method cannot label the vast amount of data generated in 6G. Labeling is not required for unsupervised learning. Thus, this technique can be used to autonomously build a representation of a complex network. Combining reinforcement learning with unsupervised learning may enable the network to operate in a truly autonomous way.

Unmanned Aerial Vehicle

An unmanned aerial vehicle (UAV) or drone will be an important factor in 6G wireless communication. In most cases, a high-speed data wireless connection is provided using UAV technology. A base station entity is installed in the UAV to provide cellular connectivity. UAVs have certain features, which are not found in fixed base station infrastructures, such as easy deployment, strong line-of-sight links, and mobility-controlled degrees of freedom. During emergencies such as natural disasters, the deployment of terrestrial telecommunications infrastructure is not economically feasible and sometimes services cannot be provided in volatile environments. The UAV can easily handle this situation. The UAV will be a new paradigm in the field of wireless communications. This technology facilitates the three basic requirements of wireless networks, such as eMBB, URLLC and mMTC. The UAV can also serve a number of purposes, such as network connectivity improvement, fire detection, disaster emergency services, security and surveillance, pollution monitoring, parking monitoring, and accident monitoring. Therefore, UAV technology is recognized as one of the most important technologies for 6G communication.

Cell-Free Communication

The tight integration of multiple frequencies and heterogeneous communication technologies is very important in the 6G system. As a result, a user can seamlessly move from network to network without having to make any manual configuration in the device. The best network is automatically selected from the available communication technologies. This will break the limitations of the cell concept in wireless communication. Currently, user movement from one cell to another cell causes too many handovers in a high-density network, and causes handover failure, handover delay, data loss and ping-pong effects. 6G cell-free communication will overcome all of them and provide better QoS. Cell-free communication will be achieved through multi-connectivity and multi-tier hybrid technologies and different heterogeneous radios in the device.

Wireless Information and Energy Transfer (WIET)

WIET uses the same field and wave as a wireless communication system. In particular, a sensor and a smartphone will be charged using wireless power transfer during communication. WIET is a promising technology for extending the life of battery charging wireless systems. Therefore, devices without batteries will be supported in 6G communication.

Integration of Sensing and Communication

An autonomous wireless network is a function for continuously detecting a dynamically changing environment state and exchanging information between different nodes. In 6G, sensing will be tightly integrated with communication to support autonomous systems.

Integration of Access Backhaul Network

In 6G, the density of access networks will be enormous. Each access network is connected by optical fiber and backhaul connection such as FSO network. To cope with a very large number of access networks, there will be a tight integration between the access and backhaul networks.

Hologram Beamforming

Beamforming is a signal processing procedure that adjusts an antenna array to transmit radio signals in a specific direction. This is a subset of smart antennas or advanced antenna systems. Beamforming technology has several advantages, such as high signal-to-noise ratio, interference prevention and rejection, and high network efficiency. Hologram beamforming (HBF) is a new beamforming method that differs significantly from MIMO systems because this uses a software-defined antenna. HBF will be a very effective approach for efficient and flexible transmission and reception of signals in multi-antenna communication devices in 6G.

Big Data Analysis

Big data analysis is a complex process for analyzing various large data sets or big data. This process finds information such as hidden data, unknown correlations, and customer disposition to ensure complete data management. Big data is collected from various sources such as video, social networks, images and sensors. This technology is widely used for processing massive data in the 6G system.

Large Intelligent Surface (LIS)

In the case of the THz band signal, since the straightness is strong, there may be many shaded areas due to obstacles. By installing the LIS near these shaded areas, LIS technology that expands a communication area, enhances communication stability, and enables additional optional services becomes important. The LIS is an artificial surface made of electromagnetic materials, and can change propagation of incoming and outgoing radio waves. The LIS can be viewed as an extension of massive MIMO, but differs from the massive MIMO in array structures and operating mechanisms. In addition, the LIS has an advantage such as low power consumption, because this operates as a reconfigurable reflector with passive elements, that is, signals are only passively reflected without using active RF chains. In addition, since each of the passive reflectors of the LIS must independently adjust the phase shift of an incident signal, this may be advantageous for wireless communication channels. By properly adjusting the phase shift through an LIS controller, the reflected signal can be collected at a target receiver to boost the received signal power.

THz Wireless Communication

Figure 17:
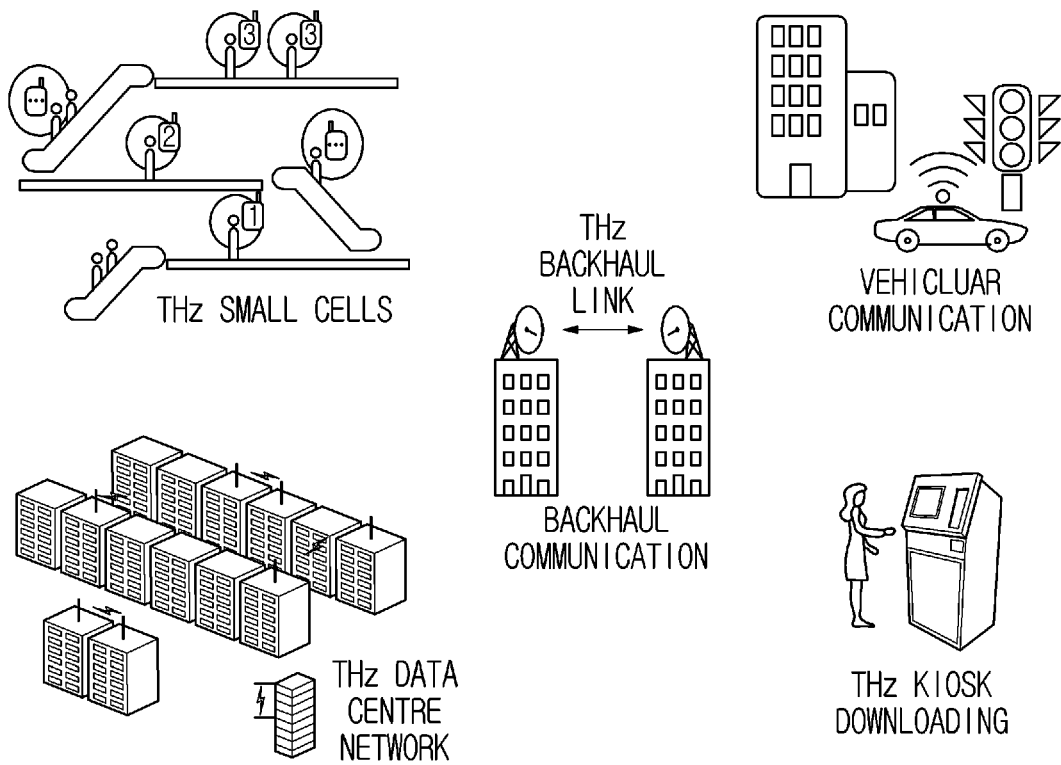
FIG. 17 is a view showing a THz communication method applicable to the present disclosure.

FIG. 17 is a view showing a THz communication method applicable to the present disclosure.

Referring to FIG. 17, THz wireless communication uses a THz wave having a frequency of approximately 0.1 to 10 THz (1 THz=1012 Hz), and may mean terahertz (THz) band wireless communication using a very high carrier frequency of 100 GHz or more. The THz wave is located between radio frequency (RF)/millimeter (mm) and infrared bands, and (i) transmits non-metallic/non-polarizable materials better than visible/infrared rays and has a shorter wavelength than the RF/millimeter wave and thus high straightness and is capable of beam convergence.

In addition, the photon energy of the THz wave is only a few meV and thus is harmless to the human body. A frequency band which will be used for THz wireless communication may be a D-band (110 GHz to 170 GHz) or a H-band (220 GHz to 325 GHz) band with low propagation loss due to molecular absorption in air. Standardization discussion on THz wireless communication is being discussed mainly in IEEE 802.15 THz working group (WG), in addition to 3GPP, and standard documents issued by a task group (TG) of IEEE 802.15 (e.g., TG3d, TG3e) specify and supplement the description of this disclosure. The THz wireless communication may be applied to wireless cognition, sensing, imaging, wireless communication, and THz navigation.

Specifically, referring to FIG. 17, a THz wireless communication scenario may be classified into a macro network, a micro network, and a nanoscale network. In the macro network, THz wireless communication may be applied to vehicle-to-vehicle (V2V) connection and backhaul/fronthaul connection. In the micro network, THz wireless communication may be applied to near-field communication such as indoor small cells, fixed point-to-point or multipoint connection such as wireless connection in a data center or kiosk downloading. Table 5 below shows an example of technology which may be used in the THz wave.

TABLE 5

| | |
|---|---|
| Transceivers Device | Available immature: UTC-PD, RTD and SBD |
| Modulation and coding | Low order modulation techniques (OOK, QPSK), LDPC, Reed Soloman, Hamming, Polar, Turbo |
| Antenna | Omni and Directional, phased array with low number of antenna elements |
| Bandwidth | 69 GHz (or 23 GHz) at 300 GHz |
| Channel models | Partially |
| Data rate | 100 Gbps |
| Outdoor deployment | No |
| Free space loss | High |
| Coverage | Low |
| Radio Measurements | 300 GHz indoor |
| Device size | Few micrometers |

Figure 18:
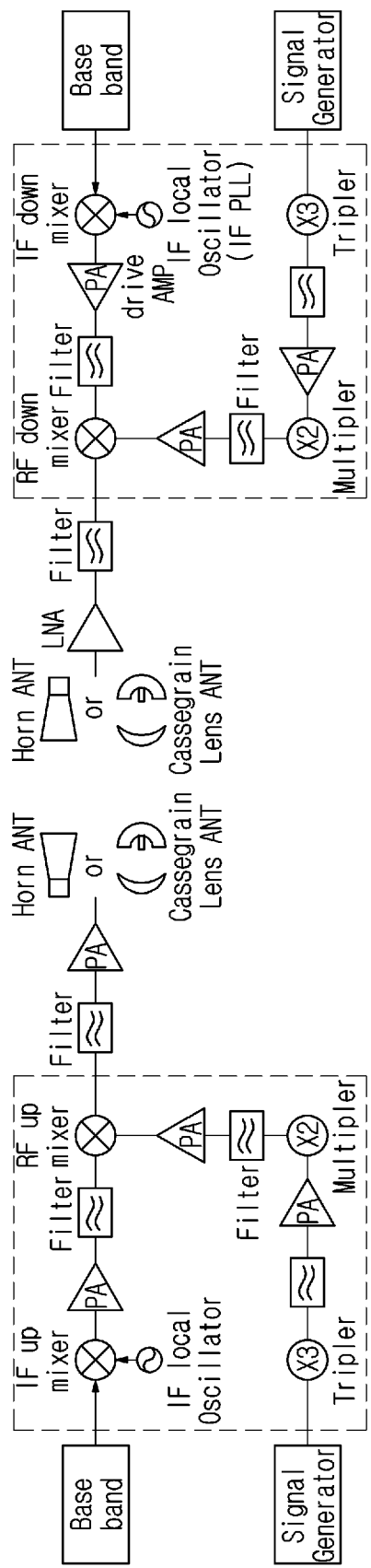
FIG. 18 is a view showing a THz wireless communication transceiver applicable to the present disclosure.

FIG. 18 is a view showing a THz wireless communication transceiver applicable to the present disclosure. Referring to FIG. 18, THz wireless communication may be classified based on the method of generating and receiving THz. The THz generation method may be classified as an optical component or electronic component based technology.

At this time, the method of generating THz using an electronic component includes a method using a semiconductor component such as a resonance tunneling diode (RTD), a method using a local oscillator and a multiplier, a monolithic microwave integrated circuit (MMIC) method using a compound semiconductor high electron mobility transistor (HEMT) based integrated circuit, and a method using a Si-CMOS-based integrated circuit. In the case of FIG. 18, a multiplier (doubler, tripler, multiplier) is applied to increase the frequency, and radiation is performed by an antenna through a subharmonic mixer. Since the THz band forms a high frequency, a multiplier is essential. Here, the multiplier is a circuit having an output frequency which is N times an input frequency, and matches a desired harmonic frequency, and filters out all other frequencies. In addition, beamforming may be implemented by applying an array antenna or the like to the antenna of FIG. 18. In FIG. 18, IF represents an intermediate frequency, a tripler and a multiplier represents a multiplier, PA represents a power amplifier, and LNA represents a low noise amplifier, and PLL represents a phase-locked loop.

Figure 19:
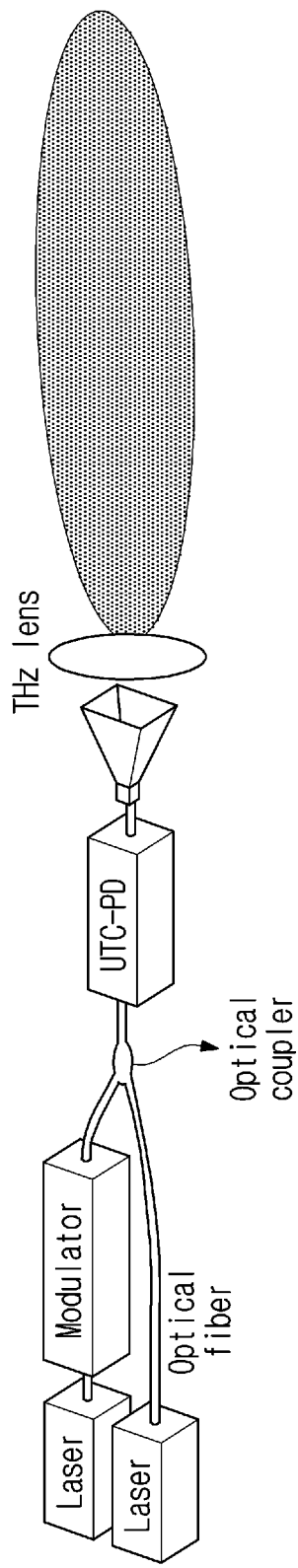
FIG. 19 is a view showing a THz signal generation method applicable to the present disclosure.
Figure 20:
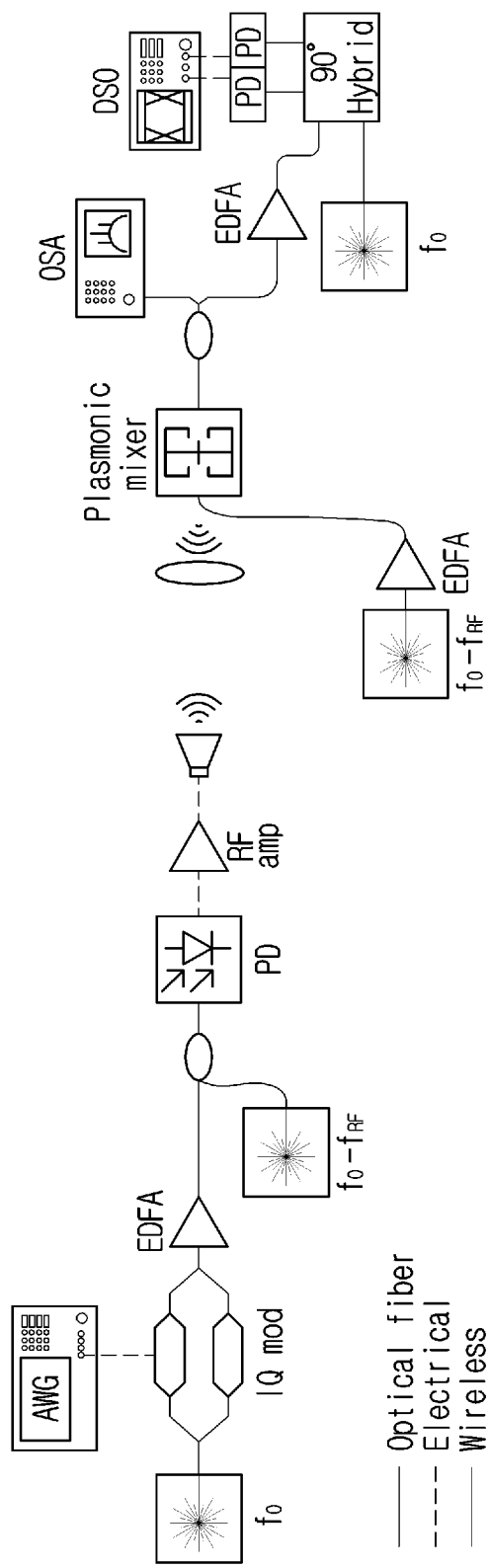
FIG. 20 is a view showing a wireless communication transceiver applicable to the present disclosure.

FIG. 19 is a view showing a THz signal generation method applicable to the present disclosure. FIG. 20 is a view showing a wireless communication transceiver applicable to the present disclosure.

Referring to FIGS. 19 and 20, the optical component-based THz wireless communication technology means a method of generating and modulating a THz signal using an optical component. The optical component-based THz signal generation technology refers to a technology that generates an ultrahigh-speed optical signal using a laser and an optical modulator, and converts it into a THz signal using an ultrahigh-speed photodetector. This technology is easy to increase the frequency compared to the technology using only the electronic component, can generate a high-power signal, and can obtain a flat response characteristic in a wide frequency band. In order to generate the THz signal based on the optical component, as shown in FIG. 19, a laser diode, a broadband optical modulator, and an ultrahigh-speed photodetector are required. In the case of FIG. 19, the light signals of two lasers having different wavelengths are combined to generate a THz signal corresponding to a wavelength difference between the lasers. In FIG. 19, an optical coupler refers to a semiconductor component that transmits an electrical signal using light waves to provide coupling with electrical isolation between circuits or systems, and a uni-travelling carrier photo-detector (UTC-PD) is one of photodetectors, which uses electrons as an active carrier and reduces the travel time of electrons by bandgap grading. The UTC-PD is capable of photodetection at 150 GHz or more. In FIG. 20, an erbium-doped fiber amplifier (EDFA) represents an optical fiber amplifier to which erbium is added, a photo detector (PD) represents a semiconductor component capable of converting an optical signal into an electrical signal, and OSA represents an optical sub assembly in which various optical communication functions (e.g., photoelectric conversion, electrophotic conversion, etc.) are modularized as one component, and DSO represents a digital storage oscilloscope.

Figure 21:
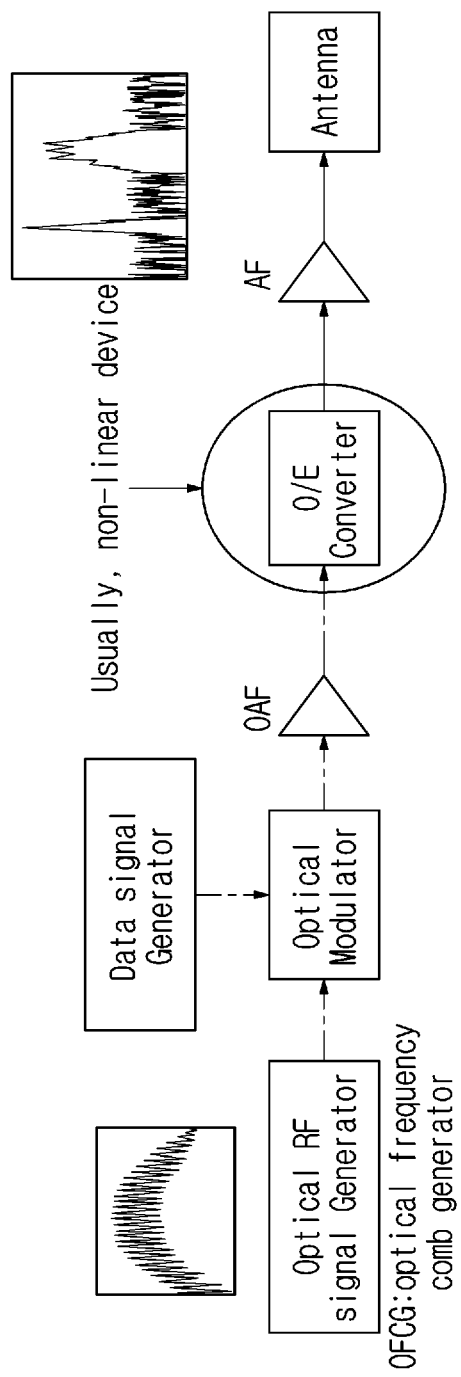
FIG. 21 is a view showing a transmitter structure applicable to the present disclosure.
Figure 22:
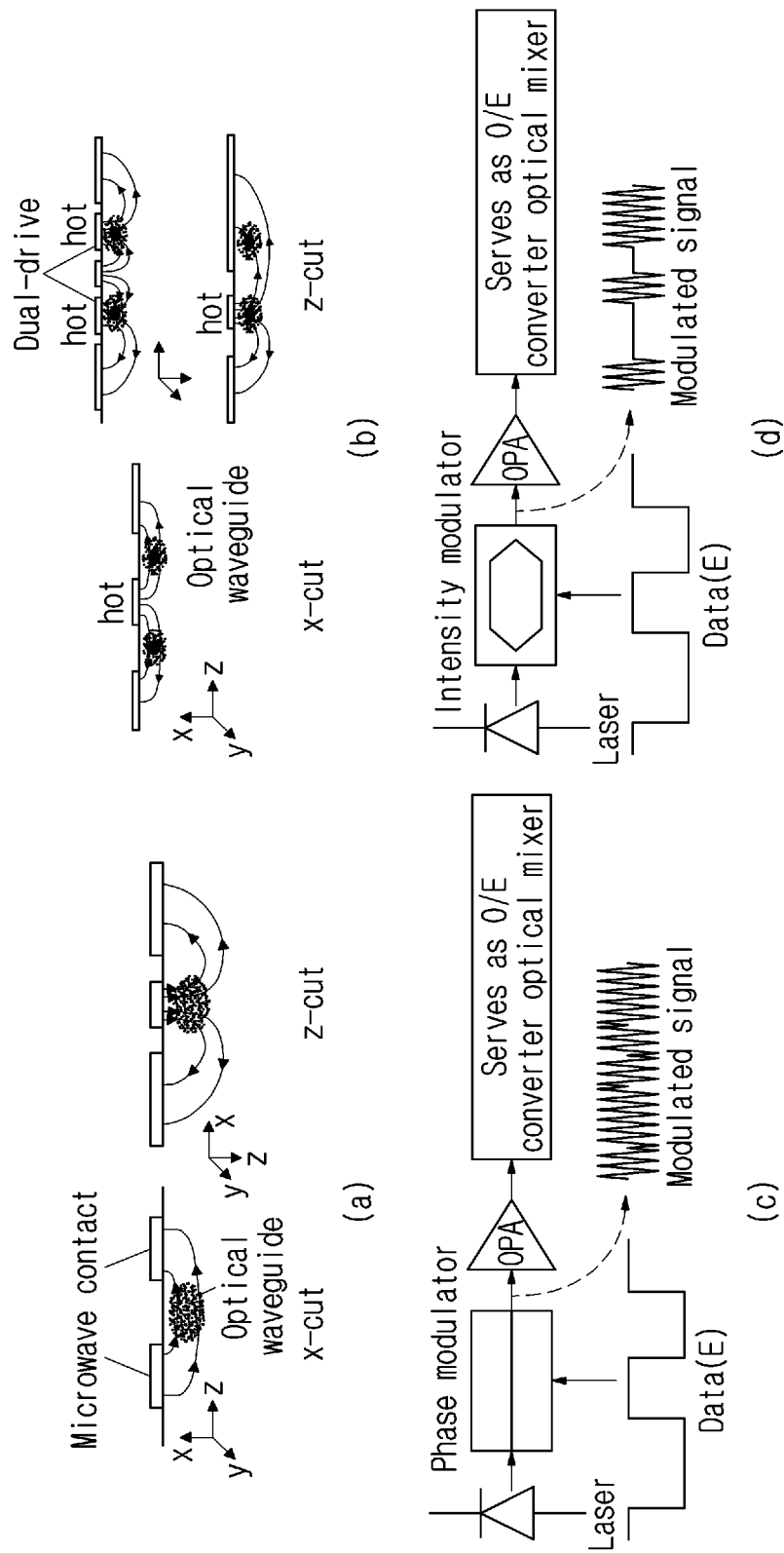
FIG. 22 is a view showing a modulator structure applicable to the present disclosure.

FIG. 21 is a view showing a transmitter structure applicable to the present disclosure. FIG. 22 is a view showing a modulator structure applicable to the present disclosure.

Referring to FIGS. 21 and 22, generally, the optical source of the laser may change the phase of a signal by passing through the optical wave guide. At this time, data is carried by changing electrical characteristics through microwave contact or the like. Thus, the optical modulator output is formed in the form of a modulated waveform. A photoelectric modulator (O/E converter) may generate THz pulses according to optical rectification operation by a nonlinear crystal, photoelectric conversion (O/E conversion) by a photoconductive antenna, and emission from a bunch of relativistic electrons. The terahertz pulse (THz pulse) generated in the above manner may have a length of a unit from femto second to pico second. The photoelectric converter (O/E converter) performs down conversion using non-linearity of the component.

Given THz spectrum usage, multiple contiguous GHz bands are likely to be used as fixed or mobile service usage for the terahertz system. According to the outdoor scenario criteria, available bandwidth may be classified based on oxygen attenuation 10^2 dB/km in the spectrum of up to 1 THz. Accordingly, a framework in which the available bandwidth is composed of several band chunks may be considered. As an example of the framework, if the length of the terahertz pulse (THz pulse) for one carrier (carrier) is set to 50 ps, the bandwidth (BW) is about 20 GHz.

Effective down conversion from the infrared band to the terahertz band depends on how to utilize the nonlinearity of the O/E converter. That is, for down-conversion into a desired terahertz band (THz band), design of the photoelectric converter (O/E converter) having the most ideal nonlinearity to move to the corresponding terahertz band (THz band) is required. If a photoelectric converter (O/E converter) which is not suitable for a target frequency band is used, there is a high possibility that an error occurs with respect to the amplitude and phase of the corresponding pulse.

In a single carrier system, a terahertz transmission/reception system may be implemented using one photoelectric converter. In a multi-carrier system, as many photoelectric converters as the number of carriers may be required, which may vary depending on the channel environment. Particularly, in the case of a multi-carrier system using multiple broadbands according to the plan related to the above-described spectrum usage, the phenomenon will be prominent. In this regard, a frame structure for the multi-carrier system can be considered. The down-frequency-converted signal based on the photoelectric converter may be transmitted in a specific resource region (e.g., a specific frame). The frequency domain of the specific resource region may include a plurality of chunks. Each chunk may be composed of at least one component carrier (CC).

Artificial Intelligence System

Figure 23:
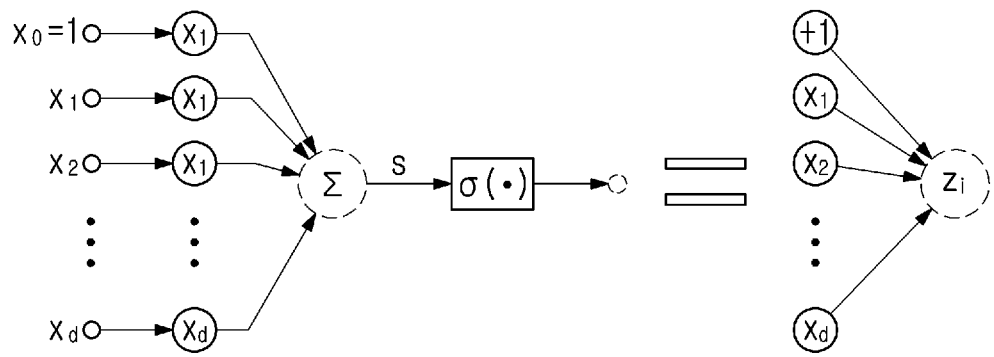
FIG. 23 is a view showing a perceptron architecture in an artificial neural network applicable to the present disclosure.
Figure 24:
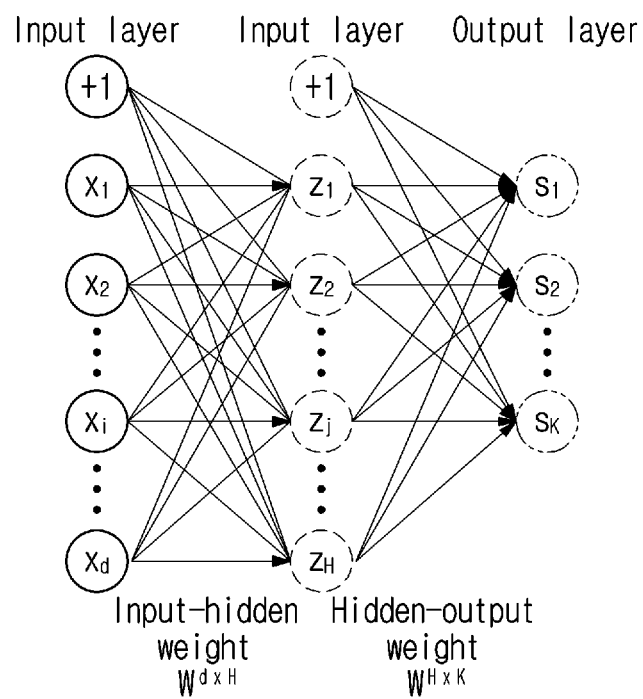
FIG. 24 is a view showing an artificial neural network architecture applicable to the present disclosure.

FIG. 23 is a view showing a perceptron architecture in an artificial neural network applicable to the present disclosure. In addition, FIG. 24 is a view showing an artificial neural network architecture applicable to the present disclosure.

As described above, an artificial intelligence system may be applied to a 6G system. Herein, as an example, the artificial intelligence system may operate based on a learning model corresponding to the human brain, as described above. Herein, a paradigm of machine learning, which uses a neural network architecture with high complexity like artificial neural network, may be referred to as deep learning. In addition, neural network cores, which are used as a learning scheme, are mainly a deep neural network (DNN), a convolutional deep neural network (CNN), and a recurrent neural network (RNN). Herein, as an example referring to FIG. 23, an artificial neural network may consist of a plurality of perceptrons. Herein, when an input vector $x=\{x1, x2, \ldots, xd\}$ is input, each component is multiplied by a weight $\{W1, W2, \ldots, Wd\}$, results are all added up, and then an activation function $\sigma(\ )$ is applied, of which the overall process may be referred to as a perceptron. For a large artificial neural network architecture, when expanding the simplified perceptron structure illustrated in FIG. 23, an input may be applied to different multidimensional perceptrons. For convenience of explanation, an input value or an output value will be referred to as a node.

Meanwhile, the perceptron structure illustrated in FIG. 23 may be described to consist of a total of 3 layers based on an input value and an output value. An artificial neural network, which has H (d+1)-dimensional perceptrons between a 1st layer and a 2nd layer and K (H+1)-dimensional perceptrons between the 2nd layer and a 3rd layer, may be expressed as in FIG. 24.

Herein, a layer, in which an input vector is located, is referred to as an input layer, a layer, in which a final output value is located, is referred to as an output layer, and all the layers between the input layer and the output layer are referred to as hidden layers. As an example, 3 layers are disclosed in FIG. 24, but since an input layer is excluding in counting the number of actual artificial neural network layers, it can be understood that the artificial neural network illustrated in FIG. 23 has a total of 2 layers. An artificial neural network is constructed by connecting perceptrons of a basic block two-dimensionally.

The above-described input layer, hidden layer and output layer are commonly applicable not only to multilayer perceptrons but also to various artificial neural network architectures like CNN and RNN, which will be described below. As there are more hidden layers, an artificial neural network becomes deeper, and a machine learning paradigm using a sufficiently deep artificial neural network as a learning model may be referred to as deep learning. In addition, an artificial neural network used for deep learning may be referred to as a deep neural network (DNN).

Figure 25:
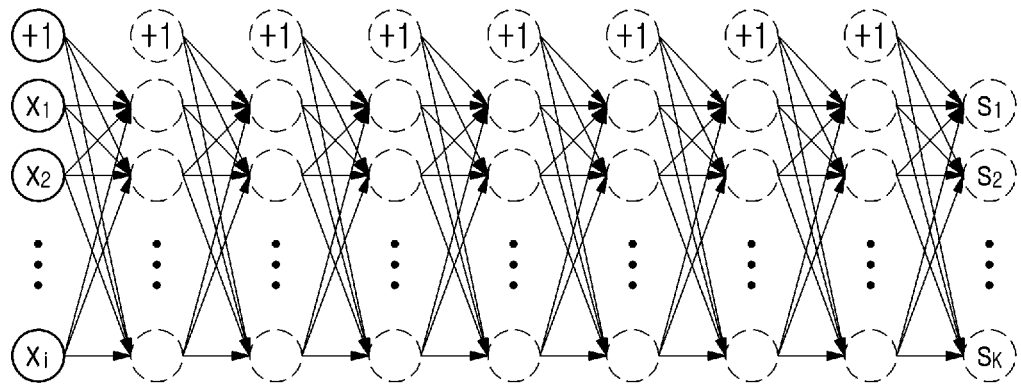
FIG. 25 is a view showing a deep neural network applicable to the present disclosure.

FIG. 25 is a view showing a deep neural network applicable to the present disclosure.

Referring to FIG. 25, a deep neural network may be a multilayer perceptron consisting of 8 layers (hidden layers+ output layer). Herein, the multilayer perceptron structure may be expressed as a fully-connected neural network. In a fully-connected neural network, there may be no connection between nodes in a same layer and only nodes located in neighboring layers may be connected with each other. A DNN has a fully-connected neural network structure combining a plurality of hidden layers and activation functions so that it may be effectively applied for identifying a correlation characteristic between an input and an output. Herein, the correlation characteristic may mean a joint probability between the input and the output.

Figure 26:
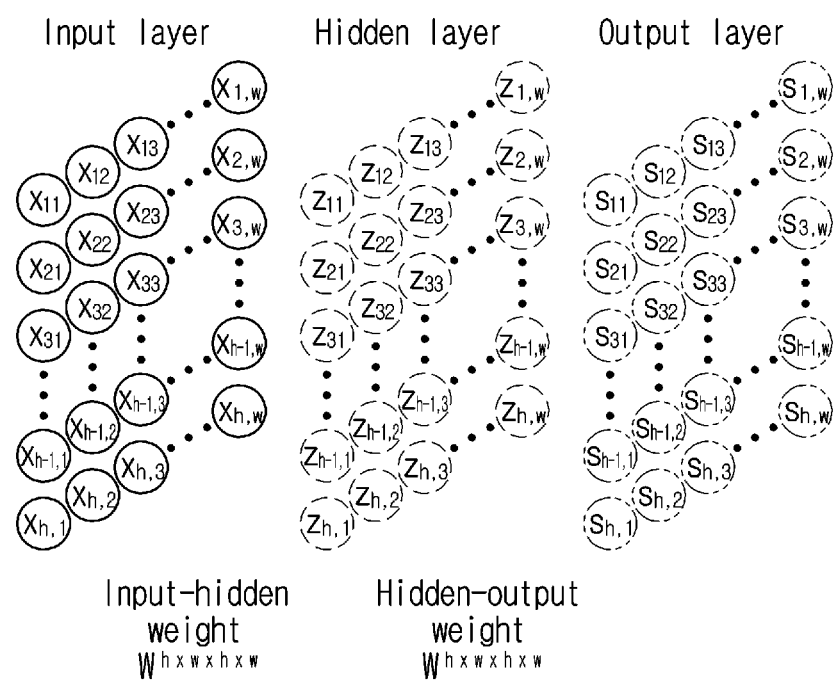
FIG. 26 is a view showing a convolutional neural network applicable to the present disclosure.
Figure 27:
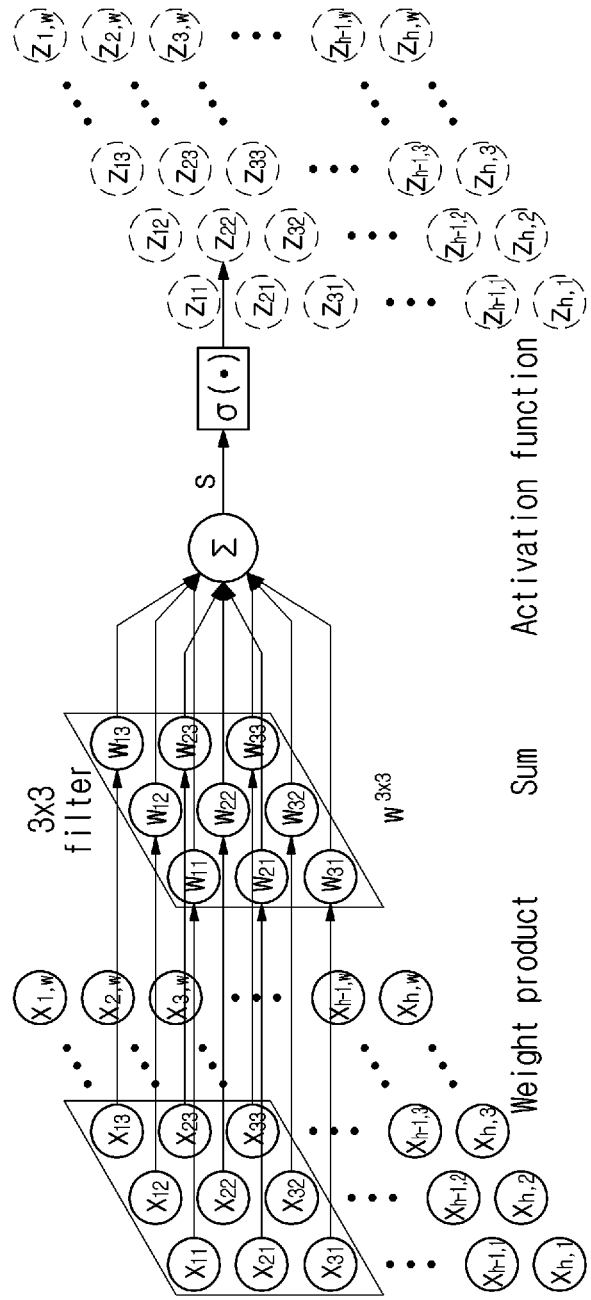
FIG. 27 is a view showing a filter operation of a convolutional neural network applicable to the present disclosure.

FIG. 26 is a view showing a convolutional neural network applicable to the present disclosure. In addition, FIG. 27 is a view showing a filter operation of a convolutional neural network applicable to the present disclosure.

As an example, depending on how to connect a plurality of perceptrons, it is possible to form various artificial neural network structures different from the above-described DNN. Herein, in the DNN, nodes located in a single layer are arranged in a one-dimensional vertical direction. However, referring to FIG. 26, it is possible to assume a two-dimensional array of w horizontal nodes and h vertical nodes (the convolutional neural network structures of FIG. 26). In this case, since a weight is applied to each connection in a process of connecting one input node to a hidden layer, a total of h×w weights should be considered. As there are h×w nodes in an input layer, a total of $h^2w^2$ weights may be needed between two neighboring layers.

Furthermore, as the convolutional neural network of FIG. 26 has the problem of exponential increase in the number of weights according to the number of connections, the presence of a small filter may be assumed instead of considering every mode of connections between neighboring layers. As an example, as shown in FIG. 27, weighted summation and activation function operation may be enabled for a portion overlapped by a filter.

At this time, one filter has a weight corresponding to a number as large as its size, and learning of a weight may be performed to extract and output a specific feature on an image as a factor. In FIG. 27, a 3×3 filter may be applied to a top rightmost 3×3 area of an input layer, and an output value, which is a result of the weighted summation and activation function operation for a corresponding node, may be stored at $z_{22}$.

Herein, as the above-described filter scans the input layer while moving at a predetermined interval horizontally and vertically, a corresponding output value may be put a position of a current filter. Since a computation method is similar to a convolution computation for an image in the field of computer vision, such a structure of deep neural network may be referred to as a convolutional neural network (CNN), and a hidden layer created as a result of convolution computation may be referred to as a convolutional layer. In addition, a neural network with a plurality of convolutional layers may be referred to as a deep convolutional neural network (DCNN).

In addition, at a node in which a current filter is located in a convolutional layer, a weighted sum is calculated by including only a node in an area covered by the filter and thus the number of weights may be reduced. Accordingly, one filter may be so used as to focus on a feature of a local area. Thus, a CNN may be effectively applied to image data processing for which a physical distance in a two-dimensional area is a crucial criterion of determination. Meanwhile, a CNN may apply a plurality of filters immediately before a convolutional layer and create a plurality of output results through a convolution computation of each filter.

Meanwhile, depending on data properties, there may be data of which a sequence feature is important. A recurrent neural network structure may be a structure obtained by applying a scheme, in which elements in a data sequence are input one by one at each timestep by considering the distance variability and order of such sequence datasets and an output vector (hidden vector) output at a specific timestep is input with a very next element in the sequence, to an artificial neural network.

Figure 28:
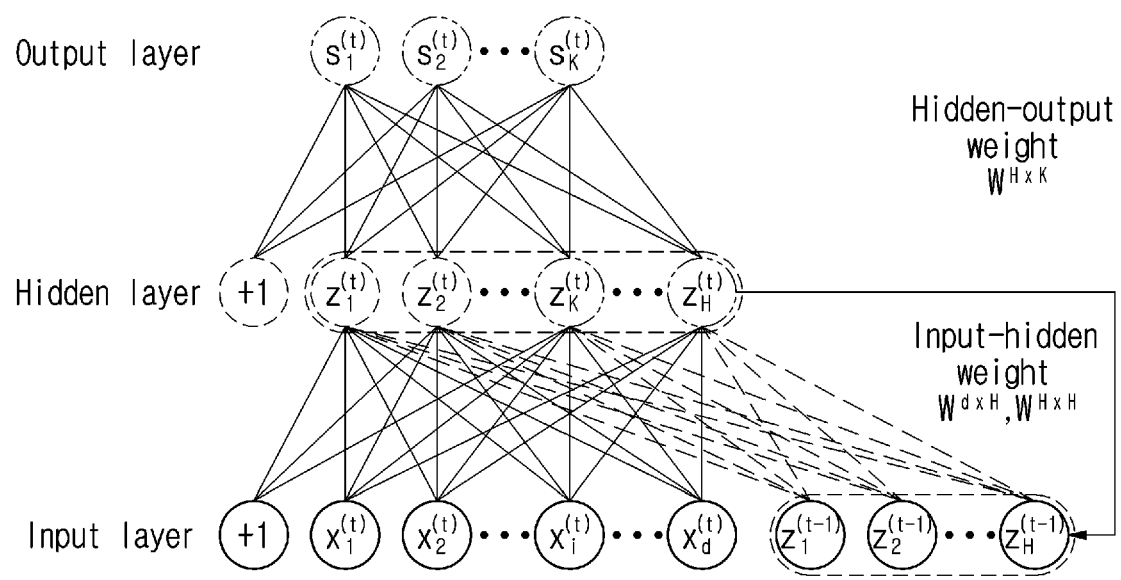
FIG. 28 is a view showing a neural network architecture with a recurrent loop applicable to the present disclosure.
Figure 29:
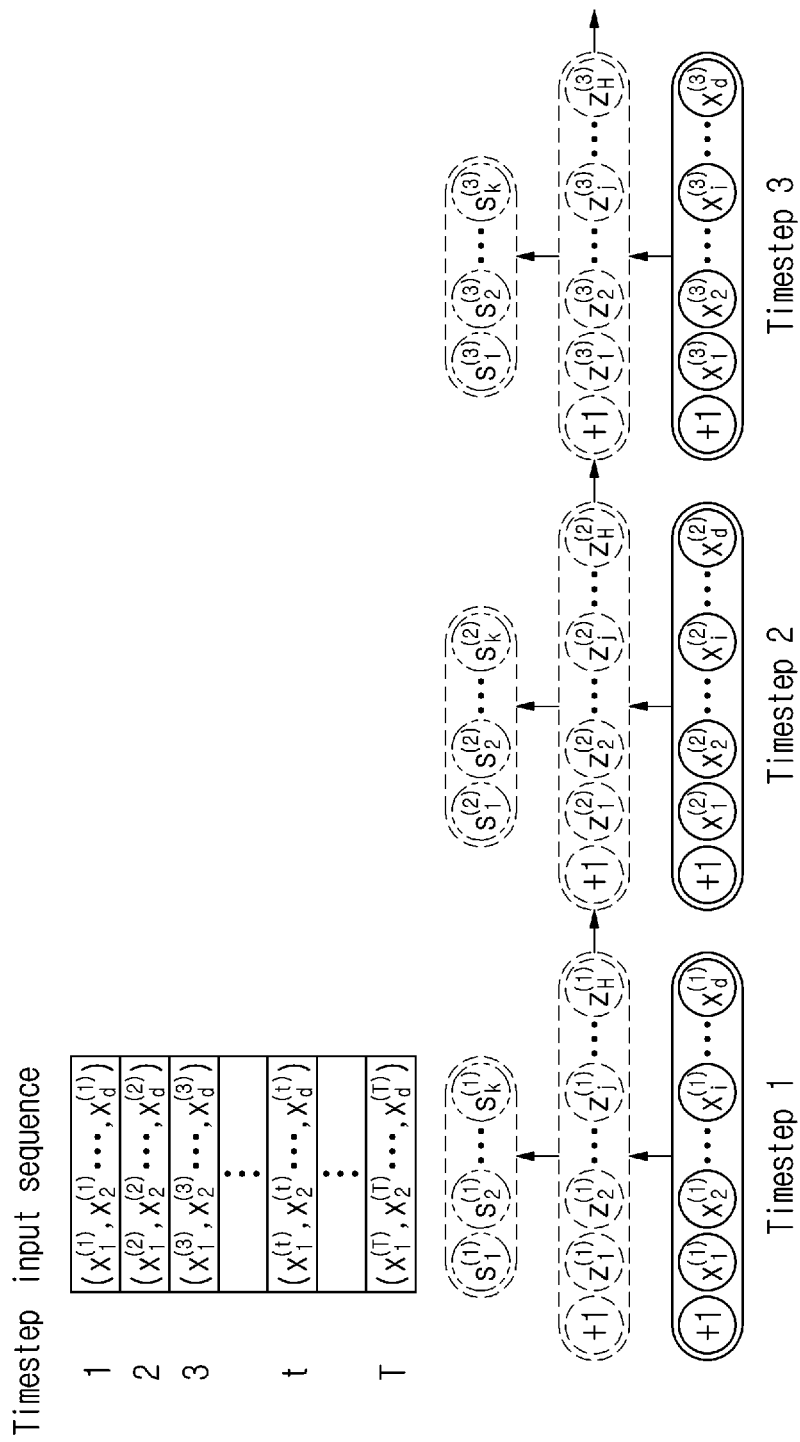
FIG. 29 is a view showing an operational structure of a recurrent neural network applicable to the present disclosure.

FIG. 28 is a view showing a neural network architecture with a recurrent loop applicable to the present disclosure. FIG. 29 is a view showing an operational structure of a recurrent neural network applicable to the present disclosure.

Referring to FIG. 28, a recurrent neural network (RNN) may have a structure which applies a weighted sum and an activation function by inputting hidden vectors $\{z_1^{(t-1)}, z_2^{(t-1)}, \ldots, z_H^{(t-1)}\}$ of an immediately previous timestep t−1 during a process of inputting elements $\{x_1^{(t)}, x_2^{(t)}, \ldots, x_d^{(t)}\}$ of a timestep t in a data sequence into a fully connected neural network. The reason why such hidden vectors are forwarded to a next timestep is because information in input vectors at previous timesteps is considered to have been accumulated in a hidden vector of a current timestep.

In addition, referring to FIG. 29, a recurrent neural network may operate in a predetermined timestep order for an input data sequence. Herein, as a hidden vector $\{z_1^{(1)}, z_2^{(1)}, \ldots, z_H^{(1)}\}$ at a time of inputting an input vector $\{x_1^{(t)}, x_2^{(t)}, \ldots, x_d^{(t)}\}$ of timestep 1 into a recurrent neural network is input together with an input vector $\{x_1^{(2)}, x_2^{(2)}, \ldots, x_d^{(2)}\}$ of timestep 2, a vector $\{z_1^{(2)}, z_2^{(2)}, \ldots, z_H^{(2)}\}$ of a hidden layer is determined through a weighted sum and an activation function. Such a process is iteratively performed at timestep 2, timestep 3 and until timestep T.

Meanwhile, when a plurality of hidden layers are allocated in a recurrent neural network, this is referred to as a deep recurrent neural network (DRNN). A recurrent neural network is so designed as to effectively apply to sequence data (e.g., natural language processing).

Apart from DNN, CNN and RNN, other neural network cores used as a learning scheme include various deep learning techniques like restricted Boltzmann machine (RBM), deep belief networks (DBN) and deep Q-Network, and these may be applied to such areas as computer vision, voice recognition, natural language processing, and voice/signal processing.

Recently, there are attempts to integrate AI with a wireless communication system, but these are concentrated in an application layer and a network layer and, especially in the case of deep learning, in a wireless resource management and allocation filed. Nevertheless, such a study gradually evolves to an MAC layer and a physical layer, and there are attempts to combine deep learning and wireless transmission especially in a physical layer. As for a fundamental signal processing and communication mechanism, AI-based physical layer transmission means application of a signal processing and communication mechanism based on an AI driver, instead of a traditional communication framework. For example, it may include deep learning-based channel coding and decoding, deep learning-based signal estimation and detection, deep learning-based MIMO mechanism, and AI-based resource scheduling and allocation.

In the description below, a method of transmitting and receiving a signal by a device based on a real-time channel-adaptive polar code in a wireless communication system will be described. Hereinafter, a method of transmitting and receiving a signal based on a real-time channel-adaptive polar code will be described based on a transmitter and a receiver. Herein, the transmitter may be a terminal, and the receiver may be a base station. In addition, as an example, the transmitter may be a base station, and the receiver may be a terminal. As another example, both the transmitter and the receiver may be terminals. In addition, the transmitter and the receiver may be other devices and are not limited to the above-described embodiment.

Hereinafter, for convenience of explanation, the description will be provided based on a transmitter as a terminal and a receiver as a base station, but it may be obvious that the description is not limited thereto and is applicable to other transmitter and receiver types likewise.

Figure 30:
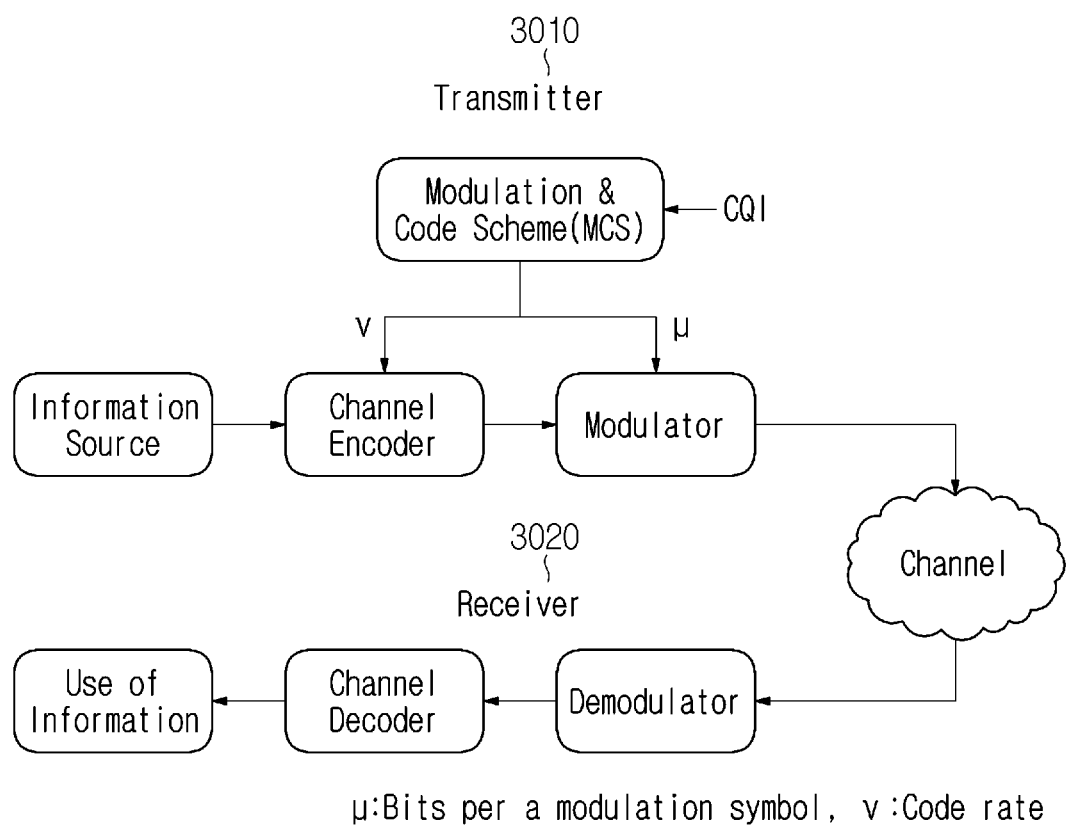
FIG. 30 is a view showing a method for transmitting and receiving a signal applicable to the present disclosure.

FIG. 30 is a view showing a method for transmitting and receiving a signal applicable to the present disclosure.

The channel environment of a wireless communication channel may vary according to a situation. Herein, each channel environment may have a different optimal channel code. In addition, as an example, an optimal channel code may be different based on the decoding complexity of a receiver. As an example, when the decoding complexity of a receiver increases, decoding latency may become higher. Herein, optimal channel codes applied in consideration of the decoding complexity may be different. In addition, a polar code may ensure higher performance than an existing channel code, but when the decoding complexity of a receiver increases for the polar code, decoding latency may occur, and optimal channel codes may be different according to the decoding complexity. That is, an optimal channel code may be different according to a channel environment and the decoding complexity of a receiver. Herein, in an existing communication system, only a code rate and a modulation order are adjusted by considering a channel environment for a preset channel code, but no optimal channel code is selected by considering a communication channel environment that changes in real time.

However, since the decoding complexity of a receiver gradually increases and low latency and high throughput are to be considered, a system of flexibly selecting an optimal channel code by considering the decoding complexity of a terminal in a communication channel environment, which changes in real time, and a method thereof may be needed. Hereinafter, a polar code will be described as a channel code.

Herein, referring to FIG. 30, a transmitter 3010 may perform channel encoding and modulation for a data (or information) source and transmit data to a receiver 3020 through a channel. Then, the receiver 3020 may restore final data by performing demodulation and decoding for the received data. Herein, a channel encoder of the transmitter 3010 and a channel decoder of the receiver 3020 may adjust a code rate and a modulation order ($\mu$: bits per a modulation symbol) through a modulation and coding scheme (MCS) by using channel state information (channel quality indicator, CQI). Specifically, the transmitter 3010 may transmit a reference signal for channel measurement to the receiver 3020, determine an MCS based on CQI feedback from the receiver, and then confirm a final code rate and a modulation order. Herein, as described above, since an existing communication system uses an MCS processing scheme that changes only a code rate and a modulation order with a fixed channel coding structure, there is a limitation in performing optimization for a channel environment changing in real time.

In consideration of what is described above, a transmitter and a receiver may select an optimal polar code in a channel environment changing in real time by using an artificial intelligence searching for an optimal channel-adaptive polar code in real time.

Herein, as an example, a polar code may be a code that achieves channel capacity by using channel polarization. As an example, a polar code may derive N input bits at a rate corresponding to channel capacity of W based on channel polarization. A polar code may be a scheme in which an index for K bits with good channel capacity is selected from the N input bits, information to be transmitted is input therein, a fixed value (usually, 0) is input into the remaining (N−K) bits and is encoded, and then transmission is performed through a channel. That is, K index message bits are input, a fixed bit is input into N−K bits, and an N output bits may be finally transmitted through a channel. Herein, as an example, when the characteristic of a channel is changed, a polar encoding process may be different, and K subchannels selected as an optimal polar code may become different accordingly.

Figure 31:
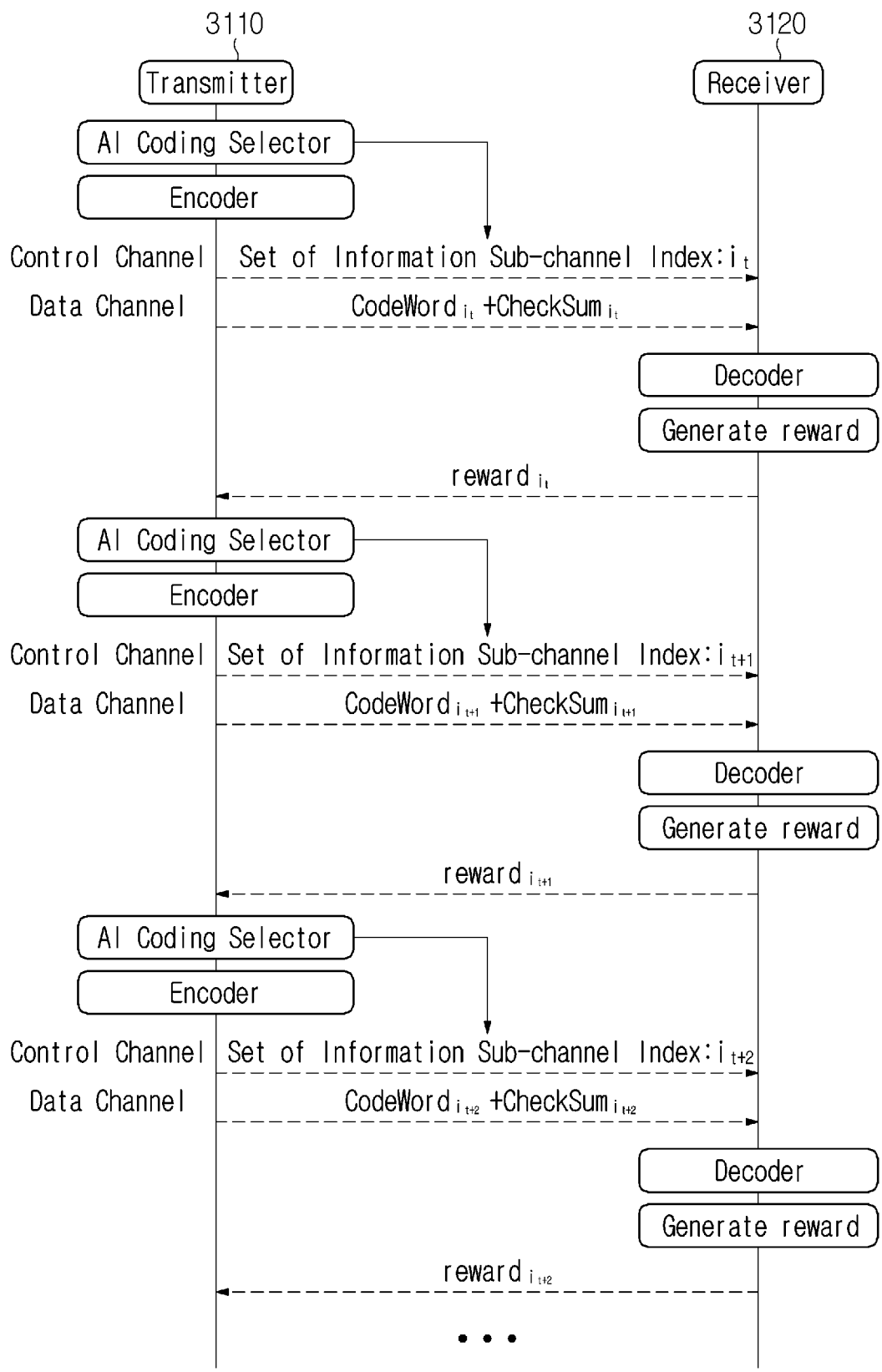
FIG. 31 is a view showing a method for performing real-time optimal channel-adaptive polar code search applicable to the present disclosure.

FIG. 31 is a view showing a method for performing real-time optimal channel-adaptive polar code search applicable to the present disclosure. Herein, as an example, referring to FIG. 31, a transmitter 3110 may select K information subchannels among N subchannels through an artificial intelligence. As an example, the transmitter 3110 may include an AI coding selector. The AI coding selector may select K information subchannels using an AI algorithm based on history information for a channel environment. As an example, the transmitter 3110 may derive an AI coding initial value. Herein, the transmitter 3110 may transmit a reference signal and location information to a receiver 3120. The receiver 3120 may generate an AI coding initial value through AI learning by using the reference signal and the location information of the transmitter 3110 and forward the initial value to the transmitter 3110, which will be described below. In addition, the AI coding selector is merely one example and is not limited to the above-described configuration, and K information subchannels may be determined based on a process of the transmitter 3110.

Based on the selected K information subchannels, the transmitter 3110 may input information bits, fix the remaining (N−K) subchannels (that is, input 0), and then perform polar encoding through polar transformation. Herein, the transmitter 3110 may add cyclic redundancy check (CRC) bits to polar-encoded bits and transmit the bits to the receiver 3120. Herein, as an example, the transmitter 3110 may transmit information associated with K information subchannels together with data. As an example, the information associated with K information subchannels may be index set information of K values and K information subchannels and is not limited to the above-described embodiment. In addition, the transmitter 3110 may transmit the above-described information to the receiver 3120 through a control channel. As another example, the transmitter 3110 may piggyback the information associated with K information subchannels on data and transmit the information and the data to the receiver 3120, but is not limited to the above-described embodiment.

Then, the receiver 3120 may perform decoding based on index set information of the K information subchannels as the information associated with the K information subchannels. As an example, the receiver 3120 may include a polar code detector and thus decode polar-transformed data. The receiver 3120 may detect an error through decoding and generate reward information based on a detected error rate. As an example, the receiver 3120 may generate a reward based on one codeword. As another example, the receiver 3120 may generate a reward after receiving a plurality of blocks in a batch form and give feedback to the transmitter 3110, but is not limited to the above-described embodiment.

That is, after performing decoding, the receiver 3120 may send reward information, that is, result information based on the decoding as feedback to the transmitter 3110. Herein, the transmitter 3110 may reflect the feedback reward information in an AI algorithm and thus select an index for K information subchannels. At this time, the transmitter 3110 and the receiver 3120 repeat the above-described process and thus select an index of K information subchannels at a most suitable location.

Figure 32:
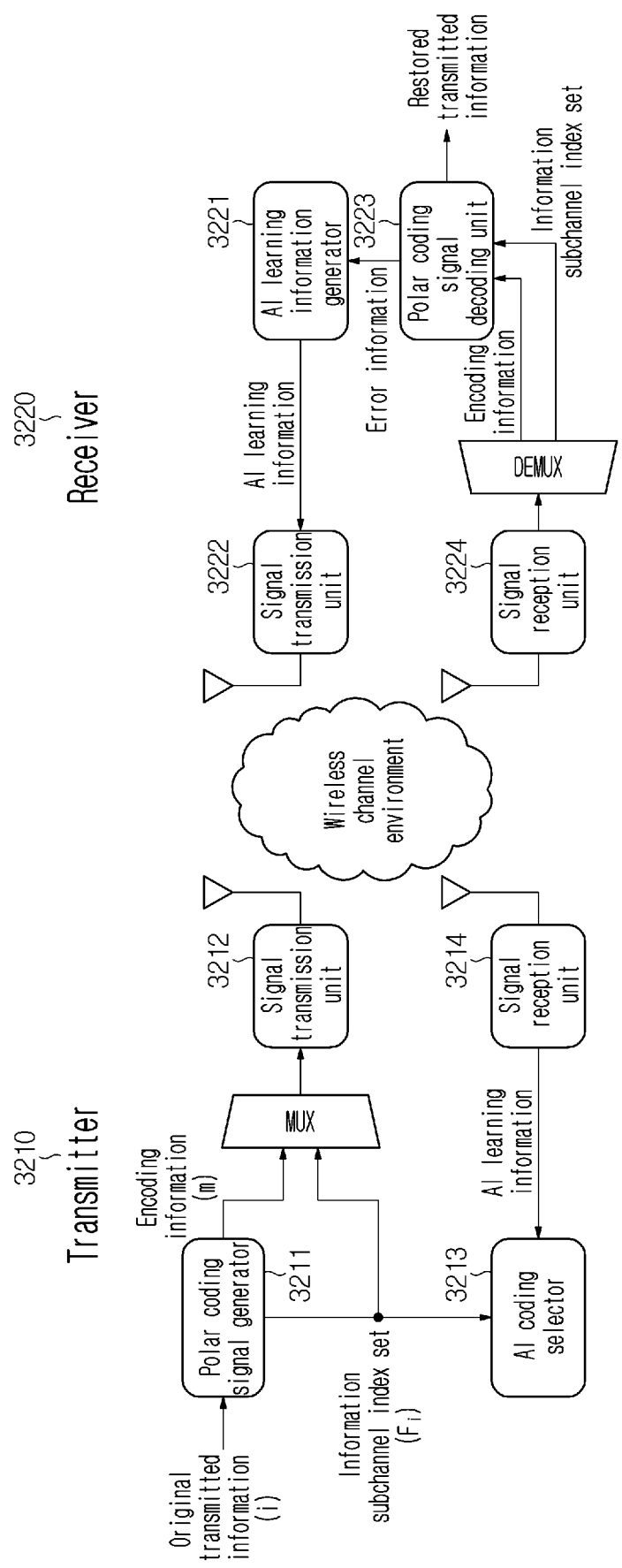
FIG. 32 is a view showing an artificial intelligence (AI) system that generates in real time a polar code optimized for a communication channel environment applicable to the present disclosure.

FIG. 32 is a view showing an artificial intelligence (AI) system that generates in real time a polar code optimized for a communication channel environment applicable to the present disclosure.

Referring to FIG. 32, a transmitter 3210 may include at least one of a polar coding signal generator 3211, a signal transmission unit 3212, an AI coding selector 3213, and a signal reception unit 3214. However, the above-described configuration of the transmitter 3210 is merely one example and is not limited to the above-described embodiment. As an example, a processor of the transmitter 3210 may perform operations of the polar coding signal generator 3211 and the AI coding selector 3213 but is not limited to a specific configuration. However, for convenience of explanation, the description below will be based on the polar coding signal generator 3211 and the AI coding selector 3213.

In addition, a receiver 3220 may also include at least one of an AI learning information generator 3221, a signal transmission unit 3222, a polar coding signal decoding unit 3223, and a signal reception unit 3224. However, the above-described configuration of the receiver 3220 is merely one example and is not limited to the above-described embodiment. As an example, a processor of the receiver 3220 may perform operations of the AI learning information generator 3221 and the polar coding signal decoding unit 3223 but is not limited to a specific configuration. However, for convenience of explanation, the description below will be based on the AI learning information generator 3221 and the polar coding signal decoding unit 3223.

As an example, the transmitter 3210 may select an AI coding-based polar code optimized from actual transmitted and received data in a given communication environment and perform transmission.

The polar coding signal generator 3211 of the transmitter 3210 may receive original transmitted information and an information subchannel set as an input, encode the information with CRC included therein by polar coding, and forward the encoded information to MUX. In addition, the AI coding selector 3213 of the transmitter 3210 may receive AI learning information as an input, select an information subchannel index set among N subchannels based on the information, and then forward the set to the polar coding signal generator 3211 and the MUX. Herein, as an example, the AI learning information may be the above-described reward information and is not limited to the above-described embodiment. Then, the transmitter transmits signals entering the MUX to the receiver 3220 through the signal transmission unit 3212 via a wireless channel environment. In addition, as an example, the transmitter may receive the above-described reward information from the receiver 3220 through the signal reception unit 3214, and this is the same as described above.

The receiver 3220 may decode data received through the signal reception unit 3224 via a wireless channel environment. Herein, the polar coding signal decoding unit 3223 of the receiver 3220 may perform polar coding decoding by using encoding information and an information subchannel index set. Thus, the receiver 3220 may restore transmitted information, output the restored transmitted information, and obtain error information through a CRC check. Then, the AI learning information generator 3221 of the receiver 3220 may perform AI learning by using the error information as a reward and transmit corresponding learning information to the transmitter 3210 through the signal transmission unit 3221. That is, the receiver 3220 may transmit reward information based on the error information to the transmitter 3210. The signal reception unit 3214 of the transmitter 3210 may forward the received reward information to the AI coding selector 3213, and the AI coding selector 3213 may determine an information subchannel index set by reflecting the reward information. Then, the AI coding selector 3213 may forward information on the determined information subchannel index set to the polar coding signal generator 3211. Herein, the transmitter 3210 and the receiver 3220 may perform learning by repeating the above-described operation.

Figure 33:
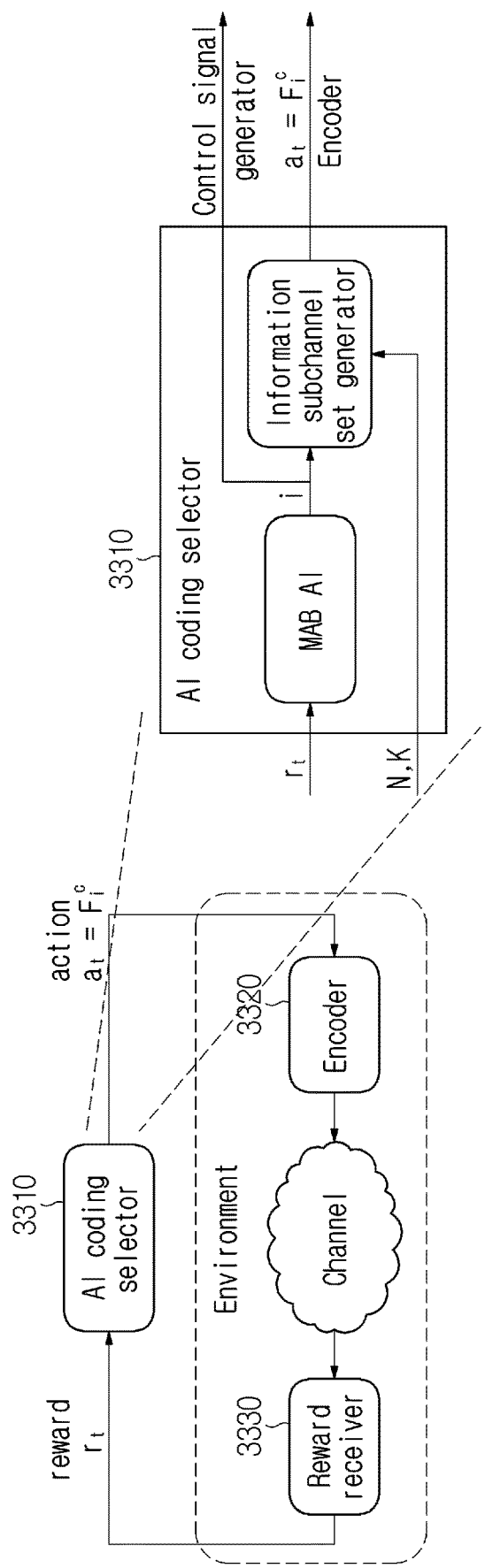
FIG. 33 is a view showing an artificial intelligence (AI) coding selector applicable to the present disclosure.

FIG. 33 is a view showing an artificial intelligence (AI) coding selector applicable to the present disclosure.

As described above, a transmitter may receive reward information from a receiver and select a polar code through AI learning based on the information. Herein, referring to FIG. 33, a transmitter may include an AI coding selector 3310. As an example, the AI coding selector 3310 may use a multi-armed bandit (MAB) AI scheme. The AI coding selector 3310 may select one of a maximum number of L candidates $\{F_i^c\}$ of an information subchannel set $F_i^c$. Herein, indexes corresponding to the selected information subchannel set $F_i^c$ may become a value i* for selecting an information subchannel set $F_{i*}^c$ through an information subchannel generator and be forwarded to a polar encoder. Then, when the transmitter receives reward information from the receiver, a next action may be predicted based on an accumulated reward $r_r$. Herein, the next action may be a prediction for an information subchannel set $a_i = F_i^c$. That is, the AI coding selector 3310 of the transmitter may determine an applied polar code by selecting K information subchannels among N subchannels based on the accumulated reward $r_r$.

Figure 34:
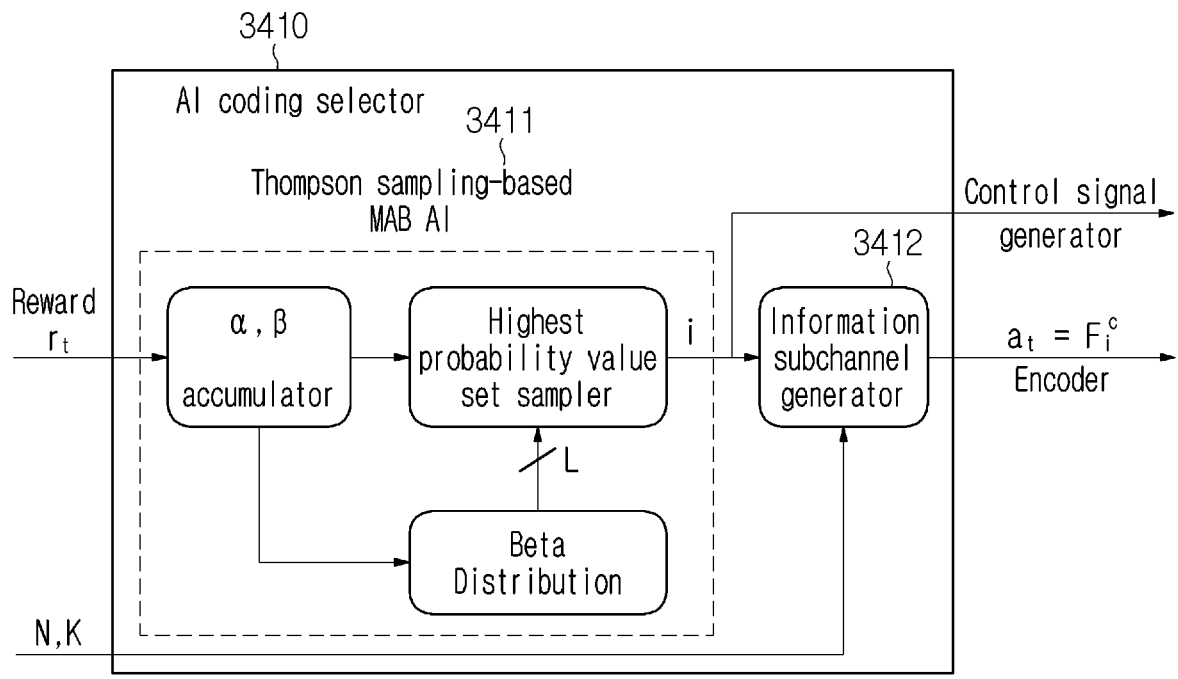
FIG. 34 is a view showing an artificial intelligence (AI) coding selector applicable to the present disclosure.

As a more concrete example, FIG. 34 is a view showing an artificial intelligence (AI) coding selector applicable to the present disclosure. Referring to FIG. 34, an AI coding selector 3410 may perform learning based on MAB AI 3411. Herein, the MAB AI 3411 may be an artificial intelligence using Thompson Sampling but is not limited thereto. As an example, the AI coding selector 3410 may select one of a plurality of information subchannel candidates $F_i^c$ by using Thompson Sampling. Then, when a transmitter receives a reward from a receiver, Thompson Sampling parameters α and β for a selected action (information subchannel set $F_i^c$) may be updated. Herein, α and β may be calculated according to a reward, as shown in Equation 1 below.

$$\alpha_i = \alpha_i + 1, \text{ if } R > R_{th}$$

$$\beta_i = \beta_i + 1, \text{ else} \hspace{2cm} \text{[Equation 1]}$$

Here, i may be an information subchannel set index, $F_i^c$ may be an information subchannel set with an index of i, and $R_{th}$ may be a reference reward value. As an example, in an MAB AI, $R_{th}$ may be compared with a reward $r_r$. Herein, a receiver may set a different form of reward. As a concrete example, the receiver may set different forms of rewards through an AI learning information selector but is not limited the above-described embodiment. As an example, a block error rate (BER), which indicates the performance of a batch size for a corresponding information subchannel set, or the complexity of the receiver may be forwarded to a reward, and a reward value reflecting it may be derived. That is, a reward may have various forms and is not limited to the above-described embodiment. The MAB AI may select $R_{th}$ by considering a reward form. Herein, the MAB AI may apply beta distribution to α and β accumulated based on Thompson Sampling and select an information subchannel set index having a largest value among sampled values. The beta distribution may be represented by Equation 2 below.

$$\text{Beta}(x \mid a, b) = \frac{1}{B(a, b)} x^{a-1}(1-x)^{b-1}, \hspace{1cm} \text{[Equation 2]}$$

$$B(a, b) = \int_0^1 x^{a-1}(1-x)^{b-1} dx$$

Then, the MAB AI 3411 may forward the selected information subchannel set index to the information subchannel generator 3412. The information subchannel generator 3412 may construct an information subchannel set $F_i^c$ corresponding to the forwarded index i and forward the set to a polar encoder. As an example, an information subchannel K selected for forwarding information may be different for each information subchannel index.

As a concrete example, referring to FIG. 34, a MAB AI may generate a selection probability value for a maximum number of L candidates of an information subchannel set $F_i^c$ through beta distribution and forward the value to a maximum probability value set sampler. Then, the maximum probability value set sampler may select an index i among the candidates for the information subchannel set $F_i^c$ based on the forwarded information. Then, an information subchannel set $F_i^c$ corresponding to the index i may be constructed and forwarded to a polar encoder so that encoding for data may be performed.

Figure 35:
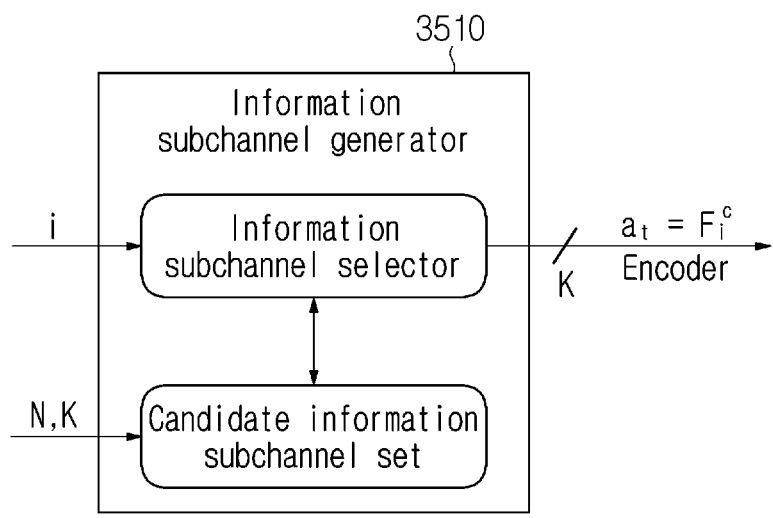
FIG. 35 is a view showing a structure of an information subchannel generator applicable to the present disclosure.

In addition, as an example, FIG. 35 is a view showing a structure of an information subchannel generator applicable to the present disclosure.

Referring to FIG. 35, an information subchannel generator 3510 may select an information subchannel based on a candidate information subchannel set. As an example, the information subchannel generator 3510 may receive information on an index i of an information subchannel set selected in a MAB AI. Herein, the information subchannel generator 3510 may generate an information subchannel set corresponding to the index i through (N, K) indicating a block size of the above-described polar code and the number of information subchannels and forward the set to an encoder, and thus perform encoding. As an example, locations of K information subchannels may be differently determined based on the index i. That is, the information subchannel generator 3510 may confirm location information of K information subchannels corresponding a forwarded index i and forward corresponding information to an encoder. Then, based on the received information, a transmitter may perform data encoding through a polar code.

Figure 36:
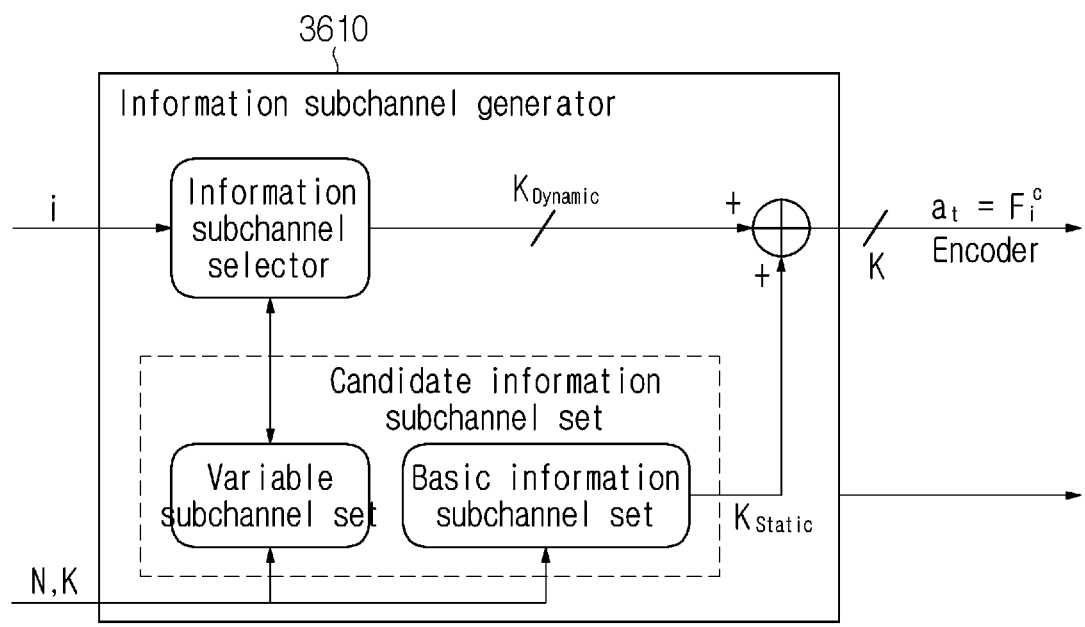
FIG. 36 is a view showing a structure of an information subchannel generator applicable to the present disclosure.

As another example, FIG. 36 is a view showing a structure of an information subchannel generator applicable to the present disclosure. Referring to FIG. 36, an information subchannel generator 3610 may obtain information on an index i from a MAB AI and thus determine an information subchannel set. Herein, the information subchannel generator 3610 may determine an information subchannel set by considering minimum coding performance loss and efficiency in selecting an information subchannel together.

Figure 37:
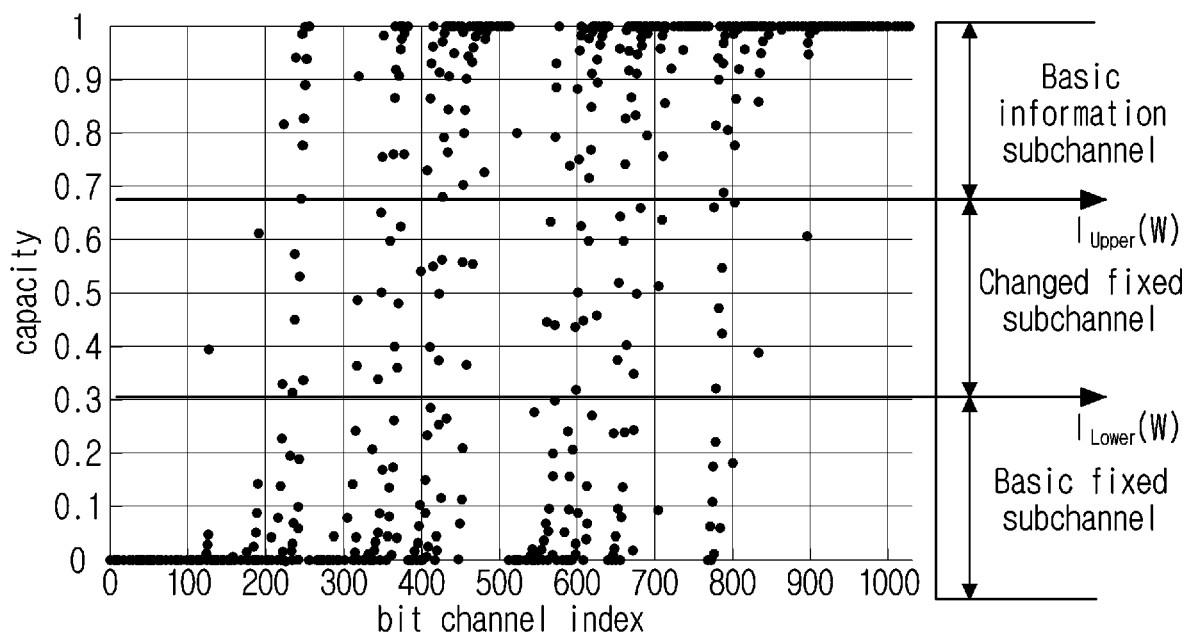
FIG. 37 is a view showing channel capacity applicable to the present disclosure.

As an example, FIG. 37 is a view showing channel capacity in a binary erasure channel with ½ erasure probability applicable to the present disclosure. Herein, as for (N, K) indicating a block size of a polar code and the number of information subchannels, there may be a basic information subchannel used basically as an information subchannel and a basic fixed subchannel used basically as a fixed subchannel. That is, a basic information subchannel may be a subchannel included in K, and a basic fixed subchannel may be a subchannel included in N−K. Herein, a remaining variable information subchannel may be located between an upper boundary value of channel capacity $I_{Upper}(W)$ and a lower boundary value of channel capacity $I_{Lower}(W)$. As an example, as an information subchannel set with an index i, a combination of a variable subchannel set $\{j | I_{Lower}(W) < I(W^j) < I_{Upper}(W)\}$ and a basic information subchannel set $\{j | I_{Upper}(W) < I(W^j)\}$ may be forwarded to an encoder. Herein, if the number of basic information subchannel sets is $K_{static}$ and the number of variable information subchannel sets is $K_{dynamic}$, the above-described K as an information subchannel set for the index i may be determined based on Equation 3 below.

$$K = K_{static} + K_{dynamic} \qquad \text{[Equation 3]}$$

That is, the information subchannel generator 3610 may determine a final information subchannel set through a basic information subchannel set and a variable subchannel set. As an example, a channel capacity for obtaining a basic information subchannel and a variable channel may be measured using Bhattacharyya Tracking or Monte-Carlo simulation with respect to low complexity, and a DE/GA technique may also be used with respect to accuracy and limited complexity. In addition, as an example, a channel capacity for obtaining a basic information subchannel and a variable channel may also be obtained by a genetic algorithm or an artificial intelligence using reinforcement learning but is not limited to the above-described embodiment.

Figure 38:
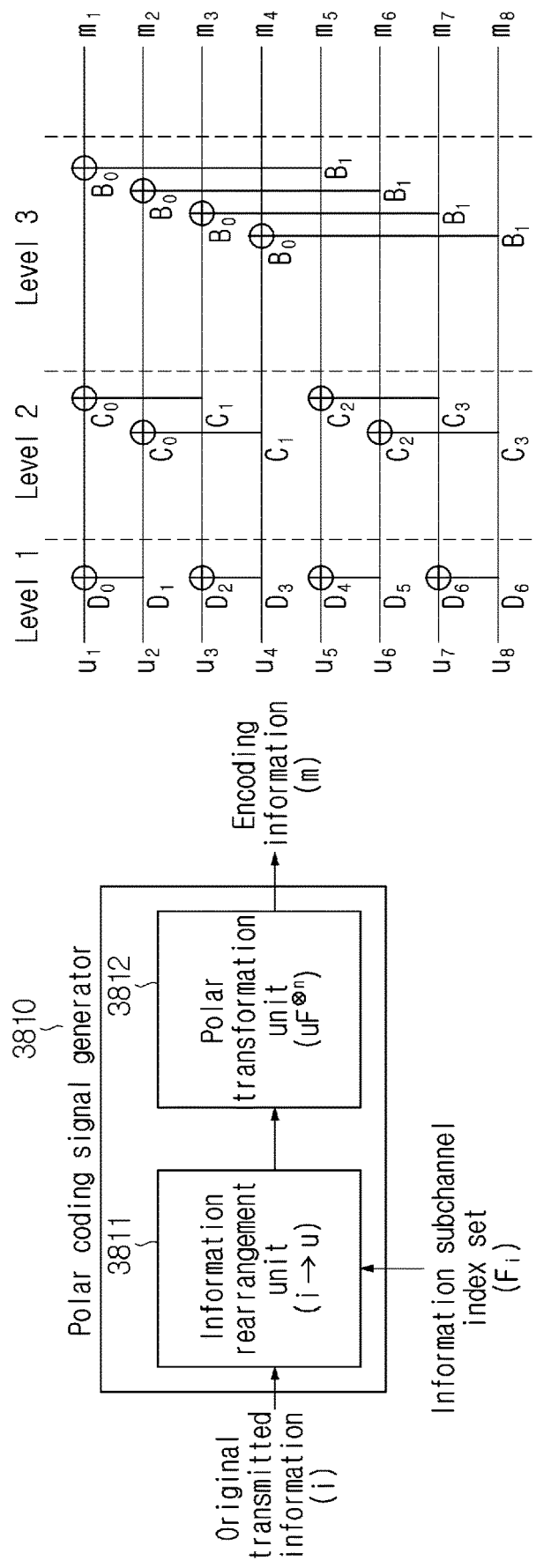
FIG. 38 is a view showing a polar coding signal generator applicable to the present disclosure.

As described above, when an information subchannel set for an index i forwarded to a polar code encoder is determined, a transmitter may perform encoding based on a polar code. As an example, FIG. 38 is a view showing a polar coding signal generator applicable to the present disclosure. Referring to FIG. 38, a transmitter may include a polar coding signal generator 3810. However, this is merely one example, an operation by a processor of the transmitter may also be possible, and for convenience of explanation, the description below will be based on the polar coding signal generator 3810. As an example, the polar coding signal generator 3810 may include an information rearrangement unit 3811 and the polar transformation unit 3812. Herein, as data to be transmitted, original transmitted information i may be forwarded to the polar coding signal generator 3810. Herein, the information rearrangement unit 3811 may allocate each bit of the original transmitted information i composed of K elements to K locations of N-sized output vector u according to each location value of an information subchannel index set $F_i$ composed of K elements. Herein, a location in the output vector to which no information is allocated may be filled with 0. Next, the polar transformation unit 3812 may output encoding information m through u $F^{\otimes n}$, which is the product of information of u and a polar transform matrix $F^{\otimes n}$. Here, $F^{\otimes n}$ means an nth-order Kronecker power operation and may be expressed by Equation 4 below.

$$F = \begin{bmatrix} 1 & 0 \\ 1 & 1 \end{bmatrix} \qquad \text{[Equation 4]}$$

As an example, referring to FIG. 38, m=u $F^{\otimes}3$ (n=3) may be executed to generate final encoding information m.

Figure 39:
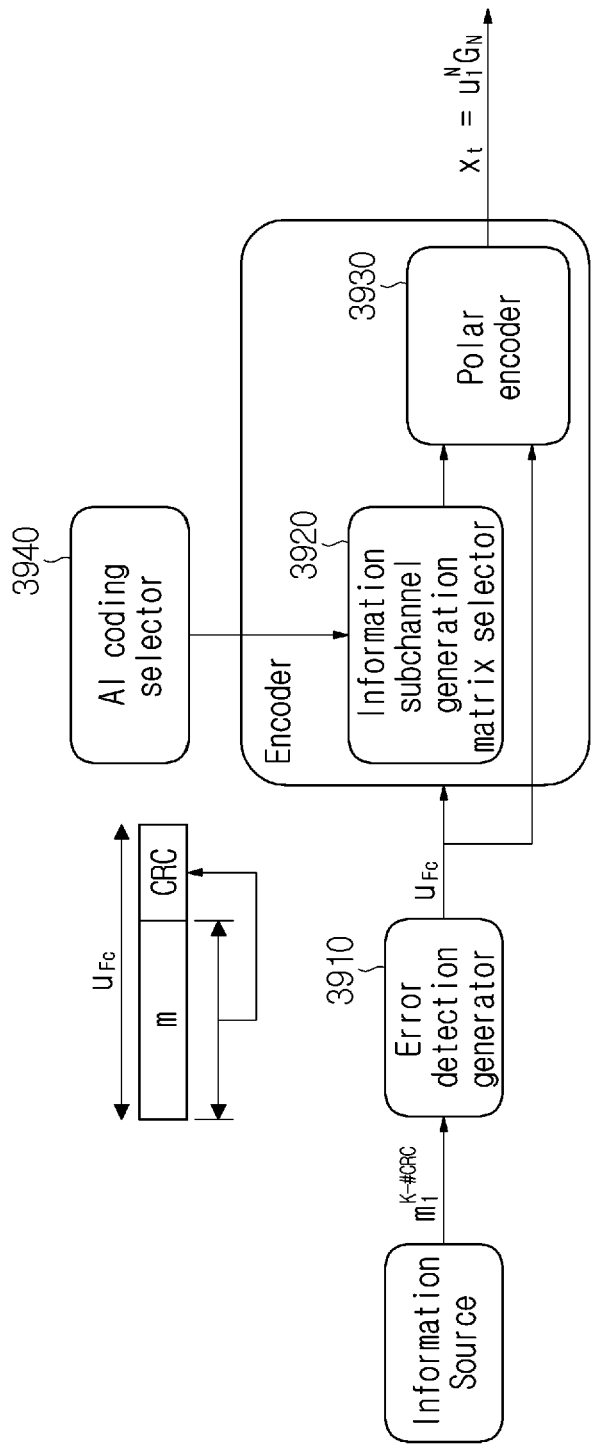
FIG. 39 is a view showing a signal generator applicable to the present disclosure.

FIG. 39 is a view showing a signal generator applicable to the present disclosure. Referring to FIG. 39, a transmitter may attach CRC to an information source and then transmit data encoded in a polar code through an encoder. Specifically, at the end of original transmitted information $m_1^{K-\#CRC}$, CRC as CheckSum may be attached through an error detection generator 3910. As an example, the error detection generator 3910 may be a configuration for error detection for transmitted data. That is, the error detection generator 3910 may check integrity for finally decoded data. As an example, the error detection generator 3910 may be implemented using CRC. As another example, in case the error detection generator 3910 can optionally perform error detection through a function of an encoder itself, it may also be omitted but is not limited to the above-described embodiment.

Herein, as an example, when CRC is attached to the original transmitted information $m_1^{K-\#CRC}$, which is an information source, $u_{F_c}$ with information of a total K bits may be generated, and the generated $u_{F_c}$ may be forwarded to an encoder. Herein, the encoder may be composed of an information subchannel generation matrix selector 3920 and a polar encoder 3930. At this time, the information subchannel generation matrix selector 3920 may construct $G_N(F_c)$ by using an information subchannel set $F_c$ forwarded from an AI coding selector 3940 and forward $G_N(F_c)$ to the polar encoder 3930. Herein, the polar encoder 3930 may generate $x_t$ to be finally forwarded by using $u_{F_c}$ which is information to be transmitted, and $G_N(F_c)$. Herein, $x_t$ may be expressed by Equation 5 below, and a polar code generation matrix may be expressed by Equation 6.

Here, $x_1^N$ may be $x_1^N[x_1, x_2, x_3, \ldots, x_n]$. In addition, $u_1^N$ may be $u_1^N = [u_1, u_2, u_3, \ldots, u_n]$. In addition, $G_N$ may be an n-th Kronecker product of $G_2$, having a relation of $N=2^n$. In addition, as an example, when a polar code dimension is K and a length is N, a polar code may be represented in a form of (N, K, F, u_F). Here, the frozen bit set $F(F \subset \{1, 2, \ldots, N\})$ may be a set of locations of frozen bits. In addition, $u_F$ is a value of N-K frozen bits, for which 0 may be typically used. Herein, $F_c$ indicates a location of an information bit, and $u_{F_c}$ may be a value of K information bits. Based on what is described above, $x_1^N$ may be derived based on Equation 7 below. Here, $G_{N_{(F)}}$ and $G_N(F_c)$ may be submatrices with rows corresponding to locations F and $F_c$ respectively.

$$x_t = x_1^N = u_1^N G_N \quad \text{[Equation 5]}$$

$$G_N = G_2^{\otimes n} = \begin{pmatrix} G_{N/2} & G_{N/2} \\ G_{N/2} & G_{N/2} \end{pmatrix}, \; G_2 = \begin{pmatrix} 1 & 0 \\ 1 & 1 \end{pmatrix} \quad \text{[Equation 6]}$$

$$x_1^N = u_{F_c} G_N(F_c) + u_F G_N(F) \leftrightarrows u_{F_c} G_N(F_c) \text{ if } u_F = 0 \quad \text{[Equation 7]}$$

As described above, a transmitter may transmit encoded data through a polar code to a receiver. Herein, the receiver may decode the encoded data, and FIG. 40 is a view showing a signal decoding unit applicable to the present disclosure.

Figure 40:
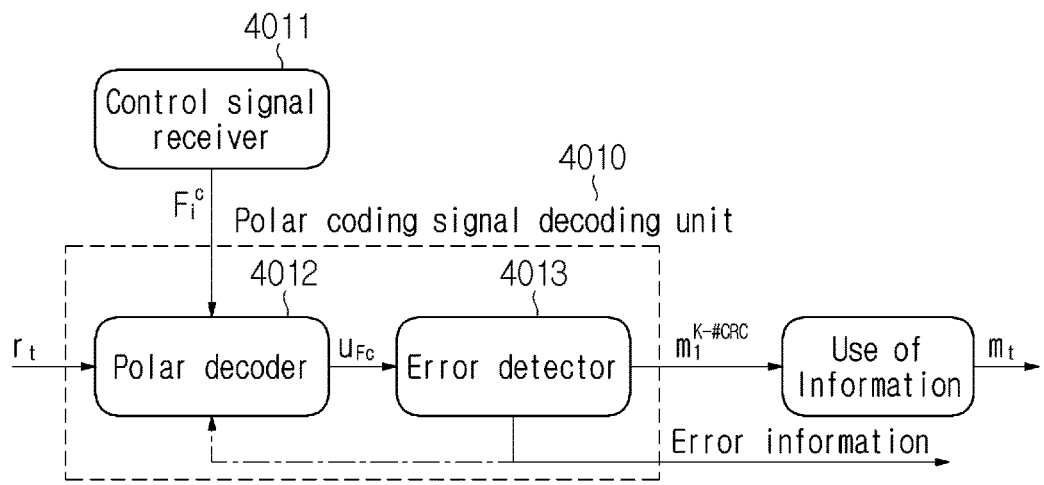
FIG. 40 is a view showing a signal decoding unit applicable to the present disclosure.

As an example, referring to FIG. 40, a polar coding signal decoding unit 4010 may include a polar decoder 4012 for decoding and using a message from a polar code and an error detector 4013 for detecting whether or not a decoded message has an error and forwarding error information to an AI learning information generator. Specifically, the receiver may receive data $r_t$ encoded based on a polar code and a control signal. As an example, a control signal may be received through a control signal receiver 4011 but is not limited thereto. Herein, the control signal may include information on an information subchannel. The receiver may decode $r_t$ using an information subchannel set $F_t^c$ through information received based on a control signal and generate a message $u_{F_c}$. Next, the error detector 4013 may separate $\text{CheckSum}_t$ for error check and a message $m_1^{K-\#CRC}$ from the decoded $u_{F_c}$ and use error detection and information. Herein, as an example, $\text{CheckSum}_t$ may also be used in a CRC-assisted (CA) SCL decoder for polar decoding. In addition, error information may be generated based on $\text{CheckSum}_t$, and error information thus generated may be forwarded to the AI learning information generator and forwarded as the above-described reward information to the transmitter.

Figure 41:
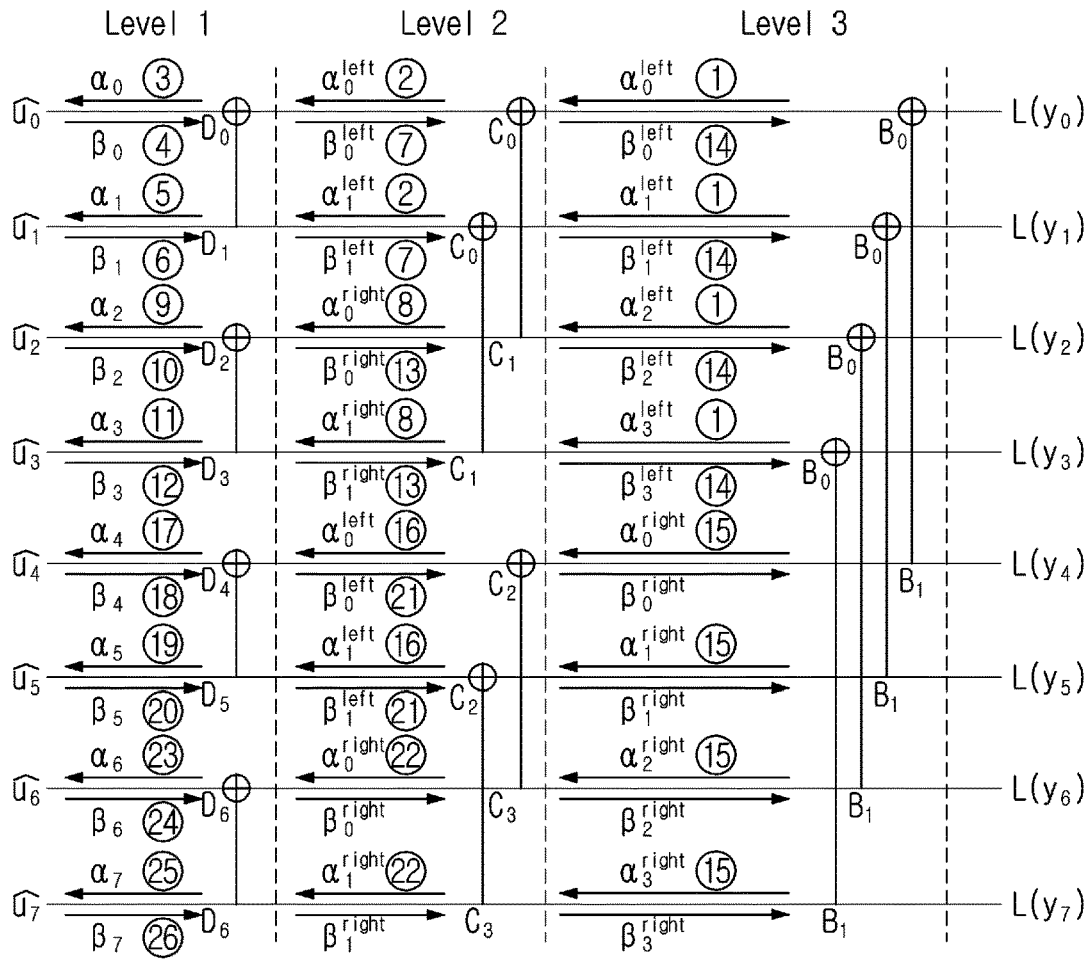
FIG. 41 is a view showing a continuous signal decoding process applicable to the present disclosure.
Figure 42:
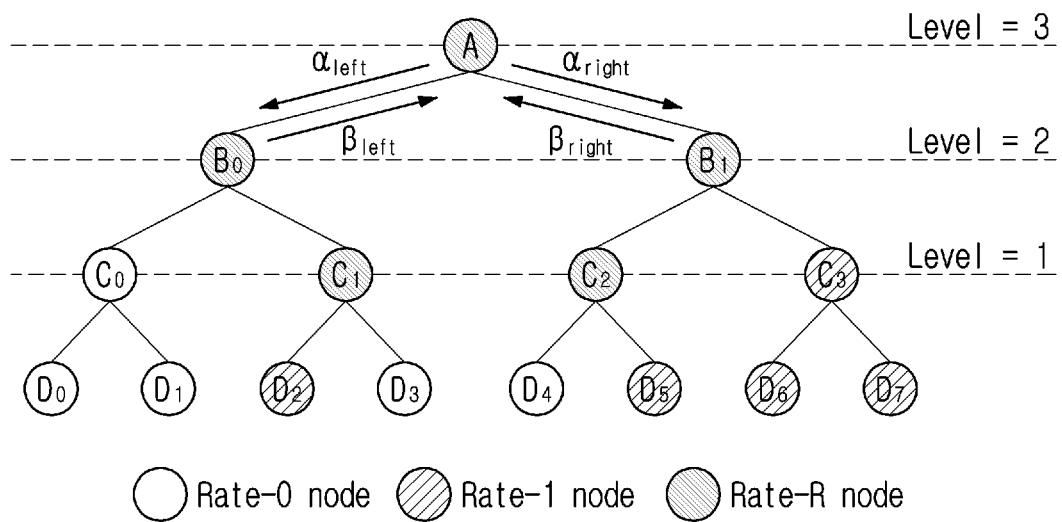
FIG. 42 is a view showing a continuous signal decoding process applicable to the present disclosure.

Herein, as an example, FIG. 41 and FIG. 42 are views showing continuous signal decoding processes applicable to the present disclosure. Referring to FIG. 41, a receiver may perform continuous decoding based on a polar code. Herein, an operation for each node (LLR: α, Partial Sum: β, Path Metric: PM) may be expressed by Equation 8 below.

$$\alpha_0^{left} = \text{sgn}(\alpha_0 \alpha_4) \cdot \min(|\alpha_0|, |\alpha_4|), \alpha_0 = L(y_0), \; \alpha_4 = L(y_4)$$

$$\alpha_1^{left} = \text{sgn}(\alpha_1 \alpha_5) \cdot \min(|\alpha_1|, |\alpha_5|), \alpha_1 = L(y_1), \; \alpha_5 = L(y_5)$$

$$\alpha_2^{left} = \text{sgn}(\alpha_2 \alpha_6) \cdot \min(|\alpha_2|, |\alpha_6|), \; \alpha_2 = L(y_2), \; \alpha_6 = L(y_6)$$

$$\alpha_3^{left} = \text{sgn}(\alpha_3 \alpha_7) \cdot \min(|\alpha_3|, |\alpha_7|), \; \alpha_3 = L(y_3), \; \alpha_7 = L(y_7) \quad \text{[Equation 8]}$$

Here, an operation for continuous decoding may be performed by a decode core itself or through a dedicated process element but is not limited to the above-described embodiment. Specifically, in FIG. 41, the node $B_0$ has 4 αs, which may be expressed as $\alpha_0^{left}, \alpha_1^{left}, \alpha_2^{left}, \alpha_3^{left}$ respectively and be calculated based on Equation 8. Herein, the continuous decoding process may be performed based on Equation 9 to Equation 13 below. Here, i is an i-th entry of $\alpha^{left}, \alpha^{right}$, and $\alpha^{left}, \alpha^{right} \in R^{2^{m-1}}$ and $\beta \in \{0,1\}^{2^m}$ may be possible. Specifically, $\alpha_0^{left}$ of the node $C_0$ may be calculated through $\alpha_{left}$ and $\alpha_2^{left}$ of the node $B_0$. In addition, $\alpha_1^{left}$ of the node $C_0$ may also be calculated through $\alpha_1^{left}$ and $\alpha_3^{left}$ of the node $B_0$. Then, $a_0$ of the node $D_0$ may be derived through $\alpha_0^{left}$ and $\alpha_1^{left}$ of the node $C_0$. Herein, since the node $D_0$ node is the last leaf node, $\widehat{u_0}$ may be calculated through Equation 11 below. In addition, $\widehat{u_0}$ may become $\beta_0$. Herein, $a_1$ of the node $D_1$ may be calculated through Equation 10. In addition, u1 may be calculated through Equation 11, and this value may be $B_1$ of the node $D_1$. In addition, $B_0$ and $B_1$ of the node $C_0$ may be calculated by applying Equation 11. Then, $\alpha_0^{right}$ and $\alpha_1^{right}$ of the node $C_1$ may be calculated, and $a_2$ and $\widehat{u_2}$ of the node $D_2$ and $a_3$ and $\widehat{u_3}$ of the node $D_3$ may be decoded in sequence. $\widehat{u_4}, \widehat{u_5}, \widehat{u_6}, \widehat{u_7}$ may also be decoded by repeating the above-described scheme.

$$\alpha_i^{left} = \text{sgn}(\alpha_i \alpha_{i+2^{m-1}}) \cdot \min(|\alpha_i|, |\alpha_{i+2^{m-1}}|) \quad \text{[Equation 9]}$$

$$\alpha_i^{right} = \alpha_{i+2^{m-1}} + (1 - 2\beta_i^{left})\alpha_i \quad \text{[Equation 10]}$$

$$\hat{u}_i = \begin{cases} 0, & \text{if } i \in F \text{ or } \alpha_i \geq 0 \\ 1, & \text{otherwise} \end{cases} \quad \text{[Equation 11]}$$

$$\beta_i = \begin{cases} \beta_i^{left} \oplus \beta_i^{right}, & \text{if } i < 2^{m-1} \\ \beta_{i-2^{m-1}}^{right}, & \text{otherwise} \end{cases} \quad \text{[Equation 12]}$$

$$PM_k^{(l)} = \begin{cases} PM_{k-1}^{(l)}, & \text{if } \hat{u}_k^l = \dfrac{1 - \text{sgn}(\alpha_k^{(l)})}{2} \\ PM_{k-1}^{(l)} + |\alpha_k^{(l)}|, & \text{otherwise} \end{cases} \quad \text{[Equation 13]}$$

In addition, FIG. 42 may configure a and B for each node in the form of a decoding tree. Herein, α and β of a node at each level may have $2^{m-1}$ entries on the left and on the right respectively. Herein, each entry may be the same as α and β of each node in the continuous decoding process of FIG. 41, but is not limited to the above-described embodiment.

Figure 43:
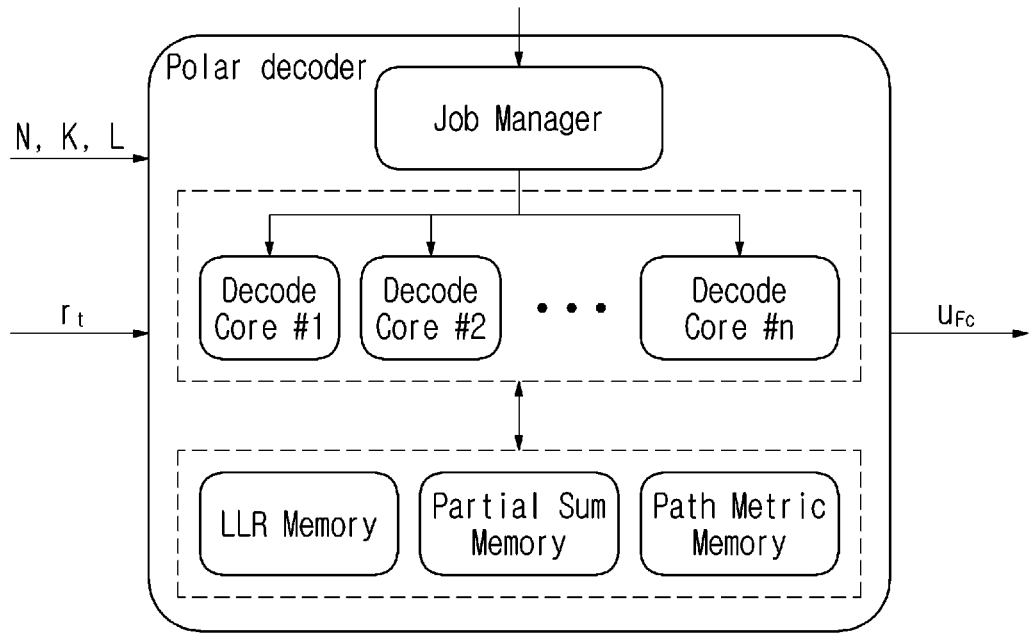
FIG. 43 is a view showing an information subchannel-adaptive polar code decoder applicable to the present disclosure.

FIG. 43 is a view showing an information subchannel-adaptive polar code decoder applicable to the present disclosure. Referring to FIG. 43, an information subchannel-adaptive polar code decoder may include at least one or more of a job manager, a plurality of decode cores, and a shared memory. Herein, the job manager may construct a network of a decoder and distribute decoding functions to be performed by the decode cores in order to process decoding in parallel. In addition, the job manager may determine rates of all nodes by using a fixed subchannel set $F_i$. Herein, referring to FIG. 42, Rate-0 may be a case where every lower node is a fixed bit, Rate-1 may be a case where every lower node is an information bit, and Rate-R may be a case where lower nodes are information bits and fixed bits. As an example, each piece of rate information may be used to remove an unnecessary operation through pruning or used to calculate parallelized LLR but is not limited to the above-described embodiment. In addition, the decode cores are used to process parallelized decoders, and when 4 decode cores are used, each of the 4 decode cores may decode N/4 bits but is not limited the above-described embodiment. In addition, the shared memory may be used to store an LLR, a partial sum, and a path metric and have a read/write function available at each decode core but is not limited to the above-described embodiment.

As another example, as described above, a receiver may generate error information through error detection and forward the error information to an AI learning information generator, and reward information may be generated based on this.

Figure 44:
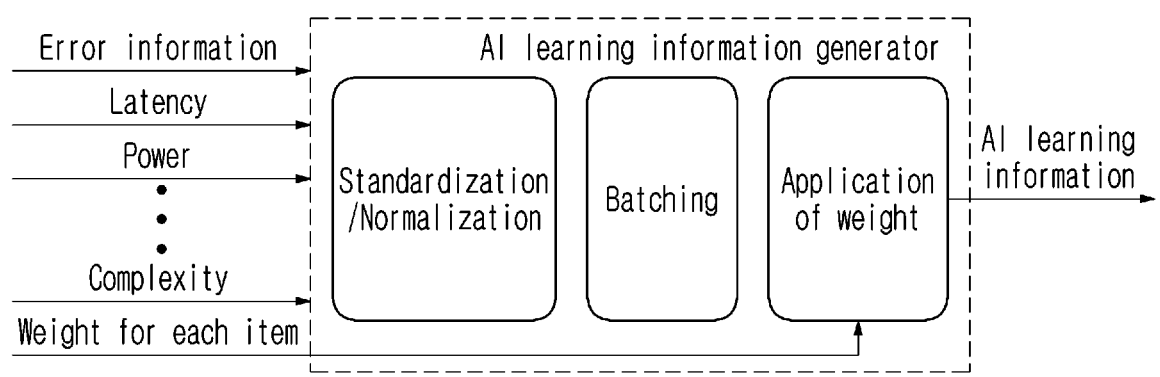
FIG. 44 is a view showing an AI learning information generator applicable to the present disclosure.

Herein, FIG. 44 is a view showing an AI learning information generator applicable to the present disclosure. As an example, referring to FIG. 44, an AI learning information generator may generate reward information according to the selection of an information subchannel of a transmitter. As an example, the AI learning information generator may generate reward information based on at least one of standardization/normalization, batching, and application of a weight. As an example, as described above, the AI learning information generator may obtain not only error information through Checksum from a signal decoding unit but also at least one of latency, power consumption, and HW complexity information by using another monitoring system. In addition, the AI learning information generator may also obtain another type of information but is not limited to the above-described embodiment. Herein, since each piece of measurement information has various areas of values, standardization/normalization needs to be performed. In addition, batching may accumulate measurement information at intervals of a plurality of code blocks, and normalization may be performed for each accumulation together. In addition, as an example, a weight application block may apply a weight for each measurement indicator to express a final output value. As an example, a receiver with high importance of power consumption may have a high weight for power measurement, and this may be reflected in generating reward information.

Herein, as an example, reward information (AI learning information) may have a combined form of processed measurement information. As another example, reward information (AI learning information) may be transmitted to a transmitter in a multiple forms of measurement information but is not limited to the above-described embodiment.

In addition, as an example, a receiver may forward reward information together with feedback information to a transmitter. Specifically, as described above, a transmitter may transmit information on an information subchannel index set determined through a control channel to a receiver. In addition, the transmitter may determine an information subchannel K in a polar code through the determined information subchannel index set, perform encoding for data based on this, and transmit the encoded data to the receiver. Next, the receiver may perform decoding for the received data and generate reward information based on error information. Herein, as an example, the receiver may check whether or not decoding is successful for the received data and give information regarding it as feedback to the transmitter. As an example, when decoding for the received data is successful, the receiver give ACK information as feedback to the transmitter. On the other hand, when decoding for the received data fails, the receiver give NACK information as feedback to the transmitter. Next, the transmitter may perform retransmission of failed data. Herein, as an example, the receiver may forward reward information together with feedback information to the transmitter. Thus, the transmitter may identify whether or not data reception is successful and also identify reward information, and the reward information may be reflected in data retransmission or subsequent transmission.

As another example, a transmitter and a receiver may configure a reward information process for reward information. As an example, there may be a plurality of reward information processes, and when data transmission is performed, reward information may be forwarded from a receiver to a transmitter at a preset time based on a reward process. That is, there may be a process for exchanging reward information between a transmitter and a receiver, and each process may operate based on an individual ID. That is, there may be a plurality of reward information processes between a transmitter and a receiver, and reward information may be exchanged based on a preset scheme through a process corresponding to data transmission but is not limited to the above-described embodiment.

Figure 45:
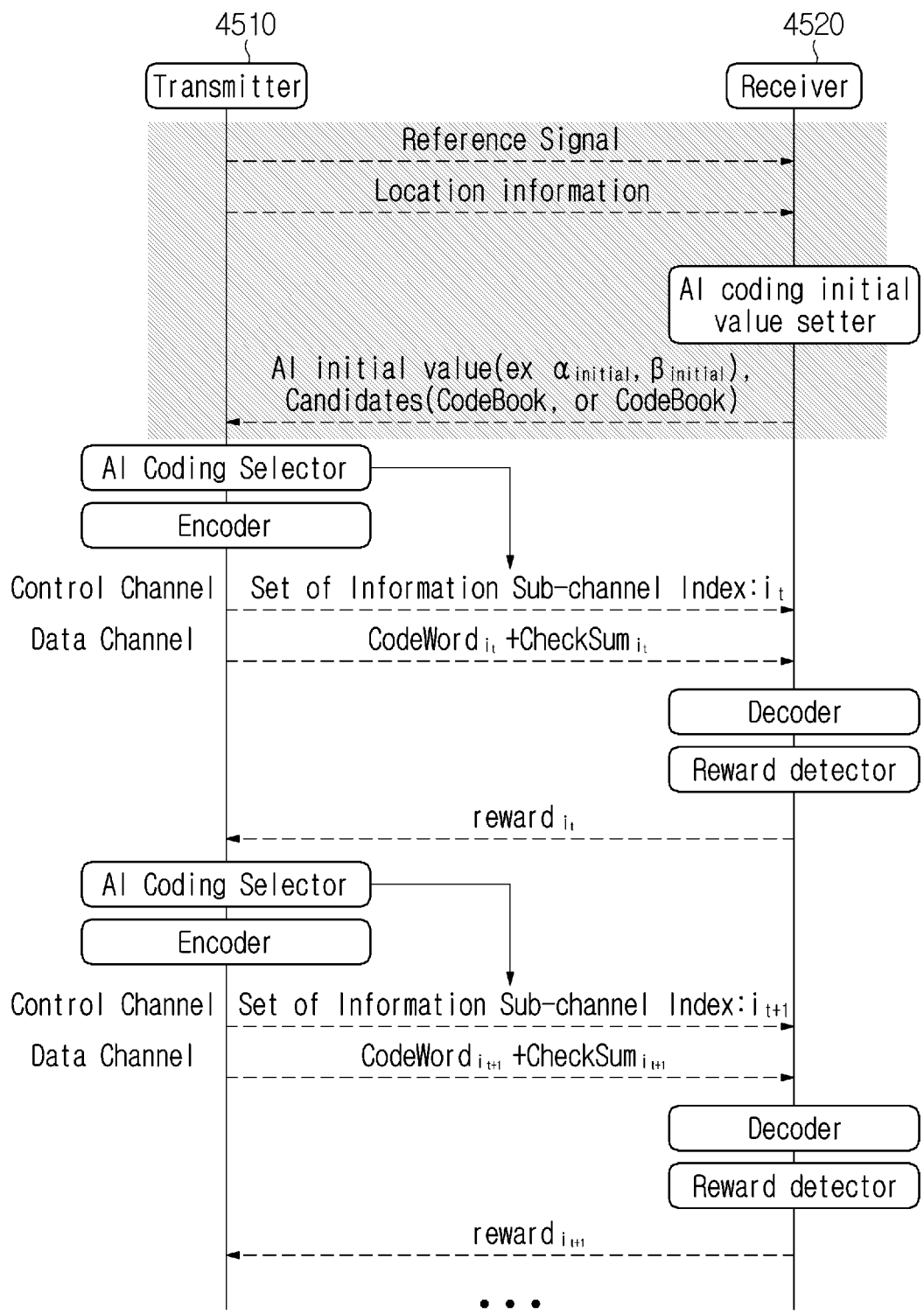
FIG. 45 is a view showing generation of a real-time/channel-adaptive polar code and a communication flowchart applicable to the present disclosure.

FIG. 45 is a view showing an AI system that generates in real time a linear polar code optimized for a communication channel environment applicable to the present disclosure. As another example, an AI coding initial value may be set to a receiver in advance. Specifically, referring to FIG. 45, a receiver 4520 may set an AI coding initial value as a preliminary work.

Herein, as an example, a transmitter 4510 may forward location information of the transmitter 4510 and a reference signal to the receiver 4520 in order to set an AI coding initial value. The receiver 4520 may set an AI coding initial value through the location information and the reference signal received from the transmitter 4510. That is, the receiver 4520 may obtain channel information through a reference signal and set an AI coding initial value based on the location information of the transmitter 4510 and use it. Herein, an AI initial value may include at least one or more of $\alpha_{initial}$, $\beta_{initial}$, and a set of candidates. The receiver 4520 may generate an AI initial value and transmit corresponding information to the transmitter 4510. As an example, a set of candidates may be an indexes of codebooks for predefined information subchannels. As another example, a set of candidates may have a direct form of codebook. As an example, a codebook may be a codebook indicating a set of information subchannels unlike a codebook of precoding matrix used in MIMO and is not limited to the above-described embodiment.

The transmitter 4510 may receive an AI coding initial value, initialize an AI coding selector operating through Thompson Sampling by using the initial value, and then perform the above-descried operation of selecting a polar code.

As another example, a reference signal transmitted by the transmitter 4510 may be a reference signal for channel measurement. As an example, the transmitter 4510 may transmit a reference signal for channel measurement to the receiver 4520. The receiver 4520 may measure a channel environment by using a reference signal and derive an AI coding initial value by using corresponding information. Then, the receiver 4520 may transmit feedback information about channel measurement to the transmitter 4510, and information on an AI coding initial value may be forwarded to the transmitter 4510 together with feedback information.

As another example, a reference signal transmitted by the transmitter 4510 may be a reference signal for sounding. As an example, the transmitter 4510 may transmit a reference signal for sounding to the receiver 4520. The receiver 4520 may measure a channel environment by using a reference signal and derive an AI coding initial value by using corresponding information. Then, the receiver 4520 may transmit feedback information about channel measurement to the transmitter 4510, and information on an AI coding initial value may be forwarded to the transmitter 4510 together with feedback information.

As another example, a separate reference signal may be used for an AI coding initial value. That is, in the transmitter 4510 and the receiver 4520, a separate reference signal for an AI coding initial value may be set, and an AI coding initial value may be individually exchanged based on the separate reference signal but is not limited the above-described embodiment.

Figure 46:
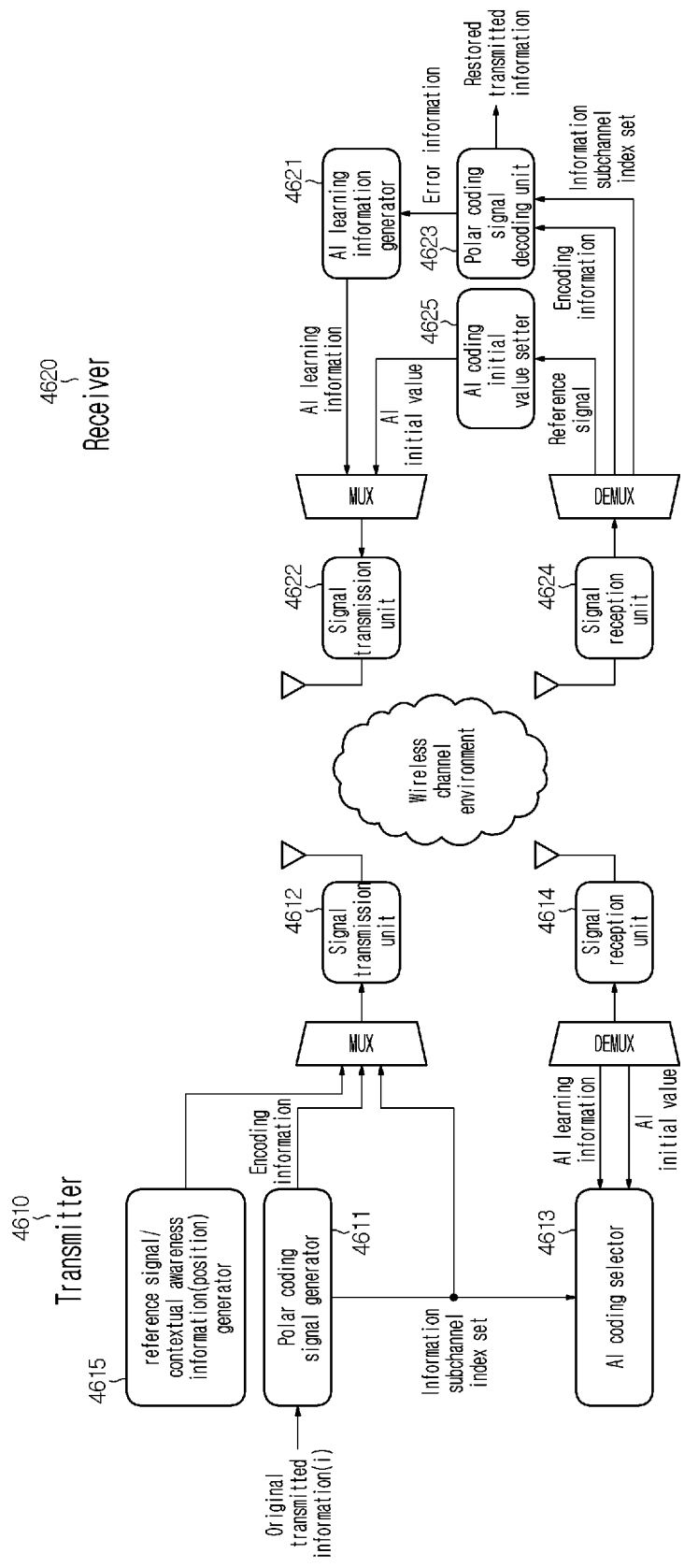
FIG. 46 is a view showing an artificial intelligence system that generates in real time a linear polar code optimized for a communication channel environment applicable to the present disclosure.

In addition, as an example, FIG. 46 is a view showing an artificial intelligence system that generates in real time a linear polar code optimized for a communication channel environment applicable to the present disclosure. Referring to FIG. 46, a transmitter 4610 may include at least one of a polar coding signal generator 4611, a signal transmission unit 4612, an AI coding selector 4613, and a signal reception unit 4614, and this is the same as FIG. 32. Herein, as an example, the transmitter 4610 may further include a reference signal generator 4615 for generating location information and a reference signal. In addition, as an example, a reference signal may also be generated through a processor of the transmitter 4610 and is not limited to the above-described embodiment. In addition, a receiver 4620 may include at least one or more of an AI learning information generator 4621, a signal transmission unit 4622, a polar coding decoding unit 4623, and a signal reception unit 4624, and this is the same as FIG. 32 described above. Herein, the receiver 4620 may further an AI coding initial value setting unit 4625 for generating an AI initial value by using a reference signal and location information forwarded from the transmitter 4610. In addition, as an example, an AI coding initial value may also be set through a processor of the receiver 4620 and is not limited to the above-described embodiment.

Figure 47:
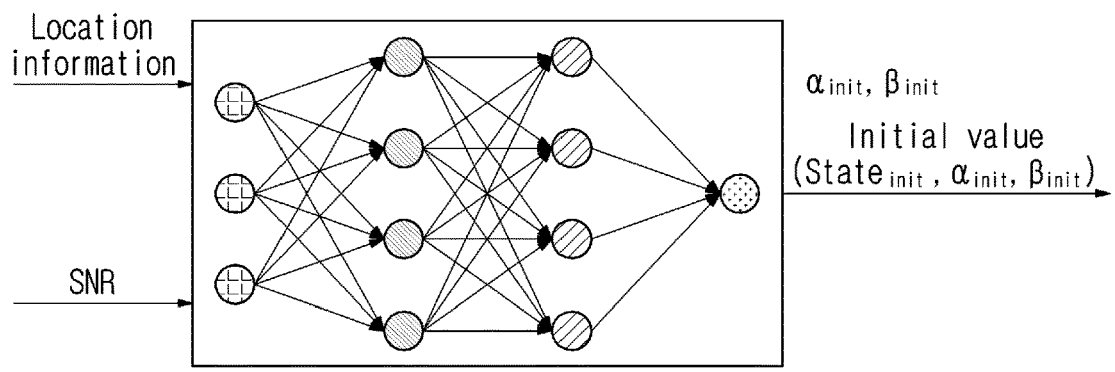
FIG. 47 is a view showing an AI coding initial value predictor applicable to the present disclosure.

In addition, FIG. 47 is a view showing a method for setting an AI coding initial value applicable to the present disclosure. As an example, when a block where a polar code is executed is large, there may be a plurality of information subchannel combinations. Accordingly, reflecting a channel environment in real time through learning based on a plurality of information subchannels may increase a load of a terminal/base station, and a stabilization time may also become longer. In consideration of what is described above, a candidate group of information subchannels may be determined by simulation for every information subchannel or AI pre-training according to a communication channel environment. As an example, referring to FIG. 37, analysis of a channel capacity of a subchannel may be predicted through Bhattacharyya bounds or a Monte Carlo simulation. As an example, referring to FIG. 37, a candidate group of information subchannels may be determined by identifying a variable information subchannel except a fixed information subchannel and a fixed frozen subchannel based on a channel capacity. That is, performance may become different according to selection of a variable information subchannel. Herein, the selection of a variable information subchannel may be derived through reinforcement learning, a genetic algorithm, or the like. Based on what is described above, the accuracy of a candidate group of information subchannels may be enhanced, or the number thereof may be reduced.

In addition, as an example, when Thompson Sampling is used for AI pre-training, each performance may be derived based on Equation 14 below. Herein, a candidate set for a polar information subchannel may be determined in a descending order of performance based on Equation 14, and a candidate set may be differently generated according to a channel environment.

$$\text{Performance}_i = \frac{\alpha_i}{\beta_i} \qquad \text{[Equation 14]}$$

Herein, candidate sets are defined in a form of codebooks, and a receiver may forward a set of codebooks to be used by a transmitter in a form of index. As another example, a receiver may directly transmit a codebook to be used, and this is the same as described above.

As yet another example, an AI coding initial value may forward not only a candidate set but also an initial value of an AI system of a transmitter. As an example, an AI coding initial value may be used as an initial value of an selected AI or as an initial state of reinforcement learning. As an example, in case of Thompson Sampling, a receiver may set initial values $\alpha_{initial}$ and $\beta_{initial}$ and forward the initial values to a transmitter. Herein, the receiver may predict the initial values $\alpha_{initial}$ and $\beta_{initial}$ by considering a channel environment (SNR) and location information of the transmitter. The receiver may store $\alpha_{initial}$, $\beta_{initial}$, BLER, $\alpha_{final}$, $\beta_{final}$, location information, and channel information, and use the above pieces of information as learning data in transfer learning for predicting $\alpha_{initial}$ and $\beta_{initial}$, but is not limited to the above-described embodiment.

Figure 48:
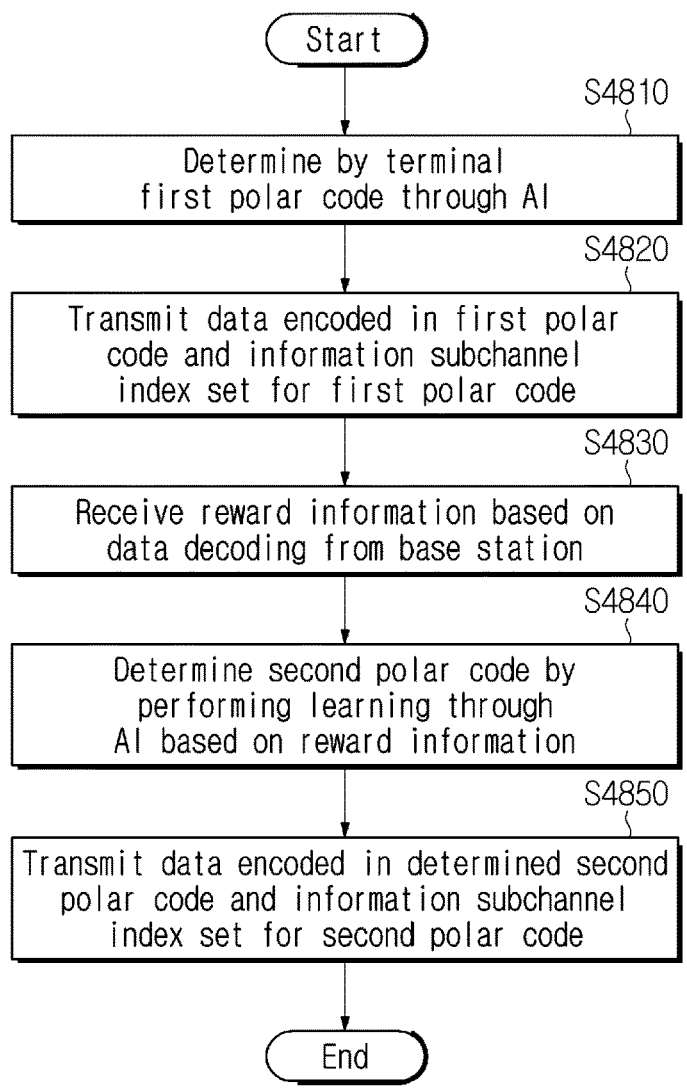
FIG. 48 is a flowchart showing a method for transmitting and receiving a signal by a terminal applicable to the present disclosure.

FIG. 48 is a flowchart showing a method for transmitting and receiving a signal by a terminal applicable to the present disclosure.

A terminal may determine a first polar code through an artificial intelligence (AI) (S4810). Herein, as an example, a terminal may be the above-described transmitter, and a base station may be the above-described receiver. The terminal may transmit data encoded in a first polar code and an information subchannel index set for the first polar code to the base station (S4820). Herein, as an example, the first polar code may be determined based on history information. As another example, the terminal may transmit a reference signal and location information of the terminal to the base station and based on this receive an initial polar code value from the base station. That is, the base station may generate the initial polar code value based on the reference signal and the location information of the terminal, which are received from the terminal. Herein, the base station may generate the initial polar code value through learning of an artificial intelligence (AI), as described above.

Next, the terminal may receive reward information based on data decoding from the base station (S4830). Next, the terminal may determine a second polar code by performing learning through the AI based on the reward information (S4840) and transmit data encoded based on the determined polar code and an information subchannel index set for the second polar code to the base station (S4850).

Herein, as an example, when a polar code is determined, the polar code may be determined as a specific information subchannel set among information subchannel set candidates. Herein, an information subchannel index set may correspond to a determined information subchannel set. As an example, information subchannel set candidates may be set based on a codebook. Herein, the above-described initial polar code value may be generated by a codebook index for information subchannel set candidates. A terminal may determine the above-described first polar code based on an initial polar code value. That is, a terminal may select a specific information subchannel set based on a codebook index for information subchannel set candidates, and this is the same as described above.

In addition, as an example, reward information may be determined based on at least one of decoding error information, latency information, power information, and decoding complexity information of a base station. In addition, when a terminal encodes data based on a polar code, each bit of data may be allocated to a subchannel corresponding to an information subchannel index set among subchannel sets corresponding to the polar code. On the other hand, 0 as a frozen bit may be allocated to a fixed subchannel index set among subchannel sets, and this is the same as described above. Herein, as an example, an information subchannel index set may be determined based on a basic information subchannel and a variable information subchannel. Herein, the basic information subchannel may be a fixed subchannel, the variable information subchannel may be a subchannel that varies flexibly based on reward information, and this is the same as described above.

Figure 49:
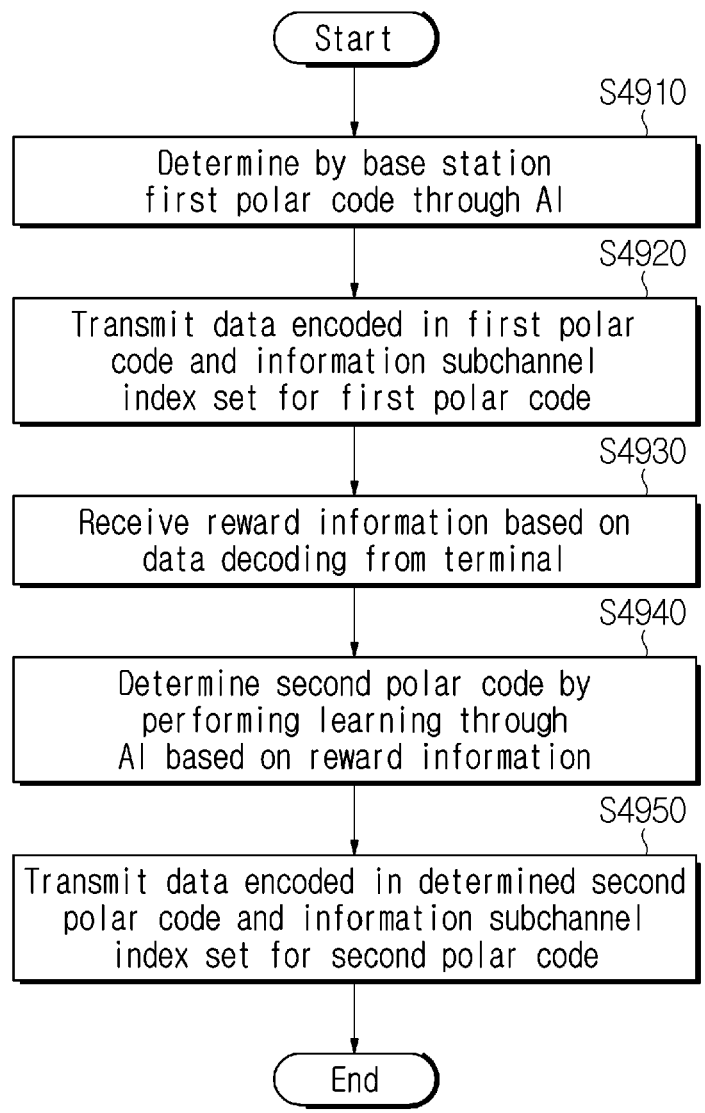
FIG. 49 is a flowchart showing a method for transmitting and receiving a signal by a base station applicable to the present disclosure.

FIG. 49 is a flowchart showing a method for transmitting and receiving a signal by a base station applicable to the present disclosure.

A base station may determine a first polar code through an artificial intelligence (AI) (S4910). Herein, as an example, a base station may be the above-described transmitter, and a terminal may be the above-described receiver. The base station may transmit data encoded in a first polar code and an information subchannel index set for the first polar code to the terminal (S4920). Herein, as an example, the first polar code may be determined based on history information. As another example, the base station may transmit a reference signal and location information of the base station to the terminal and based on this receive an initial polar code value from the terminal. That is, the terminal may generate the initial polar code value based on the reference signal and the location information of the terminal, which are received from the base station. Herein, the terminal may generate the initial polar code value through learning of an artificial intelligence (AI), as described above.

Next, the base station may receive reward information based on data decoding from the terminal (S4930). Next, the base station may determine a second polar code by performing learning through the AI based on the reward information (S4940) and transmit data encoded based on the determined polar code and an information subchannel index set for the second polar code to the terminal (S4950).

Herein, as an example, when a polar code is determined, the polar code may be determined as a specific information subchannel set among information subchannel set candidates. Herein, an information subchannel index set may correspond to a determined information subchannel set. As an example, information subchannel set candidates may be set based on a codebook. Herein, the above-described initial polar code value may be generated by a codebook index for information subchannel set candidates. A base station may determine the above-described first polar code based on an initial polar code value. That is, a base station may select a specific information subchannel set based on a codebook index for information subchannel set candidates, and this is the same as described above.

In addition, as an example, reward information may be determined based on at least one of decoding error information, latency information, power information, and decoding complexity information of a base station. In addition, when a base station encodes data based on a polar code, each bit of data may be allocated to a subchannel corresponding to an information subchannel index set among subchannel sets corresponding to the polar code. On the other hand, 0 as a frozen bit may be allocated to a fixed subchannel index set among subchannel sets, and this is the same as described above. Herein, as an example, an information subchannel index set may be determined based on a basic information subchannel and a variable information subchannel. Herein, the basic information subchannel may be a fixed subchannel, the variable information subchannel may be a subchannel that varies flexibly based on reward information, and this is the same as described above.

In addition, as an example, it is possible to consider a device including at least one memory and at least one processor functionally coupled with the at least one memory. Herein, the at least one processor may control the device to determine a first polar code through an artificial intelligence (AI), to transmit data encoded in the first polar code and an information subchannel index set, to receive reward information based on data decoding, to determine a second polar code by performing learning through the AI based on the reward information, and to transmit data encoded in the determined second polar code and an information subchannel index set for the second polar code. Herein, when the second polar code is determined through learning, an information subchannel index set for the second polar code may be determined among information subchannel set candidates based on the reward information.

In addition, as an example, it is possible to consider a non-transitory computer-readable medium storing at least one instruction. Herein, the at least one instruction executable by a processor may be included, and the least one instruction may control a device to determine a first polar code through an artificial intelligence (AI), to transmit data encoded in the first polar code and an information subchannel index set, to receive reward information based on data decoding, to determine a second polar code by performing learning through the AI based on the reward information, and to transmit data encoded in the determined second polar code and an information subchannel index set for the second polar code. Herein, when the second polar code is determined through learning, an information subchannel index set for the second polar code may be determined among information subchannel set candidates based on the reward information.

Examples of the above-described proposed methods may be included as one of the implementation methods of the present disclosure and thus may be regarded as kinds of proposed methods. In addition, the above-described proposed methods may be independently implemented or some of the proposed methods may be combined (or merged). The rule may be defined such that the base station informs the UE of information on whether to apply the proposed methods (or information on the rules of the proposed methods) through a predefined signal (e.g., a physical layer signal or a higher layer signal).

Those skilled in the art will appreciate that the present disclosure may be carried out in other specific ways than those set forth herein without departing from the spirit and essential characteristics of the present disclosure. The above exemplary embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein. Moreover, it will be apparent that some claims referring to specific claims may be combined with another claims referring to the other claims other than the specific claims to constitute the embodiment or add new claims by means of amendment after the application is filed.

What is claimed is:

1. A method for operating a terminal in a wireless communication system, the method comprising:
   encoding a first data based on a first polar code;
   transmitting, the first data to a base station;
   receiving reward information based on decoding of the first data from the base station;
   encoding a second data based on a second polar code; and
   transmitting the second data to the base station;
   wherein the first polar code and the second polar code are determined by the terminal based on an artificial intelligence (AI) learning with the reward information,
   wherein the first data and the second data are respectively transmitted with an information subchannel index set for the first polar code and second polar code, and
   wherein the information subchannel index set for the second polar code is determined, among information subchannel set candidates, based on the reward information.

2. The method of claim 1, further comprising:
   receiving, by the terminal, an initial polar code value from the base station,
   wherein the first polar code is determined based on the initial polar code value.

3. The method of claim 2, further comprising:
   transmitting a reference signal and location information of the terminal to the base station,
   wherein the base station generates the initial polar code value, based on the reference signal and the location information of the terminal, and transmits the generated initial polar code value to the terminal.

4. The method of claim 3, wherein the initial polar code value is generated through the artificial intelligence (AI) based on channel environment information.

5. The method of claim 3, wherein the information subchannel set candidates are configured based on a codebook, and
   wherein the initial polar code value is generated by a codebook index for the information subchannel set candidates.

6. The method of claim 1, wherein the reward information is determined based on at least one of decoding error information, latency information, power information, or decoding complexity information of the base station.

7. The method of claim 1, wherein each bit of the second data is allocated to a subchannel corresponding to the information subchannel index set among subchannel sets corresponding to the second polar code, and
   wherein 0 bit is allocated to a fixed subchannel index set among the subchannel sets corresponding to the second polar code.

8. The method of claim 7, wherein the information subchannel index set is determined based on a basic information subchannel and a variable information subchannel,
   wherein the basic information subchannel is a fixed subchannel, and
   wherein the variable information subchannel is a subchannel that varies flexibly based on the reward information.

9. A method for operating a base station in a wireless communication system, the method comprising:
   receiving data encoded in a first polar code and an information subchannel index set for the first polar code from a terminal;
   decoding the encoded data;
   transmitting, to the terminal, reward information based on the decoding of the data; and
   receiving data encoded in a second polar code and an information subchannel index set for the second polar code from the terminal,
   wherein the second polar code is determined based on artificial intelligence learning in the terminal with the reward information, and
   wherein the information subchannel index set for the second polar code is determined, among information subchannel set candidates, based on the reward information.

10. The method of claim 9, further comprising:
    transmitting, by the base station, an initial polar code value to the terminal,
    wherein the first polar code is determined based on the initial polar code value.

11. The method of claim 10, further comprising:
    receiving, from the terminal, a reference signal and location information of the terminal, and
    generating the initial polar code value based on the received reference signal and the received location information of the terminal, and transmitting the generated initial polar code value to the terminal.

12. The method of claim 11, wherein the initial polar code value is generated through an artificial intelligence (AI) based on channel environment information.

13. The method of claim 11, wherein the information subchannel set candidates are configured based on a codebook, and
    wherein the initial polar code value is generated by a codebook index for the information subchannel set candidates.

14. The method of claim 9, wherein the reward information is determined based on at least one of decoding error information, latency information, power information, and decoding complexity information of the base station.

15. The method of claim 9, wherein each bit of the data encoded in the second polar code is allocated to a subchannel corresponding to the information subchannel index set among subchannel sets corresponding to the second polar code, and
    wherein 0 bit is allocated to a fixed subchannel index set among the subchannel sets corresponding to the second polar code.

16. The method of claim 15, wherein the information subchannel index set is determined based on a basic information subchannel and a variable information subchannel,
    wherein the basic information subchannel is a fixed subchannel, and
    wherein the variable information subchannel is a subchannel that varies flexibly based on the reward information.

17. A terminal operating in a wireless communication system, the terminal comprising:
    a transceiver; and
    a processor connected to the transceiver and is configured to:

encode a first data based on a first polar code;
transmit, the first data to a base station;
receive reward information based on decoding of the first data from the base station;
encode a second data based on a second polar code; and
transmit the second data to the base station;
wherein the first polar code and the second polar code are determined by the terminal based on an artificial intelligence (AI) learning with the reward information,
wherein the first data and the second data are respectively transmitted with an information subchannel index set for the first polar code and second polar code, and
wherein the information subchannel index set for the second polar code is determined, among information subchannel set candidates, based on the reward information.

* * * * *